United States Patent
Inukai

(10) Patent No.: US 7,113,154 B1
(45) Date of Patent: Sep. 26, 2006

(54) ELECTRONIC DEVICE

(75) Inventor: Kazutaka Inukai, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 847 days.

(21) Appl. No.: 09/724,387

(22) Filed: Nov. 28, 2000

(30) Foreign Application Priority Data

Nov. 29, 1999 (JP) ............................... 11-338786
Mar. 27, 2000 (JP) ............................. 2000-086968

(51) Int. Cl.
G09G 3/30 (2006.01)

(52) U.S. Cl. ......................................... 345/76; 345/77
(58) Field of Classification Search .................. 345/76, 345/77, 204, 206, 211, 214
See application file for complete search history.

(56) References Cited

U.S. PATENT DOCUMENTS

| | | | |
|---|---|---|---|
| 4,888,523 A | 12/1989 | Shoji et al. | |
| 5,095,248 A | 3/1992 | Sato | 315/169.3 |
| 5,247,190 A | 9/1993 | Friend et al. | 257/40 |
| 5,399,502 A | 3/1995 | Friend et al. | 437/1 |
| 5,606,348 A * | 2/1997 | Chiu | 345/213 |
| 5,610,628 A | 3/1997 | Yamamoto et al. | 345/100 |
| 5,652,600 A | 7/1997 | Khormaei et al. | |
| 5,736,752 A | 4/1998 | Hseuh et al. | 257/72 |
| 5,876,865 A * | 3/1999 | Hsieh | 428/690 |
| 5,899,575 A * | 5/1999 | Okayama et al. | 386/46 |
| 5,940,053 A | 8/1999 | Ikeda | 345/77 |
| 5,990,629 A * | 11/1999 | Yamada et al. | 315/169.3 |
| 6,246,180 B1 | 6/2001 | Nishigaki | |
| 6,246,384 B1 * | 6/2001 | Sano | 345/76 |
| 6,292,183 B1 | 9/2001 | Yamazaki et al. | 345/211 |
| 6,335,716 B1 | 1/2002 | Yamazaki et al. | 345/92 |
| 6,504,520 B1 * | 1/2003 | Osada et al. | 345/76 |
| 6,548,960 B1 * | 4/2003 | Inukai | 315/169.3 |
| 6,756,740 B1 | 6/2004 | Inukai | 315/169.3 |
| 2002/0113760 A1 | 8/2002 | Kimura | |

FOREIGN PATENT DOCUMENTS

| | | |
|---|---|---|
| EP | 0 365 445 | 4/1990 |
| EP | 0 365 445 A2 | 4/1990 |
| EP | 0 895 219 | 2/1999 |
| EP | 0 895 219 A1 | 2/1999 |
| EP | 1 003 150 | 5/2000 |
| EP | 1 061 497 | 12/2000 |
| GB | 2 336 459 | 10/1999 |
| JP | 10-092576 | 4/1998 |
| JP | 10-214060 * | 8/1998 |

(Continued)

OTHER PUBLICATIONS

Schenk, H. et al, "Polymers for Light Emitting Diodes," EuroDisplay '99, Proceedings of the 19th International Display Research Conference, Berlin, Germany, Sep. 6-9, 1999, pp. 37-37.

(Continued)

Primary Examiner—Amr A. Awad
Assistant Examiner—Leonid Shapiro
(74) Attorney, Agent, or Firm—Cook, Alex, McFarron, Manzo, Cummings & Mehler, Ltd.

(57) ABSTRACT

To provide an active matrix electronic device capable of performing clear color gray-scale display. The electronic device is characterized in that a plurality of pixels composing a pixel portion is surrounded by a source signal line, a first gate signal line, a second gate signal line, and a power supply line, and that the plurality of pixels have a switching TFT, an EL driving TFT, an eliminating TFT, and an EL element, respectively.

78 Claims, 24 Drawing Sheets

FOREIGN PATENT DOCUMENTS

| | | |
|---|---|---|
| JP | 10-247735 | 9/1998 |
| JP | 10-312173 | 11/1998 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| WO | WO 90/13148 | 11/1990 |
| WO | WO 98/48403 | 10/1998 |
| WO | WO 99/48078 | 9/1999 |

OTHER PUBLICATIONS

European Search Report for Patent Application No. EP 00 12 6069, dated Oct. 7, 2002.

JP 2000-221942 English abstract.

JP 2000-235370 English abstract.

JP 2000-347621 full English translation.

JP 2001-42822 full English translation.

Tsutsui, T. et al, "Electroluminescence in Organic Thin Films," *Photochemical Processes in Organized Molecular Systems*, pp. 437-450, 1991.

Baldo, M.A. et al, "High Efficient Phosphorescent Emission from Organic Electroluminescent Devices," *Nature*, vol. 395, pp. 151-154, Sep. 10, 1998.

Baldo, M.A. et al, "Very High-Efficiency Green Organic Light-Emitting Devices Based on Electrophosphorescence," *Applied Physics Letters*, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," *Japanese Journal of Applied Physics*, vol. 38, part 2, No. 12B, pp. L1502-L1504, Dec. 15, 1999.

Shenk, H. et al, "Polymers for Light Emitting Diodes," *EuroDisplay '99, Proceedings of the 19th International Display Research Conference*, Berlin, Germany, Sep. 6-9, 1999, pp. 33-37.

English abstract re Japanese Patent Application No. 10-092576, published Apr. 10, 1998.

English abstract re Japanese Patent Application No. 10-247735, published Sep. 14, 1998.

English abstract re Japanese Patent Application No. JP 10-214060, published Aug. 11, 1998.

English abstract re Japanese Patent Application No. JP 10-232649, published Sep. 2, 1998.

Full English translation re Japanese Patent Application No. JP 10-312173, published Nov. 24, 1998.

European Search Report re application No. EP 00 12 6069 dated Jun. 20, 2002.

Mo et al., "Consecutive PWM Driving Video LED Display System." 1997 IEEE International Symposium on Circuits and Systems, pp. 1437-1439, Jun. 9, 1997.

European Search Report for EP applicant # EP 00 12 6069, mailed Oct. 7, 2002.

* cited by examiner

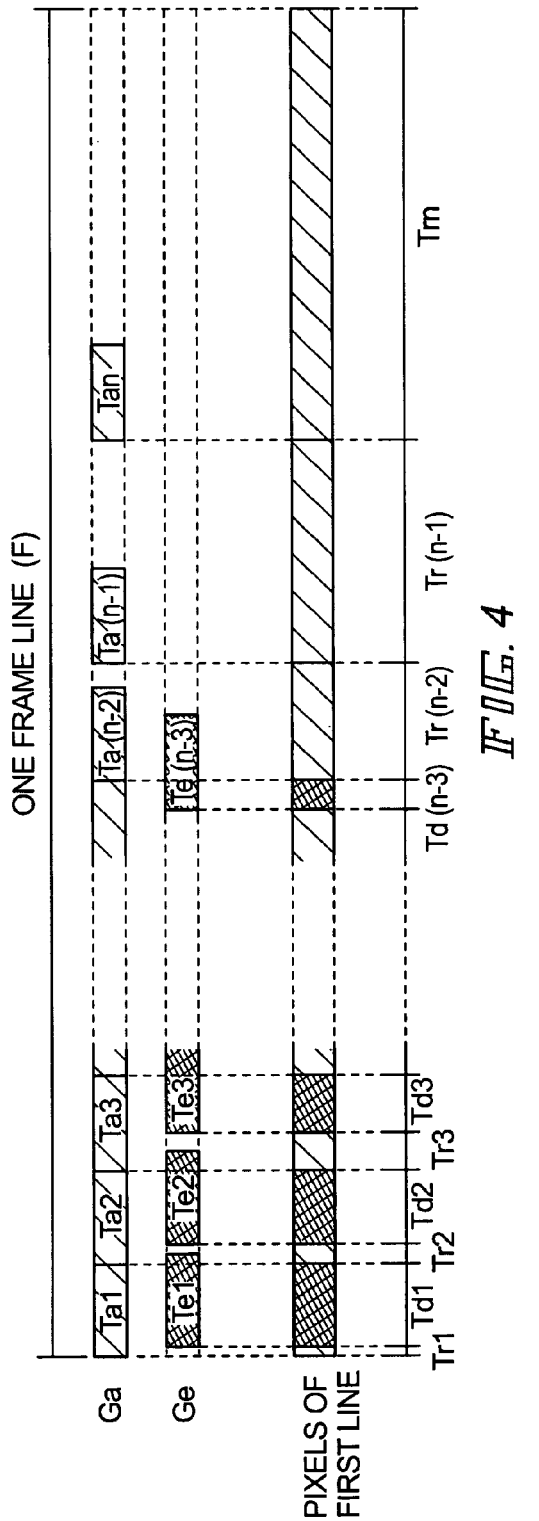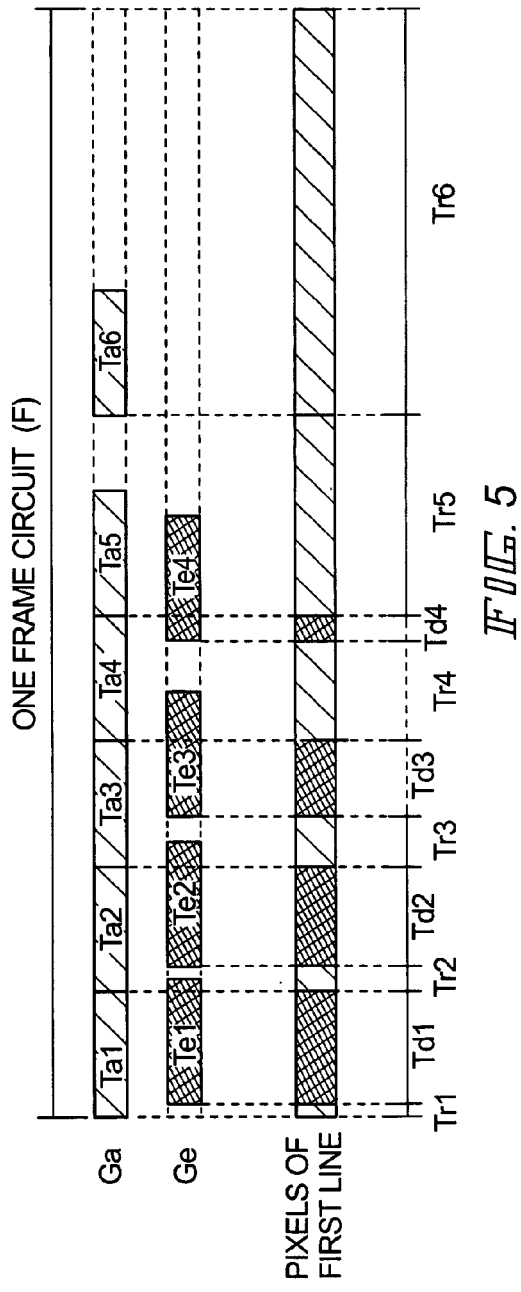

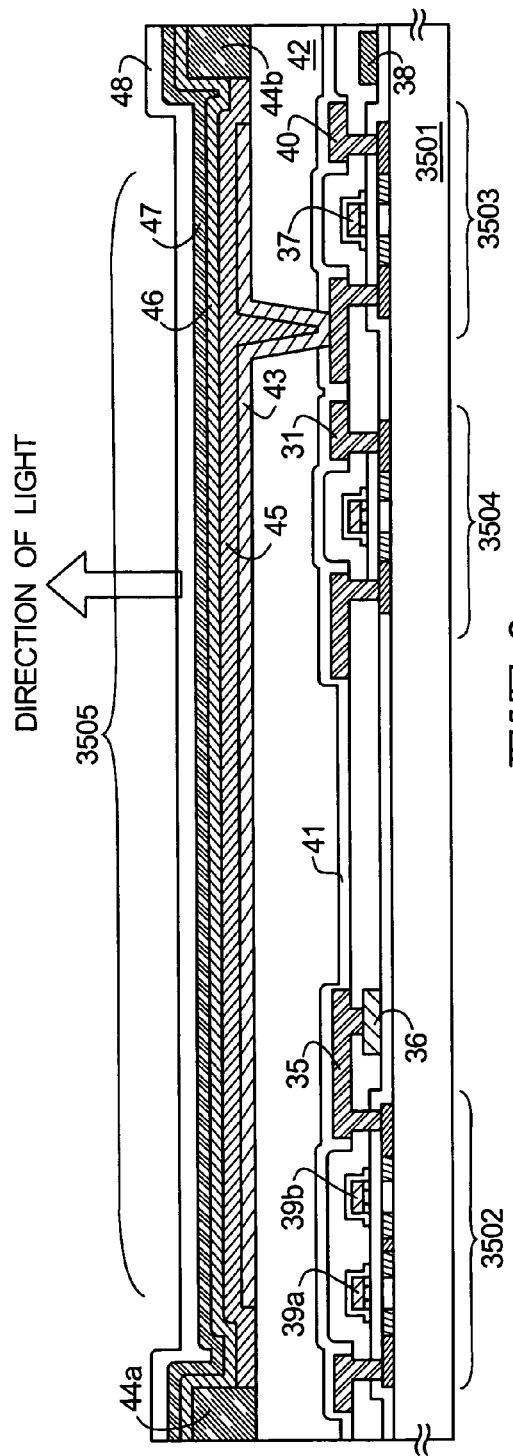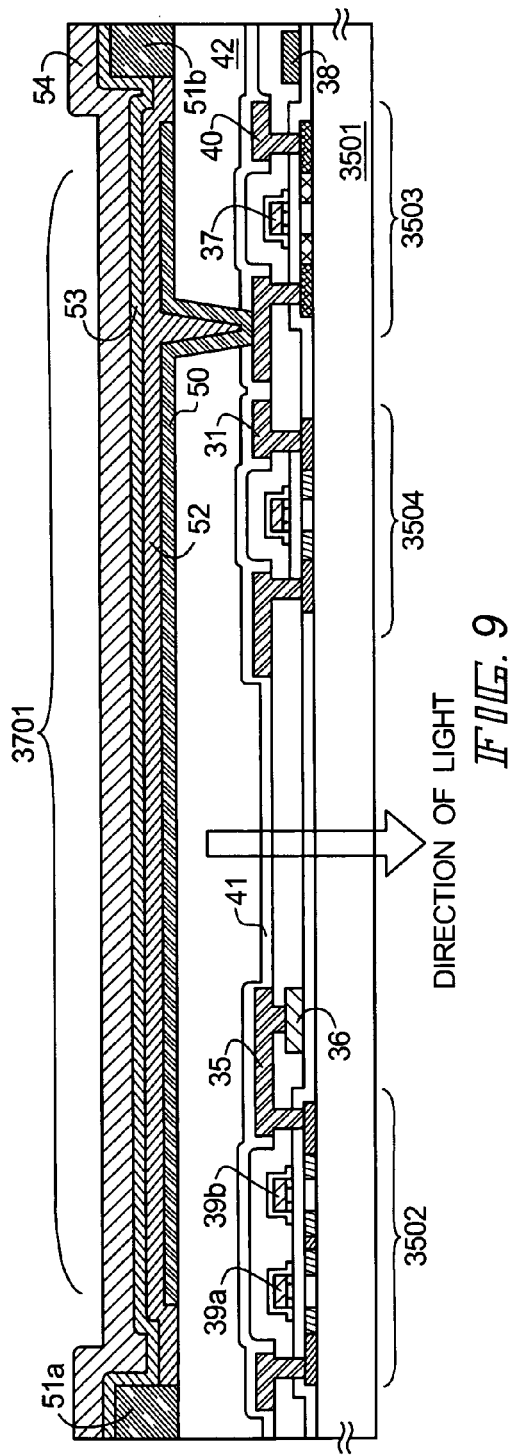

ELECTRONIC DEVICE

BACKGROUND OF THE INVENTION

1. Field of the Invention

The present invention relates to an electronic display (electro-optical device) formed by fabricating an EL (electroluminescence) element on a substrate. Particularly, the present invention relates to an EL display using a semiconductor element (an element employing a semiconductor thin film), and furthermore to electronic equipment using the EL display as a display portion.

2. Description of the Related Art

In recent years, remarkable progress has been made in a technique for forming TFTs on a substrate, and developing the application of TFTs to an active matrix display device is proceeding. TFTs using a poly-silicon film, in particular, have a higher electric field effect mobility (also referred to as mobility) than that of conventional TFTs using an amorphous silicon film, and hence a high speed operation may be made. Thus, control of pixels, which in the past has been controlled by a driver circuit external to a substrate, can now be made by driver circuits formed on the same substrate as the pixels.

Various merits such as reduction of manufacturing cost, miniaturization of a display device, and increase of yield and throughput can be obtained from such an active matrix display device by forming various circuits and elements on the same substrate.

A research on active matrix EL displays having an EL element as a self-luminous element is being actively carried out. The EL display is also referred to as an organic EL display (OLED) or an organic light emitting diode (OLED).

Unlike a liquid crystal display, the EL display is a self-luminous type. The El element has a structure composed of a pair of electrodes (anode and cathode) and an EL layer, which is usually a laminate structure, sandwiched therebetween. The laminate structure (hole transporting layer, light-emitting layer, electron transporting layer) proposed by Tang, et al. from Eastman Kodak Company can be cited as a typical laminate structure of the EL layer. This laminate structure has an extremely high luminescence efficiency, and therefore at present, most of the EL displays in which research and development are proceeding adopt this laminate structure of the EL layer.

In addition to the above laminate structure, a structure in which the layers are laminated on the anode in the order of a hole injection layer, a hole transporting layer, a light-emitting layer, and an electron transporting layer or in the order of a hole injection layer, a hole transporting layer, a light-emitting layer, an electron transporting layer, and an electron injection layer may be formed. The light-emitting layer may be doped with a fluorescent pigment or the like.

The EL layer is a generic term in the present specification indicating all the layers formed between the cathode and anode. Therefore, the above-mentioned hole injection layer, the hole transporting layer, the light-emitting layer, the electron transporting layer, the electron injection layer, etc. are all included in the EL layer.

A predetermined voltage from the pair of electrodes is applied to the EL layer having the above structure, whereby a re-coupling of carriers in the light-emitting layer occurs to thereby emit light. It is to be noted that throughout the present specification, the emission of light by the EL element is called a drive by the EL element. In addition, a luminescent element formed of the anode, the EL layer, and the cathode is called the EL element in the present specification.

A driving method of the analog system (analog drive) can be cited as a driving method of the EL display. An explanation regarding the analog drive of the EL display will be made with references to FIGS. 18 and 19.

FIG. 18 is a diagram showing the structure of a pixel portion in the EL display having the analog drive. A gate signal line (plurality of gate signal lines G1 to Gy) for inputting a selecting signal from a gate signal line driver circuit is connected to a gate electrode of a switching TFT 1801 of the respective pixels. As to a source region and a drain region of the switching TFT 1801 of the respective pixels, one is connected to a source signal line (also called a data signal line) S1 to Sx for inputting an analog video signal whereas the other is connected to a gate electrode of an EL driving TFT 1804 and a capacitor 1808 of each of the pixels, respectively.

A source region of the EL driving TFT 1804 of each of the pixels is connected to a power supply line (V1 to Vx), and a drain region thereof is connected to an EL element 1806, respectively. An electric potential of the power supply lines (V1 to Vx) is called a power supply electric potential. Each of the power supply lines (V1 to Vx) is connected to the capacitor 1808 of the respective pixels.

The EL element 1806 is composed of an anode, a cathode, and an EL layer sandwiched therebetween. When the anode of the EL element 1806 is connected to either the source region or the drain region of the EL driving TFT 1804, the anode and the cathode of the EL element 1806 become a pixel electrode and an opposing electrode, respectively. Alternatively, if the cathode of the EL element 1806 is connected to either the source region or the drain region of the EL driving TFT 1804, then the anode of the EL element 1806 becomes the opposing electrode whereas the cathode thereof becomes the pixel electrode.

It is to be noted that in the present specification, an electric potential of the opposing electrode is referred to as an opposing electric potential and a power supply for applying the opposing electric potential to the opposing electrode is referred to as an opposing power supply. An EL driver voltage, which is the electric potential difference between an electric potential of the pixel electrode and an electric potential of the opposing electrode, is applied to the EL layer.

FIG. 19 is a timing chart illustrating the EL display shown in FIG. 18 when it is being driven by the analog system. A period from the selection of one gate signal line to the selection of a next different gate signal line is called a 1 line period (L). In addition, a period from the display of one image to the display of the next image corresponds to a 1 frame period (F). In the case of the EL display of FIG. 18, there are "y" number of the gate signal lines and thus a "y" number of line periods (L1 to Ly) are provided in 1 frame period.

Because the number of line periods in 1 frame period increases as resolution becomes higher, driver circuits must be driven at high frequencies.

First of all, the power supply lines (V1 to Vx) are held at a constant power supply electric potential, and the opposing electric potential that is the electric potential of the opposing electrode is also held at a constant electric potential. There is a difference in electric potential between the opposing electric potential and the power supply electric potential to a degree that the EL element can emit light.

A selecting signal from the gate signal line driver circuit is fed to the gate signal line G1 in the first line period (L1). An analog video signal is then sequentially inputted to source signal lines S1 to Sx. All the switching TFTs connected to the gate signal line G1 are turned ON to thereby feed the analog video signal that is inputted to the source signal lines to the gate electrode of the EL driving TFT through the switching TFT.

The amount of current flowing in a channel forming region of the EL driving TFT is controlled by the level (voltage) of the electric potential of the signal inputted to the gate electrode of the EL driving TFT. Accordingly, the electric potential applied to the pixel electrode of the EL element is determined by the level of the electric potential of the analog video signal that is inputted to the gate electrode of the EL driving TFT. The emission of light by the EL element is thus controlled by the electric potential of the analog video signal.

The above described operation is repeated and the first line period (L1) ends upon the completion of inputting the analog video signal to the source signal lines S1 to Sx. Note that a period until the completion of inputting the analog video signal to the source signal lines S1 to Sx and a horizontal retrace period may be combined as one line period. Next, a selecting signal is fed to the gate signal line G2 in the second line period (L2). Similar to the first line period (L1), an analog video signal is sequentially inputted to the source signal lines S1 to Sx.

When the selecting signals have been inputted to all the gate signal lines (G1 to Gy), all the line periods (L1 to Ly) are completed to thereby complete 1 frame period. Display is performed by all the pixels in the 1 frame period to form one image. Note that all the line periods (L1 to Ly) and a vertical retrace period may be combined as one frame period.

Thus, the amount of light emitted by the EL element is controlled by the analog video signal and gray-scale display is therefore performed by this control of the amount of light emitted. This system is a driving system which is referred to as the so-called analog drive method where gray-scale display is performed by the variations of the electric potential of the analog video signal fed to the source signal lines.

The state in which the amount of current supplied to the EL element is controlled by the gate voltage of the EL driving TFT will be explained in detail using FIGS. 20A and 20B.

FIG. 20A is a graph showing a transistor characteristic of the EL driving TFT. A curve line denoted by the reference numeral 401 is referred to as $I_{DS}$-$V_{GS}$ characteristic (or $I_{DS}$-$V_{GS}$ curve) where the $I_{DS}$ is a drain current and the $V_{GS}$ is a gate voltage. The amount of current flow to an arbitrary gate voltage can be perceived from this graph.

A region within the dotted line indicated by the reference numeral 402 in the above $I_{DS}$-$V_{GS}$ characteristic is normally the range for driving the EL element. An enlarge view of the region 402 within the dotted line is shown in FIG. 20B.

In FIG. 20B, a region marked by slanted lines is called a saturated area. This region actually indicates a gate voltage that is near a threshold voltage ($V_{TH}$) or less. The drain current makes exponential changes to the changes of the gate voltage in this region, and therefore current control is carried out based on the gate voltage using this region.

The analog video signal inputted to the plurality of pixels becomes the gate voltage of the EL driving TFT when the switching TFT is ON. In accordance with the $I_{DS}$-$V_{GS}$ characteristic shown in FIG. 20A, the drain current to the gate voltage becomes 1 to 1 at this point. In other words, the electric potential of the drain region (EL driver electric potential is ON) is determined in correspondence with the voltage of the analog video signal fed to the gate electrode of the EL driving TFT. Then a predetermined drain current flows to the EL element, whereby the EL element emits light according to the amount of luminescence which corresponds to the amount of drain current.

The amount of luminescing by the EL element is thus controlled by the video signal, and gray-scale display is performed in accordance with this control of the amount of luminescing.

However, the above-mentioned analog drive has a drawback in that it is extremely weak to the characteristic variation of the TFT. For example, let's assume a case where the $I_{DS}$-$V_{GS}$ characteristic of the switching TFT is different from the switching TFT of an adjacent pixel displaying the same tone.

In this case, the drain current of the respective switching TFTs differ depending on the level of variation, with the result of having different gate voltages applied to the EL driving TFTs of each of the pixels. That is, different currents flow to each of the EL elements resulting in having different amounts of luminescence, and therefore the same gray-scale display cannot be performed.

In addition, even if equivalent gate voltages are applied to the EL driving TFTs of each of the pixels, if there are variations in the $I_{DS}$-$V_{GS}$ characteristic of the EL driving TFTs, then equivalent drain currents cannot be outputted. As is apparent from the graph of FIG. 20A, the region where the drain current exponentially changes to the changes of the gate voltage is used, and therefore if there is even a slight shift in the $I_{DS}$-$V_{GS}$ characteristic, a situation occurs where there is a vast difference in the outputted amount of current regardless of the fact that equivalent gate voltages were applied. When such situation occurs, in spite of inputting signals having the same voltage, the amount of luminescence of the EL element is immensely different from that of the adjacent pixel caused by the slight variation of the $I_{DS}$-$V_{GS}$ characteristic.

In fact, the variation of $I_{DS}$-$V_{GS}$ characteristic becomes a multiplier effect of both of the variations of the switching TFT and the EL driving TFT, thereby becoming more conditionally severe. Thus, the analog drive is very susceptible to the characteristic variation of the TFT, a point which had become an obstacle in the gray-scale display of conventional active matrix EL displays.

SUMMARY OF THE INVENTION

The present invention has been made in view of the above problem, and an object of the present invention is therefore to provide an active matrix EL display device capable of performing clear multiple gray-scale display. Another object of the present invention is to provide a high-performance electronic equipment (electronic device) incorporating such active matrix EL display as its display unit.

The present inventor has deemed that the drawback of the analog drive originates from the fact in using the saturated region, which is susceptible to the variation of the $I_{DS}$-$V_{GS}$ characteristic because the drain current changes exponentially to the changes of the gate voltage, to control the amount of current flowing to the EL element.

In other words, when there is a variation of the $I_{DS}$-$V_{GS}$ characteristic, the drain current changes exponentially to the changes of the gate voltage in the saturated region, and hence different levels of currents (drain current) are outputted even if equivalent gate voltages are applied. As a result, an unsatisfactory situation occurs, that is, a desired gray-scale (tone) cannot be attained.

Accordingly, the present inventor contemplated that the desired amount of light emitted from the EL element may be obtained by mainly controlling the luminescing time of the EL element instead of controlling the current by using the saturated region. That is, in the present invention, gray-scale display is carried out by controlling the amount of light emitted from the EL element by means of time. Controlling the time of the luminescing of the EL element to perform gray-scale display is called the time-division system of the driving system (hereinafter referred to as digital drive). Note that performing gray-scale display by means of this time-division system of the driving system is called time-division gray-scale display.

Accordingly, in the present invention, the variations in the current outputted upon the application of equivalent gate voltages can be suppressed even if a little variation occurs in the $I_{DS}$–$V_{GS}$ characteristic caused by the TFTs. As a result, the occurrence of a vast difference between the amount of luminescing of the EL element with that of an adjacent pixel caused by the variation of the $I_{DS}$–$V_{GS}$ characteristic even if signals having equivalent voltages are fed may be avoided.

Hereinafter, the structure of the present invention will be described.

According to the present invention, there is provided an electronic device comprising a source signal line driver circuit, a first gate signal line driver circuit, a second gate signal line driver circuit, and a pixel portion, wherein:

the pixel portion includes a plurality of pixels;

the plurality of pixels each have an EL element, an EL driving TFT for controlling the luminescence of each of the EL elements, a switching TFT and an eliminating TFT for controlling the drive of the EL driving TFT;

a drive of the switching TFT is controlled by the first gate signal line driver circuit;

a drive of the eliminating TFT is controlled by the second gate signal line driver circuit; and a gray-scale display is performed by controlling a luminescing time of the plurality of EL elements.

According to the present invention, there is provided an electronic device comprising a source signal line driver circuit, a first gate signal line driver circuit, a second gate signal line driver circuit, a pixel portion, a plurality of source signal lines connected to the source signal line driver circuit, a plurality of first gate signal lines connected to the first gate signal line driver circuit, a plurality of second gate signal lines connected to the second gate signal line driver circuit, and a power supply line, wherein:

the pixel portion includes a plurality of pixels;

the plurality of pixels each have a switching TFT, an EL driving TFT, an eliminating TFT, and an EL element;

a gate electrode of the switching TFT is connected to the first gate signal line;

one of a source region and a drain region of the switching TFT is connected to the plurality of source signal lines, and another thereof is connected to a gate electrode of the EL driving TFT;

a gate electrode of the eliminating TFT is connected to the second gate signal line;

one of a source region and a drain region of the eliminating TFT is connected to the power supply line, and another thereof is connected to the gate electrode of the EL driving TFT; and one of a source region and a drain region of the EL driving TFT is connected to the power supply line, and another thereof is connected to the EL element.

According to the present invention, there is provided an electronic device comprising a source signal line driver circuit, a first gate signal line driver circuit, a second gate signal line driver circuit, a pixel portion, a plurality of source signal lines connected to the source signal line driver circuit, a plurality of first gate signal lines connected to the first gate signal line driver circuit, a plurality of second gate signal lines connected to the second gate signal line driver circuit, and a power supply line held at a constant electric potential, wherein:

the pixel portion includes a plurality of pixels;

the plurality of pixels each have a switching TFT, an EL driving TFT, an eliminating TFT and an EL element;

the EL element includes a pixel electrode, an opposing electrode held at a constant electric potential, and an EL layer formed between the pixel electrode and the opposing electrode;

a gate electrode of the switching TFT is connected to the first gate signal lines;

one of a source region and a drain region of the switching TFT is connected to the plurality of source signal lines, and another thereof is connected to a gate electrode of the EL driving TFT;

a gate electrode of the eliminating TFT is connected to the second gate signal lines;

one of a source region and a drain region of the eliminating TFT is connected to the power supply line, and another is connected to a gate electrode of the EL driving TFT; and one of a source region and a drain region of the EL driving TFT is connected to the power supply line, and another is connected to a pixel electrode of the EL element.

According to the present invention, there is provided an electronic device comprising a source signal line driver circuit, a first gate signal line driver circuit, a second gate signal line driver circuit, a pixel portion, a plurality of source signal lines connected to the source signal line driver circuit, a plurality of first gate signal lines connected to the first gate signal line driver circuit, a plurality of second gate signal lines connected to the second gate signal line driver circuit, and a power supply line, wherein:

the pixel portion includes a plurality of pixels;

the plurality of pixels each have a switching TFT, an EL driving TFT, an eliminating TFT, and an EL element;

a gate electrode of the switching TFT is connected to the first gate signal lines;

one of a source region and a drain region of the switching TFT is connected to the plurality of source signal lines, and another thereof is connected to a gate electrode of the EL driving TFT;

a gate electrode of the eliminating TFT is connected to the second gate signal lines;

one of a source region and a drain region of the eliminating TFT is connected to the power supply line, and another thereof is connected a gate electrode of the EL driving TFT;

one of a source region and a drain region of the EL driving TFT is connected to the power supply line, and another thereof is connected to the EL element;

an (n) number of writing-in periods Ta1, Ta2, . . . , Ta(n) and an (m−1) number of eliminating periods Te1, Te2, . . . , Te(m−1) (m is an arbitrary integer from 2 to (n)) are provided in 1 frame period;

digital data signals from the source signal line driver circuit are fed to all the plurality of pixels through the plurality of source signal lines in the writing-in periods Ta1, Ta2, . . . , Ta(n);

the digital data signals fed to the entire plurality of pixels are all eliminated in the eliminating periods Te1, Te2, . . . , Te(m−1);

among the (n) number of writing-in periods Ta1, Ta2, ..., Ta(n), a portion of the writing-in periods Ta1, Ta2, ..., Ta(m) and a portion of the eliminating periods Te1, Te2, ..., Te(m−1) overlap with each other;

periods from the start of each of the writing-in periods Ta1, Ta2, ..., Ta(m−1) in the (n) number of writing-in periods Ta1, Ta2, ..., Ta(n) to the start of each of the eliminating periods Te1, Te2, ..., Te(m−1) are display periods Tr1, Tr2, ..., Tr(m−1);

periods from the start of each of the eliminating periods Te1, Te2, ..., Te(m−1) to the start of each of the writing-in periods Ta1, Ta2, ..., Ta(m) in the (n) number of writing-in periods Ta1, Ta2, ..., Ta(n) are non-display periods Td1, Td2, ..., Td(m−1);

periods from the start of each of the writing-in periods Ta1, Ta2, ..., Ta(m+1) in the (n) number of writing-in periods Ta1, Ta2, ..., Ta(n) to the start of the next writing-in periods of each of the writing-in periods Ta(m), Ta(m+1), ..., Ta(n), respectively, are display periods Tr(m), Tr(m+1), ..., Tr(n);

in the display periods Tr1, Tr2, ..., Tr(n), the plurality of EL elements are selected by the digital data signals to luminesce or not luminesce;

a length of the (n) number of writing-in periods Ta1, Ta2, ..., Ta(n) and a length of the (m−1) number of eliminating periods Te1, Te2, ..., Te(m−1) are the same; and ratios of the lengths of the display periods Tr1, Tr2, ..., Tr(n) are expressed as $2^0: 2^1: \ldots : 2^{(n-1)}$.

According to the present invention, there is provided an electronic device comprising a source signal line driver circuit, a first gate signal line driver circuit, a second gate signal line driver circuit, a pixel portion, a plurality of source signal lines connected to the source signal line driver circuit, a plurality of first gate signal lines connected to the first gate signal line driver circuit, a plurality of second gate signal lines connected to the second gate signal line driver circuit, and a power supply line held at a constant electric potential, wherein:

the pixel portion includes a plurality of pixels;

the plurality of pixels each have a switching TFT, an EL driving TFT, an eliminating TFT and an EL element, the EL element includes a pixel electrode, an opposing electrode held at a constant electric potential, and an EL layer formed between the pixel electrode and the opposing electrode;

a gate electrode of the switching TFT is connected to the first gate signal lines;

one of a source region and a drain region of the switching TFT is connected to the plurality of source signal lines, another thereof is connected to a gate electrode of the EL driving TFT;

a gate electrode of the eliminating TFT is connected to the second gate signal lines, one of a source region and a drain region of the eliminating TFT is connected to the power supply line, and another thereof is connected to a gate electrode of the EL driving TFT;

one of a source region and a drain region of the EL driving TFT is connected to the power supply line, and another thereof is connected to a pixel electrode of the EL element;

an (n) number of writing-in periods Ta1, Ta2, ..., Ta(n) and an (m−1) number of eliminating periods Te1, Te2, ..., Te(m−1) (m is an arbitrary integer from 2 to (n)) are provided in 1 frame period;

digital data signals from the source signal line driver circuit are fed to all the plurality of pixels through the plurality of source signal lines in the writing-in periods Ta1, Ta2, ..., Ta(n);

the digital data signals fed to the plurality of pixels are all eliminated in the eliminating periods Te1, Te2, ..., Te(m−1), among the (n) number of writing-in periods Ta1, Ta2, ..., Ta(n), a portion of the writing-in periods Ta1, Ta2, ..., Ta(m) and a portion of the eliminating periods Te1, Te2, ..., Te(m−1) overlap with each other;

periods from the start of each of the writing-in periods Ta1, Ta2, ..., Ta(m−1) in the (n) number of writing-in periods Ta1, Ta2, ..., Ta(n) to the start of each of the eliminating periods Te1, Te2, ..., Te(m−1) are display periods Tr1, Tr2, ..., Tr(m−1);

periods from the start of each of the eliminating periods Te1, Te2, ..., Te(m−1) to the start of each of the writing-in periods Ta1, Ta2, ..., Ta(m) in the (n) number of writing-in periods Ta1, Ta2, ..., Ta(n) are non-display periods Td1, Td2, ..., Td(m−1);

periods from the start of each of the writing-in periods Ta1, Ta2, ..., Ta(m+1) in the (n) number of writing-in periods Ta1, Ta2, ..., Ta(n) to the start of the next writing-in periods of each of the writing-in periods Ta(m), Ta(m+1), ..., Ta(n), respectively, are display periods Tr(m), Tr(m+1), ..., Tr(n);

in the display periods Tr1, Tr2, ..., Tr(n), the plurality of EL elements are selected by the digital data signals to luminesce or not luminesce;

a length of the (n) number of writing-in periods Ta1, Ta2, ..., Ta(n) and a length of the (m−1) number of eliminating periods Te1, Te2, ..., Te(m−1) are the same; and ratios of the lengths of the display periods Tr1, Tr2, ..., Tr(n) are expressed as $2^0: 2^1: \ldots : 2^{(n-1)}$.

According to the present invention, there is provided an electronic device comprising a source signal line driver circuit, a first gate signal line driver circuit, a second gate signal line driver circuit, a pixel portion, a plurality of source signal lines connected to the source signal line driver circuit, a plurality of first gate signal lines connected to the first gate signal line driver circuit, a plurality of second gate signal lines connected to the second gate signal line driver circuit, and a power supply line, wherein:

the pixel portion includes a plurality of pixels;

the plurality of pixels each have a switching TFT, an EL driving TFT, an eliminating TFT, and an EL element;

a gate electrode of the switching TFT is connected to the first gate signal lines;

one of a source region and a drain region of the switching TFT is connected to the plurality of source signal lines, and another thereof is connected to a gate electrode of the EL driving TFT;

a gate electrode of the eliminating TFT is connected to the second gate signal lines;

one of a source region and a drain region of the eliminating TFT is connected to the power supply line, and another thereof is connected a gate electrode of the EL driving TFT;

one of a source region and a drain region of the EL driving TFT is connected to the power supply line, and another thereof is connected to the EL element an (n) number of writing-in periods Ta1, Ta2, ..., Ta(n) and an (m−1) number of eliminating periods Te1, Te2, ..., Te(m−1) (m is an arbitrary integer from 2 to (n)) are provided in 1 frame period;

digital data signals from the source signal line driver circuit are fed to all the plurality of pixels through the plurality of source signal lines in the writing-in periods Ta1, Ta2, ..., Ta(n);

the digital data signals fed to the entire plurality of pixels are all eliminated in the eliminating periods Te1, Te2, ..., Te(m−1);

among the (n) number of writing-in periods Ta1, Ta2, ..., Ta(n), a portion of the writing-in periods Ta1, Ta2, ..., Ta(m) and a portion of the eliminating periods Te1, Te2, ..., Te(m−1) overlap with each other;

periods from the start of each of the writing-in periods Ta1, Ta2, ..., Ta(m−1) in the (n) number of writing-in periods Ta1, Ta2, ..., Ta(n) to the start of each of the eliminating periods Te1, Te2, ..., Te(m−1) are display periods Tr1, Tr2, ..., Tr(m−1);

periods from the start of each of the eliminating periods Te1, Te2, ..., Te(m−1) to the start of each of the writing-in periods Ta1, Ta2, ..., Ta(m) in the (n) number of writing-in periods Ta1, Ta2, ..., Ta(n) are non-display periods Td1, Td2, ..., Td(m−1);

periods from the start of each of the writing-in periods Ta1, Ta2, ..., Ta(m+1) in the (n) number of writing-in periods Ta1, Ta2, ..., Ta(n) to the start of the next writing-in periods of each of the writing-in periods Ta(m), Ta(m+1), ..., Ta(n), respectively, are display periods Tr(m), Tr(m+1), ..., Tr(n);

in the display periods Tr1, Tr2, ..., Tr(n), the plurality of EL elements are selected by the digital data signals to luminesce or not luminesce;

a length of the (n) number of writing-in periods Ta1, Ta2, ..., Ta(n) and a length of the (m−1) number of eliminating periods Te1, Te2, ..., Te(m−1) are the same;

ratios of the lengths of the display periods Tr1, Tr2, ..., Tr(n) are expressed as $2^0 : 2^1 : \ldots : 2^{(n-1)}$, and the display periods Tr1, Tr2, ..., Tr(n) appear in a random order.

According to the present invention, there is provided an electronic device comprising a source signal line driver circuit, a first gate signal line driver circuit, a second gate signal line driver circuit, a pixel portion, a plurality of source signal lines connected to the source signal line driver circuit, a plurality of first gate signal lines connected to the first gate signal line driver circuit, a plurality of second gate signal lines connected to the second gate signal line driver circuit, and a power supply line held at a constant electric potential, wherein:

the pixel portion includes a plurality of pixels;

the plurality of pixels each have a switching TFT, an EL driving TFT, an eliminating TFT and an EL element;

the EL element includes a pixel electrode, an opposing electrode held at a constant electric potential, and an EL layer formed between the pixel electrode and opposing electrode;

a gate electrode of the switching TFT is connected to the first gate signal lines;

one of a source region and a drain region of the switching TFT is connected to the plurality of source signal lines, and another thereof is connected to a gate electrode of the EL driving TFT;

a gate electrode of the eliminating TFT is connected to the second gate signal lines;

one of a source region and a drain region of the eliminating TFT is connected to the power supply line, and another thereof is connected a gate electrode of the EL driving TFT;

a source region and a drain region of the EL driving TFT, wherein one is connected to the power supply line whereas the other is connected to a pixel electrode of the EL element;

an (n) number of writing-in periods Ta1, Ta2, ..., Ta(n) and an (m−1) number of eliminating periods Te1, Te2, ..., Te(m−1) (m is an arbitrary integer from 2 to (n)) are provided in 1 frame period;

digital data signals from the source signal line driver circuit are fed to all the plurality of pixels through the plurality of source signal lines in the writing-in periods Ta1, Ta2, ..., Ta(n);

the digital data signals fed to the plurality of pixels are all eliminated in the eliminating periods Te1, Te2, ..., Te(m−1);

among the (n) number of writing-in periods Ta1, Ta2, ..., Ta(n), a portion of the writing-in periods Ta1, Ta2, ..., Ta(m) and a portion of the eliminating periods Te1, Te2, ..., Te(m−1) overlap with each other;

periods from the start of each of the writing-in periods Ta1, Ta2, ..., Ta(m−1) in the (n) number of writing-in periods Ta1, Ta2, ..., Ta(n) to the start of each of the eliminating periods Te1, Te2, ..., Te(m−1) are display periods Tr1, Tr2, ..., Tr(m−1);

periods from the start of each of the eliminating periods Te1, Te2, ..., Te(m−1) to the start of each of the writing-in periods Ta1, Ta2, ..., Ta(m) in the (n) number of writing-in periods Ta1, Ta2, ..., Ta(n) are non-display periods Td1, Td2, ..., Td(m−1);

periods from the start of each of the writing-in periods Ta1, Ta2, ..., Ta(m+1) in the (n) number of writing-in periods Ta1, Ta2, ..., Ta(n) to the start of the next writing-in periods of each of the writing-in periods Ta(m), Ta(m+1), ..., Ta(n), respectively, are display periods Tr(m), Tr(m+1), ..., Tr(n);

in the display periods Tr1, Tr2, ..., Tr(n), the plurality of EL elements are selected by the digital data signals to luminesce or not luminesce;

a length of the (n) number of writing-in periods Ta1, Ta2, ..., Ta(n) and a length of the (m−1) number of eliminating periods Te1, Te2, ..., Te(m−1) are the same;

ratios of the lengths of the display periods Tr1, Tr2, ..., Tr(n) are expressed as $2^0 : 2^1 : \ldots : 2^{(n-1)}$; and the display periods Tr1, Tr2, ..., Tr(n) appear in a random order.

The EL layer may be a low molecular organic material or a polymer organic material.

The low molecular organic material may be made of Alq$_3$ (tris-8-quinolilite-aluminum) or TPD (triphenylamine derivative).

The polymer organic material may be made of PPV (polyphenylene vinylene), PVK (polyvinyl carbazole), or polycarbonate.

The (n) number of writing-in periods Ta1, Ta2, ..., Ta(n) may not be overlapped with each other.

The (m−1) number of eliminating periods Te1, Te2, ..., Te(m−1) may not be overlapped with each other.

The switching TFT, the EL driving TFT, and the eliminating TFT may be at least one of an N channel TFT or a P channel TFT.

The EL driving TFT becomes an OFF state when an electric potential of the power supply line is applied to the gate electrode of the EL driving TFT.

A computer, which uses the electronic device.

A video camera, which uses the electronic device.

A DVD player, which uses the electronic device.

BRIEF DESCRIPTION OF THE DRAWINGS

In the accompanying drawings:

FIG. 4 is a diagram illustrating a driving method of the EL display of the present invention;

FIG. 5 is a diagram illustrating a driving method of the EL display of the present invention;

FIG. 8 is a cross-sectional view of the EL display of the present invention;

FIG. 9 is a cross-sectional view of the EL display of the present invention;

DETAILED DESCRIPTION OF THE PREFERRED EMBODIMENTS

Hereinafter, a description of a structure and a driving method of an EL display of the present invention will be made. A case of performing a $2^n$ gray-scale by an n-bit digital data signal will be explained here.

Figure 1:
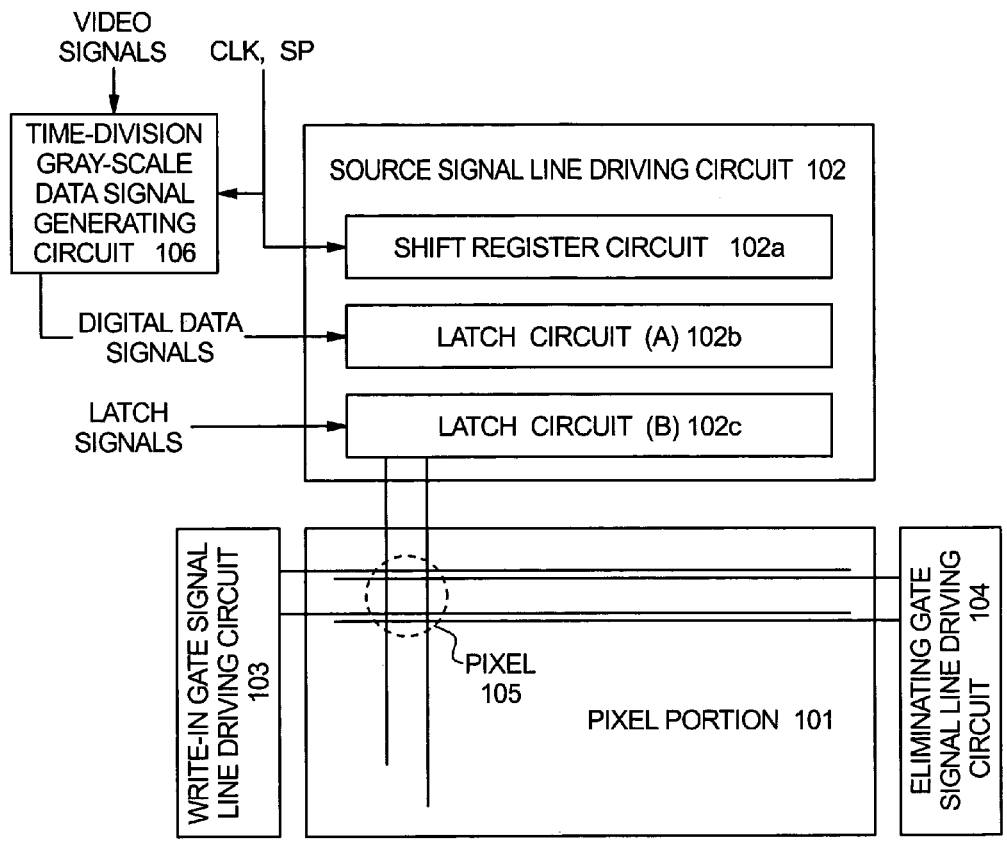
FIG. 1 is a diagram showing a circuit structure of an EL display of the present invention.

FIG. 1 is a block diagram showing an example of an EL display of the present invention. The EL display of FIG. 1 comprises a pixel portion 101, a source signal line driver circuit 102 arranged in the periphery of the pixel portion 101, a writing-in gate signal line driver circuit (a first gate signal line driver circuit) 103, and an eliminating gate signal line driver circuit (a second gate signal line driver circuit) 104 formed of TFTs formed on a substrate. Note that although the EL display has one source signal line driver circuit in the embodiment mode of the present invention, 2 or more source signal line driver circuits may be provided in the EL display in the present invention.

The present invention may adopt a structure where the source signal line driver circuit 102, the writing-in gate signal line driver circuit 103, or the eliminating gate signal line driver circuit 104 are provided on the substrate on which the pixel portion 101 is provided or a structure where the above circuits are provided on an IC chip and connected to the pixel portion 101 via an FPC or a TAB.

Basically, the source signal line driver circuit 102 is composed of a shift register circuit 102a, a latch circuit (A) 102b, and a latch circuit (B) 102c.

In the source signal line driver circuit 102, a clock signal (CLK) and a start pulse (SP) are inputted to the shift register circuit 102a. The shift register circuit 102a sequentially generates timing signals on the basis of the clock signal (CLK) and the start pulse (SP) to thereby sequentially feed the timing signals to downstream circuits through a buffer circuit (not shown) or the like.

The timing signals from the shift register circuit 102a are buffered and amplified by the buffer circuit or the like. The load capacitance (parasitic capacitance) is large since a large number of circuits or elements are connected to the wiring to which the timing signals are fed. The buffer circuit is provided to prevent rise or fall of the timing signals to be dulled due to this large load capacitance.

The timing signals buffer amplified by the buffer circuit are then fed to the latch circuit (A) 102b. The latch circuit (A) 102b has plural stages of latch circuits for processing n-bit digital data signals. The latch circuit (A) 102b sequentially takes in and holds the n-bit digital data signals fed from a time-division gray-scale data signal generating circuit 106 upon input of the timing signals.

Note that the digital data signals may be sequentially fed to the plural stages of the latch circuits of the latch circuit (A) 102b when the digital data signals are taken in by the latch circuit (A) 102b. However, the present invention is not limited to this structure. A so-called division drive may be performed, that is, the plural stages of latch circuits of the latch circuit (A) 102b is divided into a number of groups and then the digital data signals are parallely fed to the respective groups at the same time. It is to be noted that the number of groups at this point is called a division number. For example, if the latch circuits are grouped into 4 stages each, then it is called a 4-branch division drive.

The time necessary to complete writing of the digital data signals into all the stages of the latch circuits of the latch circuit (A) 102b is called a line term. In other words, the line term is defined as a time interval from the start of writing the digital data signals into the latch circuit of the leftmost stage to the end of writing the digital data signals into the latch circuit of the mostright stage in the latch circuit (A) 102*b*. In effect, horizontal retrace term added to the above-defined line term may also be referred to as the line term.

After the completion of one line term, a latch signal is fed to the latch circuit (B) 102*c*. In this moment, the digital data signals written in and held by the latch circuit (A) 102*b* are sent all at once to the latch circuit (B) 102*c* to be written in and held by all the stages of latch circuits thereof.

Sequential writing-in of digital data signals newly fed from the time-division gray-scale data signal generating circuit 106 on the basis of the timing signals from the shift register circuit 102*a* is again carried out to the latch circuit (A) 102*b* after it has completed sending the digital data signals to the latch circuit (B) 102*c*.

During this second time one line term, the digital data signals written in and held by the latch circuit (B) 102*c* are outputted to source signal lines.

On the other hand, the writing-in gate signal line driver circuit 103 and the eliminating gate signal line driver circuit 104 are composed of a shift register circuit and a buffer circuit (both not shown in the figure), respectively. Depending on the situation, the writing-in gate signal line driver circuit 103 and the eliminating gate signal line driver circuit 104 may have a level shifter circuit in addition to the shift register circuit and the buffer circuit.

In the writing-in gate signal line driver circuit 103 and the eliminating gate signal line driver circuit 104, the timing signals from the shift register (not shown in the figure) are fed to the buffer circuit (not shown in the figure) to be fed to corresponding gate signal lines (also referred to as scanning lines). The gate signal lines are connected to the gate electrodes of the pixel TFTs of one line and all the pixel TFTs of one line have to be turned ON simultaneously, requiring the use of a buffer circuit with a large electric current capacity.

In the time-division gray-scale data signal generating circuit 106, analog or digital video signals (signals containing image information) are converted to digital data signals for performing time-division gray-scale and fed to the latch circuit (A) 102*b*. The time-division gray-scale data signal generating circuit 106 is also a circuit for generating signals such as a timing pulse that is necessary for performing time-division gray-scale display.

The time-division gray-scale data signal generating circuit 106 may be provided outside the EL display of the present invention. In this case, it becomes a structure in which the digital data signals generated by the time-division gray-scale data signal generating circuit 106 are fed to the EL display of the present invention. Hence, the EL display of the present invention and the time-division gray-scale data signal generating circuit are included as separate components of an electronic equipment (EL display device) having the EL display of the present invention as its display.

The time-division gray-scale data signal generating circuit 106 may also take the form of an IC chip or the like and be incorporated in the EL display. In this case, it becomes a structure in which the digital data signals formed by the IC chip are fed to the EL display device of the present invention. Thus, the EL display of the present invention incorporating the IC chip containing the time-division gray-scale data signal generating circuit is included as a component of the electronic equipment having the EL display of the present invention as its display.

Finally, the time-division gray-scale data signal generating circuit 106 that is formed by using a TFT may be formed on the same substrate as the pixel portion 101, the source signal line driver circuit 102, the writing-in gate signal line driver circuit 103, and the eliminating gate signal line driver circuit 104. The digital data signals containing image information that are fed to the EL display can all be processed on the substrate in this case. The time-division gray-scale signal generating circuit in this case may be formed of a TFT using a poly-silicon film as an active layer. Furthermore, in the electronic equipment having the EL display of the present invention as its display in this case, the time-division gray-scale signal generating circuit is incorporated into the EL display itself, thereby making it possible to manufacture smaller electronic equipments.

Figure 2:
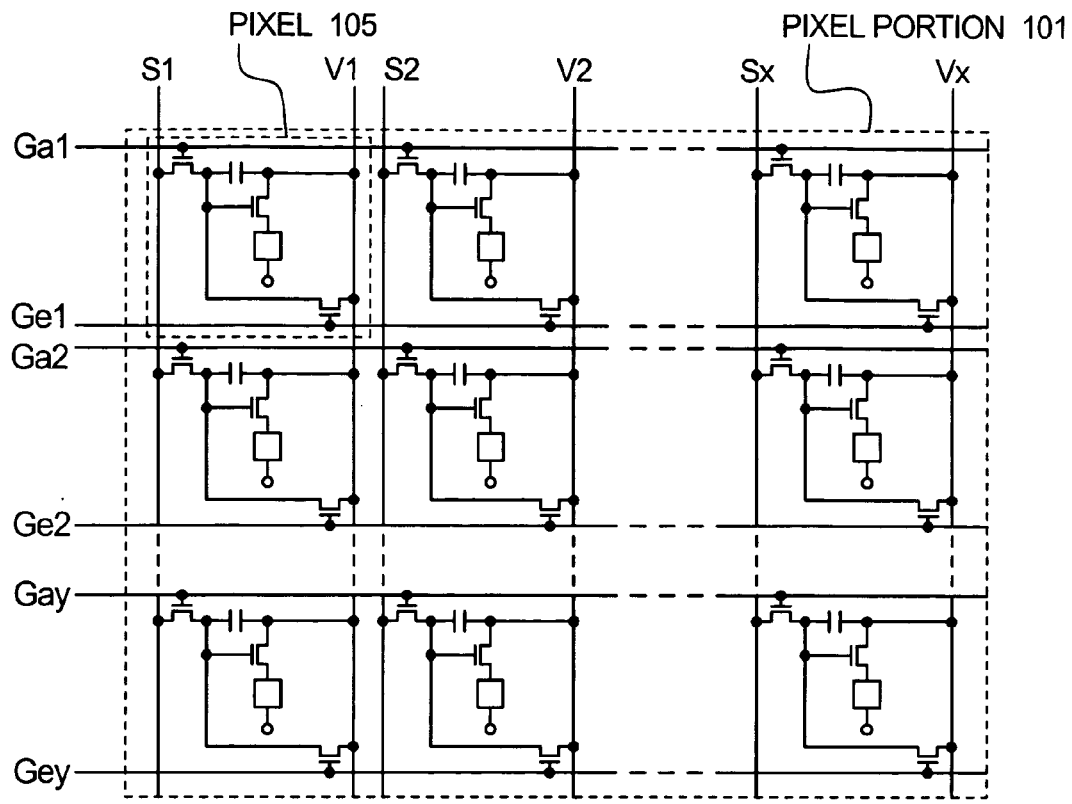
FIG. 2 is a diagram showing a circuit configuration of a pixel portion of the EL display of the present invention.

An enlarged view of the pixel portion 101 is shown in FIG. 2. Provided in the pixel portion 101 are source signal lines (S1 to Sx) connected to the latch circuit (B) 102*c* of the source signal line driver circuit 102, power supply lines (V1 to Vx) connected to an external power source of the EL display via the FPC, writing-in gate signal lines (first gate signal lines) (Ga1 to Gay) connected to the writing-in gate signal line driver circuit 103, and eliminating gate signal lines (second gate signal lines) (Ge1 to Gey) connected to the eliminating gate signal line driver circuit 104.

A region provided with the source lines (S1 to Sx), the power supply lines (V1 to Vx), the writing-in gate signal lines (Ga1 to Gay), and the eliminating gate signal lines (Ge1 to Gey), respectively, is a pixel 105. Thus, a plurality of pixels 105 are arranged in matrix in the pixel portion 101.

Figure 3:
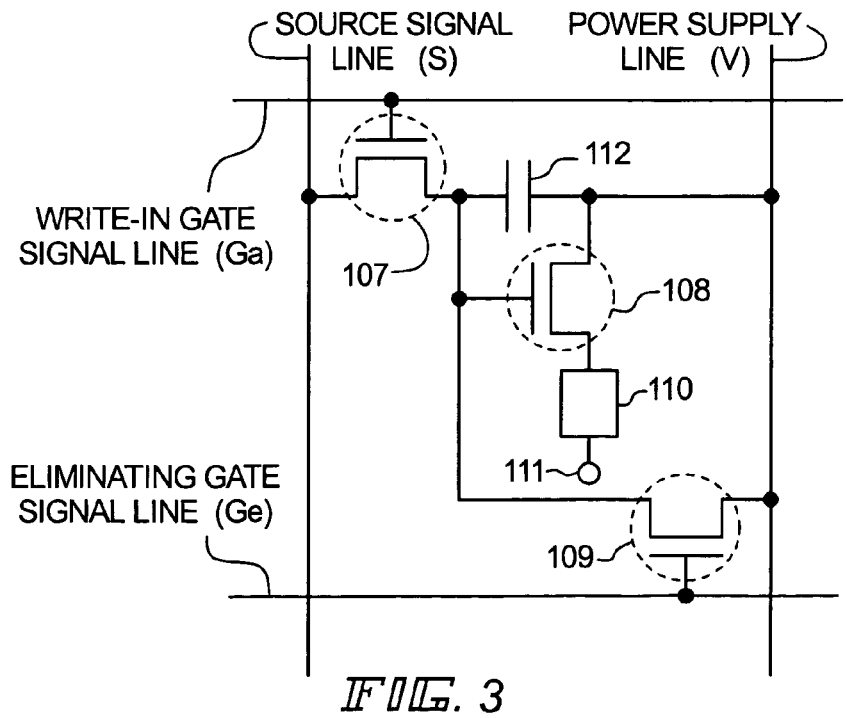
FIG. 3 is a diagram showing a circuit configuration of a pixel of the EL display of the present invention.

Shown in FIG. 3 is an enlarged view of the pixel 105. In FIG. 3, reference numeral 107 denotes a switching TFT. A gate electrode of the switching TFT 107 is connected to the writing-in gate signal line Ga (one of Ga1 to Gay). As to a source region and a drain region of the switching TFT, one is connected to the source signal line S (one of S1 to Sx) whereas the other is connected to a gate electrode of an EL driving TFT 108, a capacitor 112 of each of the pixels, and either a source region or a drain region of an eliminating TFT 109, respectively.

The capacitor 112 is provided for holding a gate voltage of the EL driving TFT 108 when the switching TFT 107 is in a non-selected state (OFF state). Note that although the present embodiment shows a structure with the provision of the capacitor 112, the present invention is not limited to this structure but may take a structure without the provision of the capacitor 112.

As to a source region and a drain region of the EL driving TFT 108, one is connected to the power supply line V (one of V1 to Vx) whereas the other is connected to an EL element 110. The power supply lines V (V1 to Vx) are connected to the capacitor 112, respectively.

As to a source region and a drain region of the eliminating TFT 109, the one not connected to the source region or the drain region of the switching TFT 107 is connected to the power supply lines V. A gate electrode of the eliminating TFT 109 is connected to the eliminating gate line Ge (one of Ge1 to Gey).

The EL element 110 is composed of an anode, a cathode, and an EL layer sandwiched therebetween. In a case where the anode is connected to the source region or the drain region of the EL driving TFT 108, the anode becomes a pixel electrode and the cathode becomes an opposing electrode. Conversely, if the cathode is connected to the source region or the drain region of the EL driver 108, the cathode becomes the pixel electrode while the anode becomes the opposing electrode.

An opposing electric potential is applied to the opposing electrode of the EL element 110 and a power supply electric potential is applied to the power supply lines V. Then an electric potential difference between the opposing electric potential and the power supply electric potential is always maintained at a level the EL element emits light when the power supply electric potential is applied to the pixel electrode. A power source provided to the externally attached IC or the like imparts the power supply electric potential and the opposing electric potential to the EL display of the present invention. Note that the power source for imparting the opposing electric potential is referred to as an opposing power source 111, particularly in the present specification.

In a typical EL display at present, when the luminescing amount of an area that the pixel luminesces is 200 cd/m$^2$, about several mA/cm$^2$ of current is required for the area of the pixel portion. Therefore, particularly as a screen size becomes larger, it becomes more difficult to control the level of the electric potential imparted from the power source provided to the IC with a switch. In the present invention, the power supply electric potential and the opposing electric potential are always held at a constant level, and hence using a switch to control the level of the electric potential imparted from the power source provided to the IC is not necessary, which makes the present invention useful in realizing a panel with a larger screen size.

Further, in the present invention, the level of the electric potential upon applying the power supply electric potential to the gate electrode of the EL driving TFT 108 needs to be at a level where the EL driving TFT 108 is in an OFF state.

Either an N channel TFT or a P channel TFT can be used to form the switching TFT 107, the EL driving TFT 108, and the eliminating TFT 109. In addition, the switching TFT 107, the EL driving TFT 108, and the eliminating TFT 109 need not be composed of a single gate structure, but may have a multi-gate structure such as a double gate structure or a triple gate structure.

A driving method of the EL display of the present invention having the above structure will be explained next with reference to FIGS. 2 to 4.

A writing-in selecting signal (first selecting signal) from the writing-in gate signal line driver circuit 103 is first fed to the writing-in gate signal line Ga1. As a result, the switching TFTs 107 of all the pixels (pixels of the first line) connected to the writing-in gate signal line Ga1 are turned to the ON state.

And at the same time, the first bit of the digital data signal from the latch circuit (B) 102c of the source signal line driver circuit 102 is fed to the source signal lines S1 to Sx. The digital data signal is fed to the gate electrode of the EL driving TFT 108 through the switching TFT 107. A digital data signal has the information "0" or "1", where one has a "Hi" voltage while the other has a "Lo" voltage.

In the present embodiment mode, when the digital data signal has the "0" information, the EL driving TFT 108 is in the OFF state. A power supply electric potential is therefore not applied to the pixel electrode of the EL element 110. Consequently, the EL element 110 of the pixel to which the digital data signal with the "0" information is fed does not emit light.

On the other hand, when the digital data signal has the "1" information, the EL driving TFT 108 is in the ON state, and hence a power supply electric potential is applied to the pixel electrode of the EL element 110. As a result, the EL element 110 of the pixel to which the digital data signal with the "1" information is fed emits light.

Thus, the EL element either emits light or not upon input of the digital data signal to the pixels of the first line, whereby the pixels of the first line perform display. A period in which the pixels perform display is referred to as a display period Tr. In particular, a display period which starts to perform display at the point the first bit of digital data signal is inputted to the pixel is referred to as Tr1. To simplify the explanation, only the display period of the pixels of the first line, in particular, is shown in FIG. 4. The display periods of each of the lines have a time difference in their timing to start.

Next, at the same time the inputting of the writing-in selecting signal to the writing-in gate signal line Ga1 is completed, the writing-in selecting signal is similarly inputted to the writing-in gate signal line Ga2. The switching TFTs 107 of all the pixels connected to the writing-in gate signal line Ga2 are turned to the ON state, to thereby feed the first bit of digital data signal from the source signal lines S1 to Sx to the pixels of the second line.

Accordingly, the writing-in selecting signals are sequentially fed to all the writing-in gate signal lines (Ga1 to Gay). All the writing-in gate signal lines (Ga1 to Gay) are selected and the period up until the first bit of the digital data signal has been fed to the pixels of all the lines is thus a writing-in period Ta1.

On the other hand, before the first bit of digital data signal is fed to the pixels of all the lines, in other words, before the completion of the writing-in period Ta1, input of an eliminating selecting signal (second selecting signal) from the eliminating gate signal line driver circuit 104 to the eliminating gate signal line Ge1 is performed parallel with the input of the first bit of digital data signal to the pixel.

Upon input of the eliminating selecting signal to the eliminating gate signal line Ge1, the eliminating TFTs 109 of all the pixels (pixels of the first line) connected to the eliminating gate signal line Ge1 are turned to the ON state. Then the power supply electric potential of the power supply lines (V1 to Vx) is imparted to the gate electrode of the EL driving TFT 108 through the eliminating TFT 109.

The EL driving TFT 108 is turned to the OFF state when the power supply electric potential is imparted to the gate electrode thereof. Accordingly, the power supply electric potential cannot be imparted to the pixel electrode of the EL element 110, and therefore all the EL elements of the pixels of the first line become non-luminescent. As a result, the pixels of the first line do not perform display. That is, from the time the writing-in gate signal line Ga1 is selected by the writing-in selecting signal, the digital data signal held by the gate electrode of the EL driving TFT is eliminated by the application of the power supply electric potential to the gate electrode of the EL driving TFT. The pixels of the first line thus do not perform display.

A period in which the pixels do not perform display is referred to as a non-display period Td. The display period Tr1 ends at the same time the eliminating selecting signal is fed to the eliminating gate signal line Ge1, and the pixels of the first line then become a non-display period Td1.

To simplify the explanation, only the non-display period of the pixels of the first line, in particular, is shown in FIG. 4. The non-display periods of each of the lines have a time difference in their timing to start, similar to the display periods.

The eliminating selecting signal is then fed to the eliminating gate signal line Ge2 upon the completion of feeding the eliminating selecting signal to the eliminating gate signal line Ge1. Similarly, the eliminating TFTs 109 of all the pixels (pixels of the second line) connected to the eliminating gate signal line Ge2 are turned to the ON state. Then the power supply electric potential of the power supply lines (V1 to Vx) is imparted to the gate electrode of the EL driving TFT 108 through the eliminating TFT 109. The EL driving TFT 108 is turned to the OFF state when the power supply electric potential is imparted to the gate electrode thereof. Therefore, the power supply electric potential cannot be imparted to the pixel electrode of the EL element 110. As a result, all the EL elements of the pixels of the second line become non-luminescent state, whereby the pixels of the second line do not perform display, turning into a non-display state.

The eliminating signals are sequentially fed to all the eliminating gate signal lines. All the eliminating gate signal lines (Ga1 to Gay) are thus selected and a period up until the elimination of the first bit of digital data signal held by the pixels of all the lines is an eliminating period Te1.

On the other hand, before the first bit of digital data signal held by the pixels of all the lines is eliminated, that is, before the eliminating period Te1 ends, input of the writing-in selecting signal from the writing-in gate signal line driver circuit 103 to the writing-in gate signal line Ga1 is once again performed parallel with the elimination of the first bit of digital data signal to the pixels. Consequently, pixels of the first line perform display again and the non-display period Td1 ends to become a display period Tr2.

Similarly, all the writing-in gate signal lines are sequentially selected to thereby feed the second bit of digital data signal to all the pixels. A period up until the completion of feeding the second bit of digital data signal to the pixels of all the lines is referred to as a writing-in period Ta2.

On the other hand, before the second bit of digital data signal is fed to the pixels of all the lines, in other words, before the writing-in period Ta2 ends, input of the eliminating selecting signal from the eliminating gate signal line driver circuit 104 to the eliminating gate signal line Ge2 is performed parallel with the input of the second bit of digital data signal to the pixels. Consequently, all the EL elements of the pixels of the first line become non-luminescent, whereby the pixels thereof do not perform display. The display period Tr2 in the pixels of the first line thus ends to thereby become a non-display period Td2.

The eliminating signals are then sequentially fed to all the eliminating gate signal lines. All the eliminating gate signal lines (Ga1 to Gay) are thus selected and a period up until the elimination of the second bit of digital data signal held by the pixels of all the lines is an eliminating period Te2.

The above-described operation is repeatedly carried out until the (m) bit of digital data signal is fed to the pixels and the display period Tr and the non-display period Td repeatedly appears.(See FIG. 4) The display period Tr1 refers to a period from the start of the writing-in period Ta1 to the start of the eliminating period Te1. Furthermore, the non-display period Td1 refers to a period from the start of the eliminating period Te1 to the start of the display period Ta2. Thus, the periods of the display periods Tr2, Tr3, . . . , and Tr(m−1) and the non-display periods Td2, Td3, . . . , and Td(m−1), similar to the display period Tr1 and the non-display period Td1, are determined by the writing-in periods Ta1, Ta2, . . . , and Ta(m) and the eliminating periods Te1, Te2, . . . , and Te(m−1), respectively.

After the (m) bit of digital data signal is fed to the pixels of the first line, the eliminating selecting signal is not fed to the eliminating gate signal line Ge1. An explanation is made in the present embodiment taking m=n−2 as an example to simplify the explanation. Needless to say, the present invention is not limited to this value. In the present invention, a value from 2 to (n) may be arbitrarily selected as (m).

Pixels of the first line become the display period Tr(n−2) and perform display once the (n−2) bit of digital data signal is fed to the pixels of the first line. The (n−2) bit of digital data signal is held by the pixels of the first line until the next bit of digital data signal is fed.

Subsequently, when the next (n−1) bit of digital data signal is fed to the pixels of the first line, the (n−2) bit of digital data signal held by the pixels is rewritten into the (n−1) bit of digital data signal. Then the pixels of the first line become the display period Tr(n−1) to thereby perform display. The (n−2) bit of digital data signal is held by the pixels until the next bit of digital data signal is fed.

The above-described operation is repeatedly carried out until the (n) bit of digital data signal is fed to the pixels. (See FIG. 4) The display period Tr(n−2) is the period from the start of the writing-in period Ta(n−2) to the start of the writing-in period Ta(n−1). Furthermore, the periods of the display period Tr(n−1) and Tr(n), similar to the display period Tr(n−2), are determined by the writing-in period Ta, respectively.

In the present invention, it is necessary to set the total length of all the writing-in periods to be shorter than 1 frame period as well as to set the length of the display periods to Tr1: Tr2: Tr3: . . . : Tr(n−1): Tr(n)=$2^0$: $2^1$: $2^2$: . . . : $2^{(n-2)}$: $2^{(n-1)}$.

When all the display periods (Tr1 to Tr(n)) have ended, one image can be displayed. The period for displaying one image is referred to as 1 frame period (F) in the driving method of the present invention.

Thus, after the completion of 1 frame period, a writing-in selecting signal from the writing-in gate signal line driver circuit 103 is again fed to the writing-in gate signal line Ga1. As a result, the first bit of digital data signal is fed to the pixels and the pixels of the first line again become the display period Tr1. The above-described operation is thus repeated again.

The provision of 60 or more frame periods per second in a normal EL display is preferred. If less than 60 images are displayed in one second, the flickering of the images will be conspicuous.

The lengths of the display periods are set so that they are Tr1: Tr2: Tr3: . . . : Tr(n−1): Tr(n)=$2^0$: $2^1$: $2^2$: . . . : $2^{(n-2)}$: $2^{(n-1)}$. With the combination of the display periods, a desired gray-scale display can be performed from among the $2^n$ gray-scales.

Requesting the total sum of the length of the display periods luminesced by the El element in 1 frame period determines the gray-scale displayed by the pixels in that frame period. For instance, assuming that the luminance of the pixels luminescing in all the display periods is 100% when n=8, then in the case of the pixels luminescing in Tr1 and Tr2, a luminance of 1% can be expressed whereas if Tr3, Tr5, and Tr8 are selected, a 60% luminance can be expressed.

It is very crucial that the length of the writing-in period Ta(m) for writing-in the (m) bit of digital data signal to the pixels is shorter than the length of the display period Tr(m). Therefore, the value of (m) number bit, within the range of 1 to (n), needs to be set to a value where the length of writing-in period Ta(m) is shorter than that of the display period Tr(m).

The display periods (Tr1 to Tr(n)) may be made to appear in any order. For instance, the display periods in 1 frame period may be made to appear in the order of Tr1, Tr3, Tr5, Tr2, . . . . However, it is preferable that the order of appearance is a order in which the eliminating periods (Te1 to Te(n)) do not overlap with each other.

Note that in the present invention, either the N channel TFT or the P channel TFT may be used to form the EL driving TFT 108. However, if the anode of the EL element 110 is the pixel electrode and the cathode is the opposing electrode, using the P channel TFT to form the EL driver circuit 108 is preferred. Alternatively, if the anode and the cathode of the EL element 110 is the opposing electrode and the pixel electrode, respectively, then using the N channel TFT to form the EL driving TFT 108 is preferred.

By adopting the above structure, the present invention is capable of suppressing the variations in the amount of current flow outputted when equivalent gate voltages are applied even if there is a slight variation in the $I_{DS}$-$V_{GS}$ characteristic caused by the TFTs. As a result, the situation in which the occurrence of a vast difference between the amount of luminescing of the EL element with that of an adjacent pixel caused by the variation of the $I_{DS}$-$V_{GS}$ characteristic even if the signals having equivalent voltages are fed may be avoided.

In addition, the non-display periods Td for not performing displays can be provided in the present invention. In the case of the conventional analog drive, if the EL display is made to display all white images, then the EL element is constantly luminescing, becoming a factor in advancing the deterioration of the EL layer. The non-luminescing periods can be provided in the present invention, and therefore a certain level of deterioration of the EL layer can be suppressed.

It is to be noted that in the present invention, a portion of the display period and a portion of the writing-in period overlap with each other. In other words, even in the writing-in periods, it is possible to display the pixels. Thus, a ratio (duty ratio) of the total sum of the lengths of the display periods in 1 frame is not determined solely by the length of the writing-n period.

The above-described structure of the present invention is not applicable only to the EL display, but may be also be applied to devices employing other electronic elements. Furthermore, if a high-speed response liquid crystal whose response time is several tenths μ sec or less is developed, the present invention may also be applied to a liquid crystal display.

Hereinafter, embodiments of the present invention will be explained.

Embodiment 1

In the EL display of the present invention, a case of performing a $2^6$ gray-scale display from a 6-bit digital data signal is explained in Embodiment 1 with reference to FIG. 5. It is to be noted that the EL display of Embodiment 1 has the structure that is illustrated in FIGS. 1 to 3.

First, the writing-in selecting signal from the writing-in gate signal line driver circuit 103 is fed to the writing-in gate signal line Ga1. As a result, the switching TFTs 107 of all the pixels (pixels of the first line) connected to the writing-in gate signal line Ga1 are turned to the ON state.

And at the same time, the first bit of the digital data signal from the latch circuit (B) 102c of the source signal line driver circuit 102 is fed to the source signal lines S1 to Sx. The digital data signal is fed to the gate electrode of the EL driving TFT 108 through the switching TFT 107.

In the Embodiment 1, when the digital data signal has the "0" information, the EL driving TFT 108 is turned to the OFF state. A power supply electric potential is therefore not applied to the pixel electrode of the EL element 110. Consequently, the EL element 110 of the pixel to which the digital data signal with the "0" information is fed does not emit light.

On the other hand, when the digital data signal has the "1" information, the EL driving TFT 108 is in the ON state, and hence a power supply electric potential is applied to the pixel electrode of the EL element 110. As a result, the EL element 110 of the pixel to which the digital data signal with the "1" information is fed emits light.

Thus, either the EL element is luminescent or non-luminescent upon input of the digital data signal, the pixels of the first line become the display period Tr1. To simplify the explanation, only the display period of the pixels of the first line, in particular, is shown in FIG. 5. The display periods of each of the lines have a time difference in their timing to start.

Next, at the same time the inputting of the writing-in selecting signal to the writing-in gate signal line Ga1 is completed, the writing-in selecting signal is similarly inputted to the writing-in gate signal line Ga2. The switching TFTs 107 of all the pixels connected to the writing-in gate signal line Ga2 are turned to the ON state, to thereby feed the first bit of digital data signal from the source signal lines S1 to Sx to the pixels of the second line.

Accordingly, the writing-in selecting signal are sequentially fed to all the writing-in gate signal lines (Ga1 to Gay). All the writing-in gate signal lines (Ga1 to Gay) are selected and the period up until the first bit of the digital data signal has been fed to the pixels of all the lines is thus the writing-in period Ta1.

On the other hand, before the first bit of digital data signal is fed to the pixels of all the lines, in other words, before the completion of the writing-in period Ta1, input of an eliminating selecting signal from the eliminating gate signal line driver circuit 104 to the eliminating gate signal line Ge1 is performed parallel with the input of the first bit of digital data signal to the pixel.

Upon input of the eliminating selecting signal to the eliminating gate signal line Ge1, the eliminating TFTs 109 of all the pixels (pixels of the first line) connected to the eliminating gate signal line Ge1 are turned to the ON state. Then the power supply electric potential of the power supply lines (V1 to Vx) is imparted to the gate electrode of the EL driving TFT 108 through the eliminating TFT 109.

The EL driving TFT 108 is turned to the OFF state when the power supply electric potential is imparted to the gate electrode thereof. Accordingly, the power supply electric potential cannot be imparted to the pixel electrode of the EL element 110, and therefore all the EL elements of the pixels of the first line become non-luminescent. As a result, the pixels of the first line do not perform display. That is, from the time the writing-in gate signal line Ga1 is selected by the writing-in selecting signal, the digital data signal held by the gate electrode of the EL driving TFT is eliminated by the application of the power supply electric potential to the gate electrode of the EL driving TFT. The pixels of the first line thus do not perform display.

The display period Tr1 ends at the same time the eliminating selecting signal is fed to the eliminating gate signal line Ge1, and the pixels of the first line then become the non-display period Td1.

To simplify the explanation, only the non-display period of the pixels of the first line, in particular, is shown in FIG. 5. The non-display periods of each of the lines have a time difference in their timing to start, similar to the display periods.

The eliminating selecting signal is then fed to the eliminating gate signal line Ge2 upon completion of feeding the eliminating selecting signal to the eliminating gate signal line Ge1. Similarly, the eliminating TFTs 109 of all the pixels (pixels of the second line) connected to the eliminating gate signal line Ge2 are turned to the ON state. Then the power supply electric potential of the power supply lines (V1 to Vx) is imparted to the gate electrode of the EL driving TFT 108 through the eliminating TFT 109. The EL driving TFT 108 is turned to the OFF state when the power supply electric potential is imparted to the gate electrode thereof. Therefore, the power supply electric potential cannot be imparted to the pixel electrode of the EL element 110. As a result, all the EL elements of the pixels of the second line become non-luminescent, whereby the pixels of the second line do not perform display, turning into a non-display state. The eliminating signals are sequentially fed to all the eliminating gate signal lines. All the eliminating gate signal lines (Ga1 to Gay) are thus selected and the period up until the elimination of the first bit of digital data signal which is held by the pixels of all the lines is the eliminating period Te1.

On the other hand, before the first bit of digital data signal held by the pixels of all the lines is eliminated, that is, before the eliminating period Te1 ends, input of the writing-in selecting signal from the writing-in gate signal line driver circuit 103 to the writing-in gate signal line Ga1 is once again performed parallel with the elimination of the first bit of digital data signal to the pixels. Consequently, pixels of the first line perform display again and the non-display period Td1 ends and turns into the display period Tr2.

Similarly, all the writing-in gate signal lines are sequentially selected to thereby feed the second bit of digital data signal to all the pixels. The period up until the completion of feeding the second bit of digital data signal to the pixels of all the lines is referred to as the writing-in period Ta2.

On the other hand, before the second bit of digital data signal is fed to the pixels of all the lines, in other words, before the writing-in period Ta2 ends, input of the eliminating selecting signal from the eliminating gate signal line driver circuit 104 to the eliminating gate signal line Ge2 is performed parallel with the input of the second bit of digital data signal to the pixels. Consequently, all the EL elements of the pixels of the first line become non-luminescent, whereby the pixels thereof do not perform display. The display period Tr2 in the pixels of the first line thus ends to thereby become the non-display period Td2.

The eliminating signals are then sequentially fed to all the eliminating gate signal lines. All the eliminating gate signal lines (Ga1 to Gay) are thus selected and the period up until the elimination of the second bit of digital data signal held by the pixels of all the lines is the eliminating period Te2.

The above-described operation is repeatedly carried out until the fifth bit of digital data signal is fed to the pixels and the display period Tr and non-display period Td repeatedly appears.(See FIG. 5) The display period Tr1 refers to the period from the start of the writing-in period Ta1 to the start of the eliminating period Te1. Furthermore, the non-display period Td1 refers to the period from the start of the eliminating period Te1 to the start of the display period Tr2. Thus, the periods of the display periods Tr2, Tr3, and Tr4 and the non-display periods Td2, Td3, and Td4, similar to the display period Tr1 and the non-display period Td1, are determined by the writing-in periods Ta1, Ta2, . . . , and Ta5 and the eliminating periods Te1, Te2, . . . , and Te4, respectively.

After the fifth bit of digital data signal is fed to the pixels of the first line, the eliminating selecting signal is not fed to the eliminating gate signal line Ge1. It is to be noted that after the fifth bit of digital data signal has been fed to the pixels of the first line, the eliminating signal is not fed to the eliminating gate signal line Ge1 in Embodiment 1. Needless to say, the present invention is not limited to the value 5.

Pixels of the first line become the display period Tr5 and perform display once the fifth bit of digital data signal is fed to the pixels of the first line. The fifth bit of digital data signal is held by the pixels of the first line until the next bit of digital data signal is fed.

Subsequently, if a sixth bit of digital data signal is fed to the pixels of the first line, the fifth bit of digital data signal held by the pixels is rewritten to the sixth bit of digital data signal. Then the pixels of the first line become the display period Tr6 to thereby perform display. Again, the sixth bit of digital data signal is held by the pixels until the next bit of digital data signal is fed.

If the first bit of digital data signal is again fed to the pixels, the frame period ends at the same time the display period Tr6 ends. The display of one image can be made upon completion of all the display periods (Tr1 to Tr6). In the driving method of the present invention, the period for displaying one image is called the 1 frame period (F). The above-described operation is repeated.

The display period Tr5 is the period from the start of the writing-in period Ta5 to the start of the writing-in period Ta6. Furthermore, the display period Tr6 is the period from the start of the writing-in period Ta6 to the start of the writing-in period Ta1 of the next frame period.

The length of the display periods Tr is set so that it is Tr1: Tr2: . . . : Tr5: Tr6=$2^0$: $2^1$: . . . : $2^4$: $2^5$. With the combination of the display periods, a desired gray-scale display can be performed from among the $2^6$ gray-scales.

Requesting the total sum of the length of the display periods luminesced by the El element in 1 frame period determines the gray-scale displayed by the pixels in that frame period. For instance, assuming that the luminance of the pixels luminescing in all the display periods is 100%, then in the case of the pixels luminescing in Tr1 and Tr2, a luminance of 5% can be expressed whereas if Tr3 and Tr5 are selected, a 32% luminance can be expressed.

It is very crucial that the length of the writing-in period Ta5 for writing-in the fifth bit of digital data signal to the pixels is shorter than the length of the display period Tr5 in Embodiment 1.

In addition, the display periods (Tr1 to Tr6) may be made to appear in any order. For instance, the display periods in 1 frame period may be made to appear in the order of Tr1, Tr3, Tr5, Tr2, . . . . However, it is preferable that the order of appearance is a order in which the eliminating periods (Te1 to Te6) do not overlap with each other.

Note that in the present invention, either the N channel TFT or the P channel TFT may be used to form the EL driving TFT 108. However, if the anode of the EL element 110 is the pixel electrode and the cathode is the opposing electrode, using the P channel TFT to form the EL driver circuit 108 is preferred. Alternatively, if the anode and the cathode of the EL element 110 is the opposing electrode and the pixel electrode, respectively, then using the N channel TFT to form the EL driving TFT 108 is preferred.

By adopting the above structure, the present invention is capable of suppressing the variations in the amount of current flow outputted when equivalent gate voltages are applied even if there is a slight variation in the $I_{DS}$-$V_{GS}$ characteristic caused by the TFTs. As a result, the situation in which the occurrence of a vast difference between the amount of luminescing of the EL element with that of an adjacent pixel caused by the variation of the $I_{DS}$-$V_{GS}$ characteristic even if signals having equivalent voltages are fed may be avoided.

In addition, the non-luminescing period for not performing display can be provided in the present invention. In the case of the conventional analog drive, if the EL display is made to display all white images, then the EL element is constantly luminescing, becoming a factor in advancing the deterioration of the EL layer. The non-luminescing period can be provided in the present invention, and therefore a certain level of deterioration of the EL layer can be suppressed.

Further, in the present invention, it is necessary to set the total length of all the writing-in periods to be shorter than 1 frame period as well as to set the length of the display periods so that they may be in the range of Tr1: Tr2: . . . : Tr5: Tr6=$2^0$: $2_1$: $2^2$: . . . : $2^4$: $2^5$.

Embodiment 2

An example of manufacturing an EL display using the present invention is explained in embodiment 2.

Figure 6A:
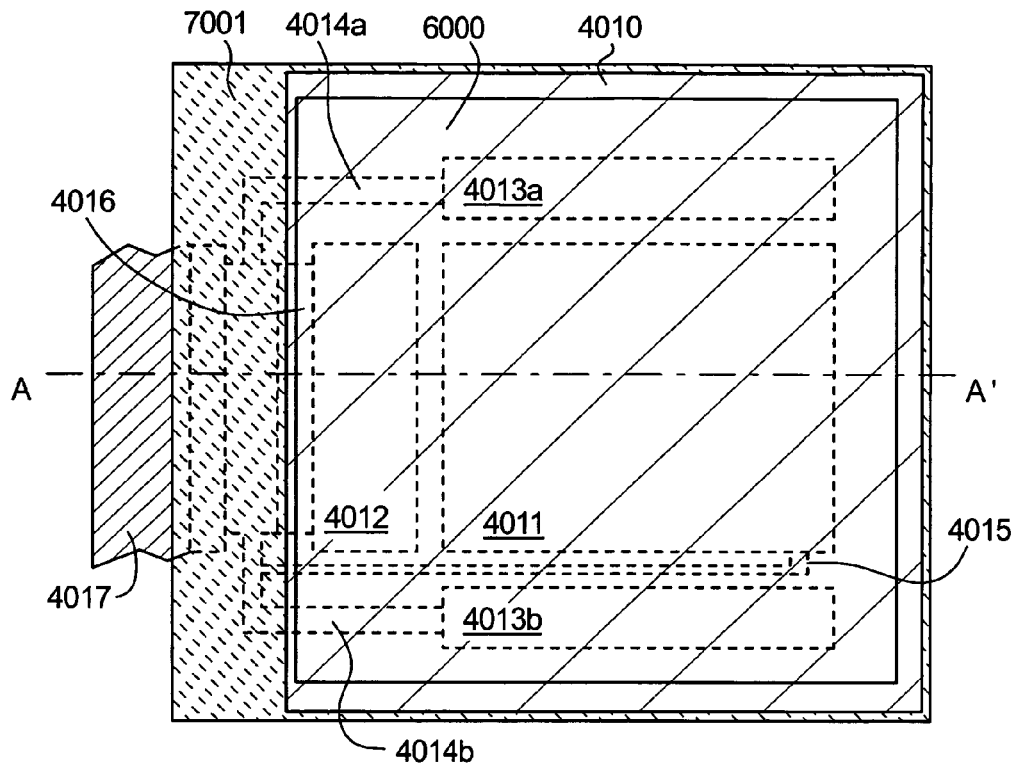
FIGS. 6A and 6B are a top view and a cross-sectional view, respectively, of the EL display of the present invention.

FIG. 6A is a top view of an EL display device using the present invention. In FIG. 6A, reference numeral 4010 is a substrate, reference numeral 4011 is a pixel portion, reference numeral 4012 is a source signal line driver circuit, reference numeral 4013a is a writing gate signal line driver circuit and 4013b is an erasing gate signal line driver circuit. The driver circuits are connected to external equipment, through an FPC 4017, via wirings 4014a, 4014b, 4015 and 4016.

A covering material 6000, a sealing material (also referred to as a housing material) 7000, and an airtight sealing material (a second sealing material) 7001 are formed so as to enclose at least the pixel portion, preferably the driver circuits and the pixel portion, at this point.

Figure 6B:
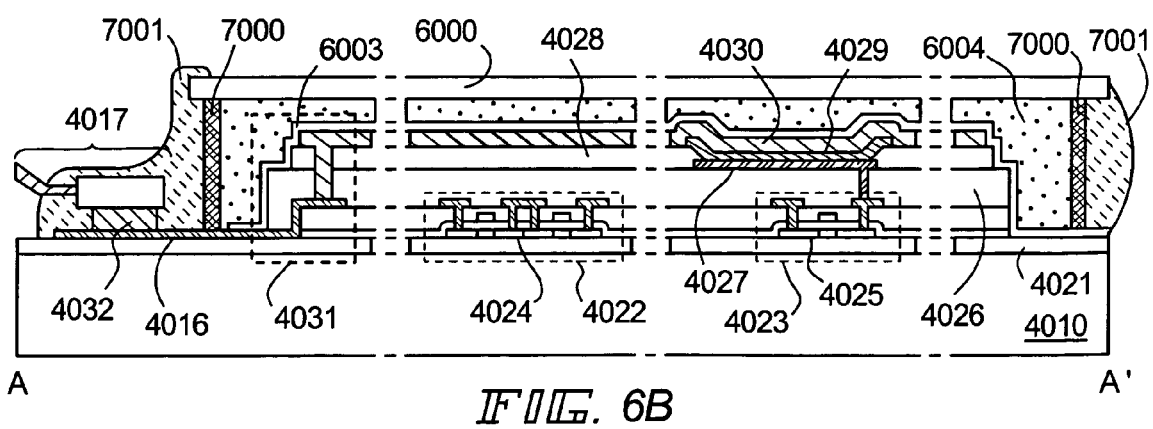

Further, FIG. 6B is a cross sectional structure of the EL display device of the present invention. A driver circuit TFT 4022 (note that a CMOS circuit in which an n-channel TFT and a p-channel TFT are combined is shown in the figure here), a pixel portion TFT 4023 (note that only an EL driving TFT for controlling the current flowing to an EL element is shown here) are formed on a base film 4021 on a substrate 4010. The TFTs may be formed using a known structure (a top gate structure or a bottom gate structure).

After the driver circuit TFT 4022 and the pixel portion TFT 4023 are completed, a pixel electrode 4027 is formed on an interlayer insulating film (leveling film) 4026 made from a resin material. The pixel electrode is formed from a transparent conducting film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In embodiment 2, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to deposit the EL layer 4029 and the cathode under vacuum or to form the EL layer 4029 in an inert gas atmosphere and to form the cathode 4030 without an air exposure. The above film deposition becomes possible in embodiment 2 by using a multi-chamber method (cluster tool method) film deposition apparatus.

Note that a lamination structure of a LiF (lithium fluoride) film and an Al (aluminum) film is used in embodiment 2 as the cathode 4030. Specifically, a 1 nm thick LiF (lithium fluoride) film is formed by evaporation on the EL layer 4029, and a 300 nm thick aluminum film is formed on the LiF film. An MgAg electrode, a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of μm of aluminum foil is sandwiched by a PVF film or a Mylar film.

However, depending upon the light emission direction from the EL device (the light radiation direction), it is necessary for the covering material 6000 to have light transmitting characteristics.

Further, the wiring 4016 is electrically connected to the FPC 4017 through a gap between the airtight sealing material 7001 and the substrate 4010. Note that although an explanation of the wiring 4016 has been made here, the wirings 4014a, 4014b and 4015 are also electrically connected to the FPC 4017 by similarly passing space between the airtight sealing material 7001 and sealing material 7000, and the substrate 4010.

In this embodiment, the covering material 6000 is bonded after forming the filling material 6004, and the sealing material 7000 is attached so as to cover the lateral surfaces (exposed surfaces) of the filling material 6004, but the filling material 6004 may also be formed after attaching the covering material 6000 and the sealing material 7000. In this case, a filling material injection opening is formed through a gap formed by the substrate 4010, the covering material 6000, and the sealing material 7000. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 3

Figure 7A:
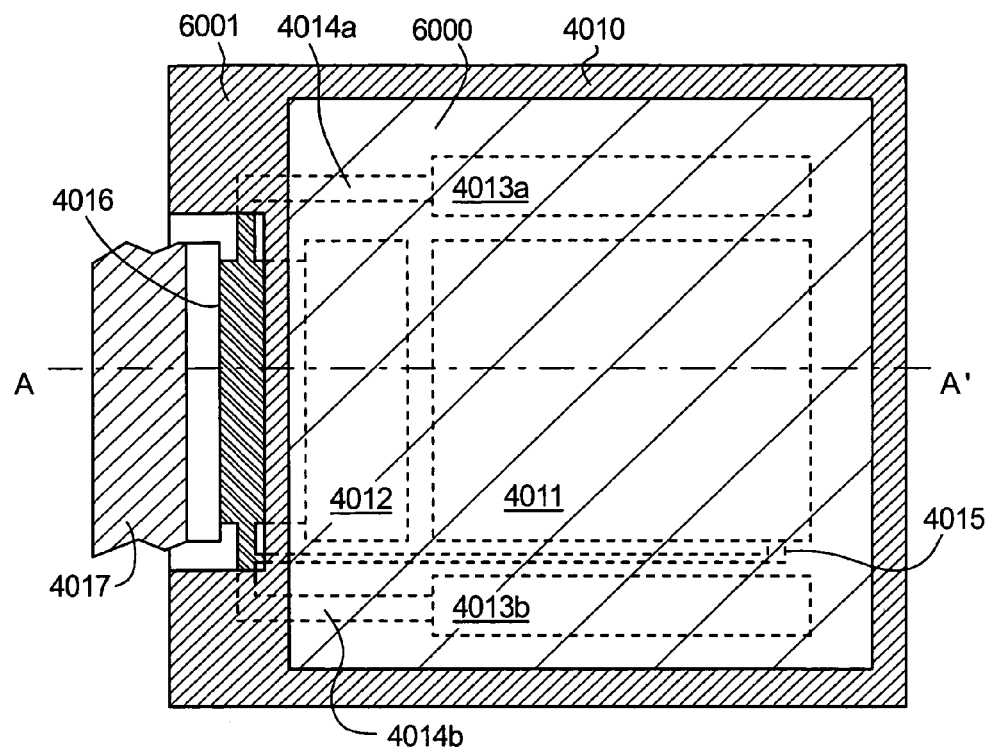
FIGS. 7A and 7B are a top view and a cross-sectional view, respectively, of the EL display of the present invention.
Figure 7B:
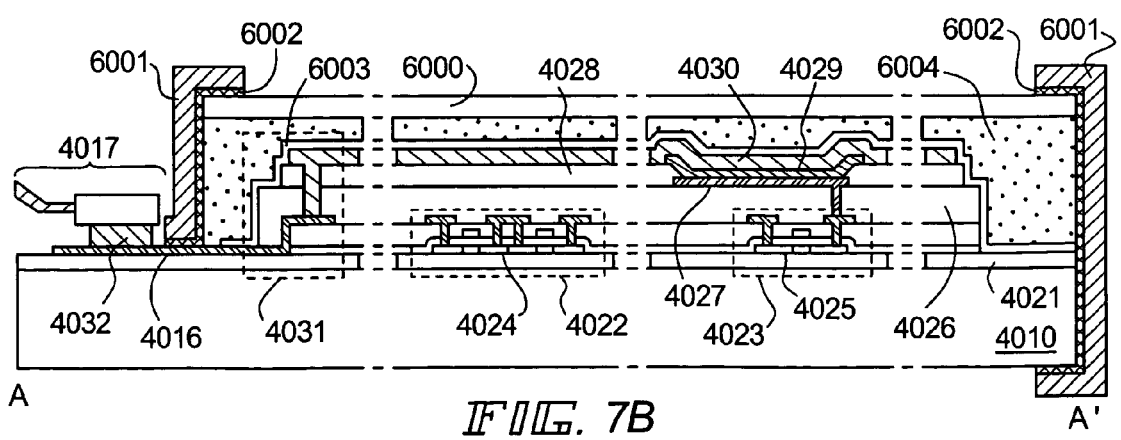

In this embodiment, an example of manufacturing an EL display device having a structure which differs from that of embodiment 2 is explained using FIGS. 7A and 7B. Parts having the same reference numerals as those of FIGS. 6A and 6B indicate the same portions, and therefore an explanation of those parts is omitted.

FIG. 7A is a top view of an EL display device of this embodiment, and FIG. 7B shows a cross sectional diagram in which FIG. 7A is cut along the line A–A'.

In accordance with embodiment 2, manufacturing is performed through the step of forming the passivation film 6003 covering the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filler material 6004, it is preferable to use a sheet with a structure in which several tens of μm of aluminum foil is sandwiched by a PVF film or a Mylar film.

However, depending upon the light emission direction from the EL device (the light radiation direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light hardening resin as the sealing material 6002 at this point, but provided that the heat resistance characteristics of the EL layer permit, a thermal hardening resin may also be used. Note that it is preferable that the sealing material 6002 be a material which, as much as possible, does not transmit moisture and oxygen. Further, a drying agent may also be added to an inside portion of the sealing material 6002.

The wiring 4016 is electrically connected to the FPC 4017 through a gap between the sealing material 6002 and the substrate 4010. Note that although an explanation of the wiring 4016 has been made here, the wirings 4014a, 4010b and 4015 are also electrically connected to the FPC 4017 by similarly passing through a gap between the sealing material 6002 and the substrate 4010.

Note that the covering material 6000 is bonded, and the frame material 6001 is attached so as to cover the lateral surfaces (exposed surfaces) of the filling material 6004, after forming the filling material 6004 in this embodiment, but the filling material 6004 may also be formed after attaching the covering material 6000 and the frame material 6001. In this case, a filling material injection opening is formed through a gap formed by the substrate 4010, the covering material 6000, and the frame material 6001. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

Embodiment 4

A more detailed cross sectional structure of a pixel portion is shown here in FIG. 8. In FIG. 8, a switching TFT 3502 formed on a substrate 3501 is manufactured by using an n-channel type TFT formed by a known method. A double gate structure is used in this embodiment. However, the double-gate structure is a structure in which two TFTs are, in effect, connected in series, and it has the merit that an OFF current value can be decreased. Note that although a double gate structure is used in this embodiment, a single gate structure, a triple gate structure, and a multi gate structure possessing a greater number of gates may also be used. Further, a p-channel type TFT can also be used.

An erasing TFT 3504 is an n-channel TFT, and is manufactured using a known method. A single gate structure is used in this embodiment. Note that although a single gate structure is used in this embodiment, a double gate structure, a triple gate structure, and a multi gate structure possessing a greater number of gates may also be used. Further, an p-channel type TFT formed by a known method can also be used. A drain wiring 31 of an erasing TFT 3504 is electrically connected to a drain wiring 35 of the switching TFT 3502 and a gate electrode 37 of an EL driving TFT by a wiring 36.

An EL driving TFT 3503 is using an n-channel TFT manufactured using a known method. A gate electrode 37 of the EL driving TFT is electrically connected to a drain wiring 35 of the switching TFT 3502 and a drain wiring 31 of the easing TFT 3504 by a wiring 36.

Since the EL driving TFT is an element for controlling the magnitude of a current to flow through the EL element, it is an element through which a large amount of current flows and which is highly liable to deterioration ascribable to heat and also deterioration ascribable to hot carriers. Therefore, that structure of the present invention in which an LDD region is provided on the drain side of the EL driving TFT so as to overlap the gate electrode through a gate insulating film is very effective.

A single gate structure of the EL driving TFT 3503 is shown in the figures in embodiment 4, but a multi-gate structure in which a plurality of TFTs are connected in series may also be used. In addition, a structure in which a plurality of TFTs are connected in parallel, effectively partitioning into a plurality of channel forming regions, and which can perform radiation of heat with high efficiency, may also be used. This structure is effective to deal with the deterioration ascribable to heat.

Furthermore, a drain wiring 40 is connected to an electric power supply line (power line) 3506, and a constant voltage is always applied.

A first passivation film 41 is formed on the switching TFT 3502, the EL driving TFT 3503 and the erasing TFT 3504, and a leveling film 42 is formed on top of that from an insulating resin film. It is extremely important to level the step due to the TFTs using the leveling film 42. An EL layer formed later is extremely thin, so there are cases in which defective light emissions occur. Therefore, to form the EL layer with as level a surface as possible, it is preferable to perform leveling before forming a pixel electrode.

Furthermore, reference numeral 43 denotes a pixel electrode (EL element cathode) made from a conducting film with high reflectivity, and this is electrically connected to a drain region of the EL driving TFT 3503. It is preferable to use a low resistance conducting film, such as an aluminum alloy film, a copper alloy film, and a silver alloy film, or a laminate of such films. Of course, a lamination structure with another conducting film may also be used.

In addition, a light emitting layer 45 is formed in a groove (corresponding to a pixel) formed by banks 44a and 44b, which are formed by insulating films (preferably resins). Note that only one pixel is shown in the figures here, but the light emitting layer may be formed and divided to correspond to each of the colors R (red), G (green), and B (blue). A π conjugate polymer material is used as an organic EL material. Polyparaphenylene vinylenes (PPV), polyvinyl carbazoles (PVK), and polyfluoranes can be given as typical polymer materials.

Note that there are several types of PPV organic EL materials, and materials recorded in Schenk, H., Becker, O., Gelson, O., Kluge, E., Kreuder, W., and Spreitzer, H., "Polymers for Light Emitting Diodes", Euro Display Proceedings, 1999, pp. 33–37, and in Japanese Patent Application Laid-open No. Hei 10-92576, for example, may be used.

As specific light emitting layers, cyano-polyphenylene vinylene may be used as a red light radiating luminescence layer, polyphenylene vinylene may be used as a green light radiating luminescence layer, and polyphenylene vinylene or polyalkylphenylene may be used as a blue light radiating luminescence layer. The film thicknesses may be between 30 and 150 nm (preferably between 40 and 100 nm).

However, the above example is one example of the organic EL materials which can be used as luminescence layers, and it is not necessary to limit use to these materials. An EL layer (a layer for emitting light and for performing carrier motion for such) may be formed by freely combining light emitting layers, electric charge transporting layers, and electric charge injecting layers.

For example, this embodiment shows an example of using a polymer material as a light emitting layer, but a low molecular weight organic EL material may also be used. Further, it is possible to use inorganic materials such as silicon carbide, as an electric charge transporting layer or an electric charge injecting layer. Known materials can be used for these organic EL materials and inorganic materials.

A laminar structure EL layer, in which a hole injecting layer 46 made from PEDOT (polythiophene) or PAni (polyaniline) is formed on the luminescence layer 45, is used in this embodiment. An anode 47 is then formed on the hole injecting layer 46 from a transparent conducting film. The light generated by the light emitting layer 45 is radiated toward the upper surface (toward the top of the TFT) in this embodiment, and therefore the anode must be transparent to light. An indium oxide and tin oxide compound, or an indium oxide and zinc oxide compound can be used for the transparent conducting film. However, because it is formed after forming the low heat resistance light emitting and hole injecting layers, it is preferable to use a material which can be deposited at as low a temperature as possible.

An EL element 3505 is complete at the point where the anode 47 is formed. Note that what is called the EL element 3505 here is formed by the pixel electrode (cathode) 43, the light emitting layer 45, the hole injecting layer 46, and the anode 47. The pixel electrode 43 is nearly equal in area to the pixel, and consequently the entire pixel functions as an EL device. Therefore, the light emitting efficience is extremely high, and a bright image display becomes possible.

In addition, a second passivation film 48 is then formed on the anode 47 in this embodiment. It is preferable to use a silicon nitride film or an oxidized silicon nitride film as the second passivation film 48. The purpose of this is the isolation of the EL element from the outside, and this is meaningful in preventing degradation due to oxidation of the organic EL material, and in controlling gaseous emitted from the organic EL material. The reliability of the EL display can thus be raised.

The EL display of the present invention has a pixel portion made from pixels structured as in FIG. 8, and has a switching TFT with a sufficiently low off current value, and a EL driver control TFT which is strong with respect to hot carrier injection. An EL display panel having high reliability, and in which good image display is possible, can therefore be obtained.

Embodiment 5

A structure in which the structure of the EL element 3505 in the pixel portion shown in embodiment 4 is inverted is explained in this embodiment. FIG. 9 is used in the explanation. Note that the only points of difference between the structure of FIG. 9 and that of FIG. 8 is an EL element portion and an EL driving TFT, and therefore an explanation of other portions is omitted.

An EL driving TFT 3503 is a p-channel TFT in FIG. 9, and it can be manufactured using a known method.

A transparent conducting film is used as a pixel electrode (anode) 50 in this embodiment. Specifically, a conducting film made from a compound of indium oxide and zinc oxide is used. Of course, a conducting film made from a compound of indium oxide and tin oxide may also be used.

After then forming banks 51a and 51b from insulating films, a light emitting layer 52 is formed from polyvinyl carbazole by solution coating. An electron injecting layer 53 is formed on the light emitting layer from potassium acetylacetonate (denoted acacK), and a cathode 54 is formed from an aluminum alloy. In this case the cathode 54 also functions as a passivation film. An EL element 3701 is thus formed.

The light generated by the light emitting layer 52 is radiated toward the substrate on which the TFT is formed in this embodiment, as shown by the arrows.

Embodiment 6

Figure 10A:
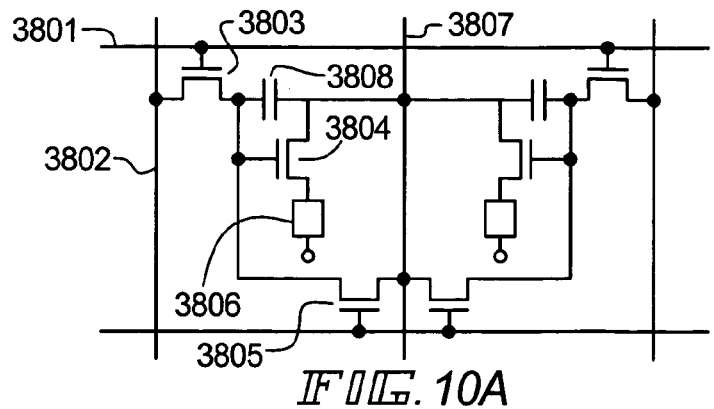
FIGS. 10A to 10C are diagrams showing a circuit configuration of a pixel portion of the EL display of the present invention.
Figure 10B:
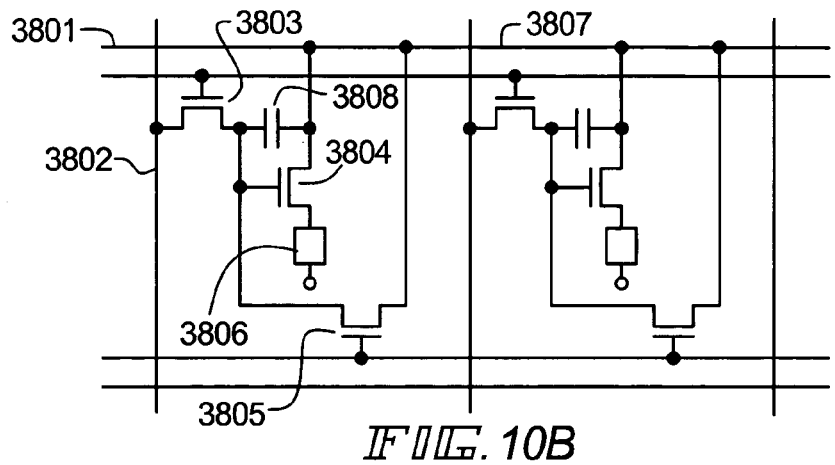
Figure 10C:
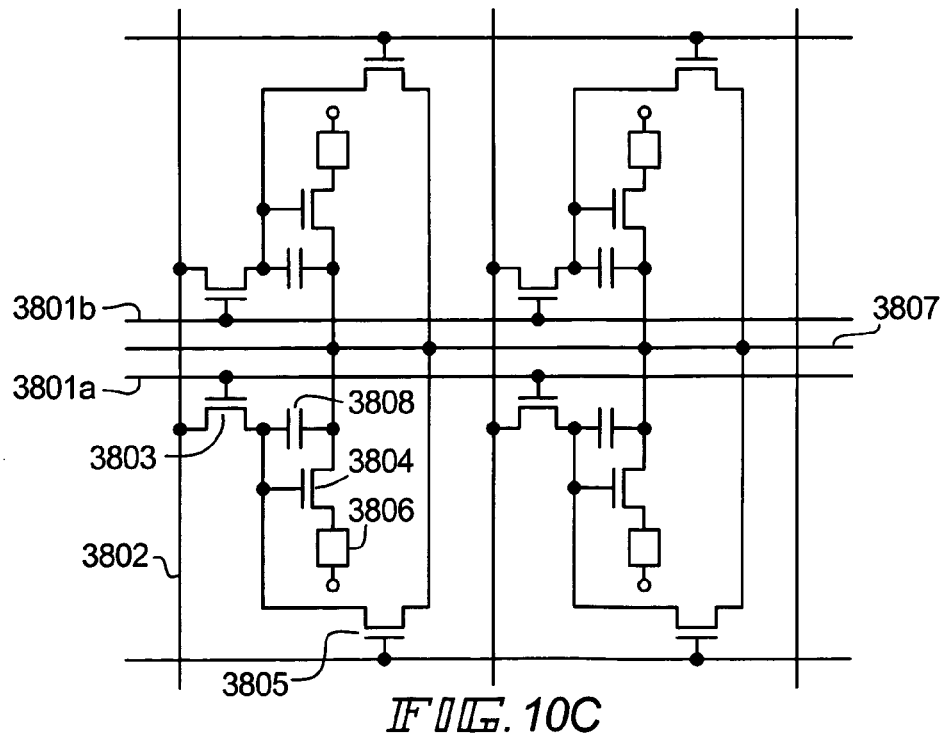

In this embodiment, an example of a case in which a pixel constitution shown in FIGS. 10A to 10C differs from that of the circuit diagram shown in FIG. 3. Note that in this embodiment, reference numeral 3801 denotes gate wiring (a part of gate signal line) of a switching TFT 3803, 3802 denotes a source wiring (a part of source signal line) of a switching TFT 3803, 3804 denotes an EL driving TFT, 3805 denotes an erasing TFT, 3806 denotes EL elements, 3807 denotes a current supply line and 3808 denoted a capacitor.

FIG. 10A is an example of a case in which the current supply line 3807 is common between two pixels. Namely, this is characterized in that the two pixels are formed having linear symmetry around the current supply line 3807. In this case, the number of the electric current supply line can be reduced, and therefore the pixel portion can be made with higher definition.

Further, FIG. 10B is an example of a case in which the current supply line 3807 is formed parallel to the gate wiring 3801. Note that in FIG. 10B, the structure is formed such that the electric current supply line 3807 and the gate wiring 3801 not to overlap through an insulating film. In such a case that both wirings are formed in different layer, they can be provided to overlap each other via an insulating film. In this case, the exclusive surface area can be shared by the electric current supply line 3807 and the gate wiring 3801, and the pixel portion can be made with higher definition.

Furthermore, FIG. 10C is characterized in that the current supply line 3807 and the gate wiring 3801 are formed in parallel, similar to the structure of FIG. 10B, and additionally, in that the two pixels are formed so as to have linear symmetry around the current supply line 3807. In addition, it is effective to form the current supply line 3807 so as to overlap with one of the gate wirings 3801. In this case, the number of electric current supply lines can be reduced, and therefore the pixel portion can be made with higher definition

Embodiment 7

In FIGS. 3 and 10, the capacitor is provided so as to hold a voltage applied to a gate electrode of the EL driving TFT. However, the capacitor can be omitted. Since the n-channel TFT is used as the EL driving TFT, the EL driving TFT has an LDD region provided so as to overlap a gate electrode via a gate insulating film. In this region, a parasitic capacitor called a gate capacitor is generally formed. This embodiment is characterized in that the parasitic capacitor is used positively so as to hold a voltage applied to a gate electrode of the EL driving TFT.

The capacitance of the parasitic capacitor is varied depending upon the area in which the above-mentioned gate electrode overlaps the LDD region. Therefore, the capacitance is determined by the length of the LDD region included in the region.

Embodiment 8

In this embodiment, a method of simultaneously manufacturing a pixel portion of an EL display of the present invention, and a TAT of a driver circuit portion which is provided around the pixel portion are described. Concerning the driver circuit, the CMOS circuit which is a basic unit of the driver circuit is shown in the figure, for a brief description. Further, concerning an erasing TAFT is omitted, because it can be formed by a manufacturing method of a switching TAFT or an EL driver TAFT.

Figure 11A:
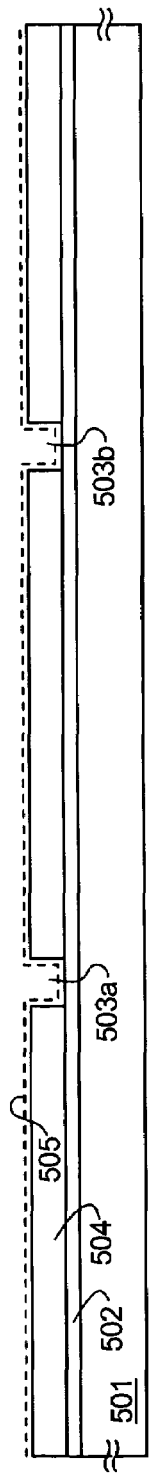
FIGS. 11A to 11E are diagrams showing a manufacturing process of the EL display of the present invention.

First, a substrate 501 in which a base film (not shown) is disposed on the surface thereof is prepared as shown in FIG. 11A. In this embodiment, a silicon nitride oxide film whose thickness is 200 nm and another silicon nitride oxide film whose thickness is 100 nm are laminated and are used as a base film on a crystallization glass. At this time, preferably, the concentration of nitrogen of the film contacting the crystallized glass substrate is kept to 10–25 wt %. It is possible to form an element directly on a quartz substrate without any base film.

Thereafter, an amorphous silicon film 502 whose thickness is 45 nm is formed on the substrate 501 by a well-known film formation method. There is no need to limit it to the amorphous silicon film. Instead, a semiconductor film (including a microcrystal semiconductor film) that has an amorphous structure can be used in this embodiment. A compound semiconductor film that has an amorphous structure, such as an amorphous silicon germanium film, also can be used herein.

Figure 11B:
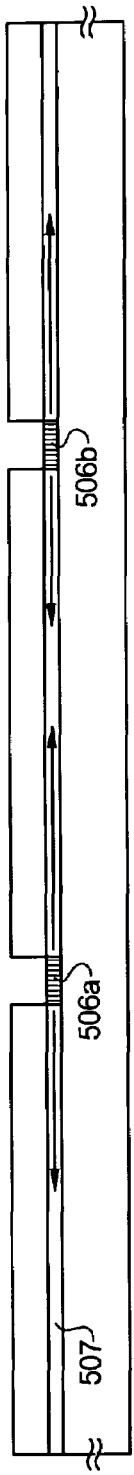
Figure 11C:

The steps from here to FIG. 11C can be understood from cite Japanese Laid-open Patent Publication No. Hei 10-247735 filed by the present applicant This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 (Ni containing layer) that contains nickel (Ni) is formed on the protective film 504 by a spin coat method. Concerning the formation of the Ni containing layer, reference can be made to the above publication.

Thereafter, as shown in FIG. 11B, heating processing at 570° C. for 14 hours is performed in an inert atmosphere, and the amorphous silicon film 502 is crystallized. At this time, crystallization progresses substantially in parallel with the substrate, starting from regions 506a and 506b (hereinafter, designated as Ni addition region) with which Ni is in contact. As a result, a polysilicon film 507 is formed that has a crystal structure in which bar crystals gather and form lines.

Thereafter, as shown in FIG. 11C, an element (phosphorus preferably) that belongs to 15-family is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 11C. Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2\times10^{17}$ atoms/cm$^3$ according to the measurement value by SIMS (mass secondary ion analysis). Although Ni is a lifetime killer for a semiconductor, no adverse influence is given to the TAFT characteristic when it is decreased to this extent. Additionally, since this concentration is the measurement limit of the SIMS analysis in the current state of the art, it will show an even lower concentration (less than $2\times10^{17}$ atoms/cm$^3$) in practice.

Figure 11D:

The polysilicon film 509 can be thus obtained that is crystallized by a catalyst and is decreased to the level in which the catalyst does not obstruct the operation of a TAFT. Thereafter, active layers 510–513 that use the polysilicon film 509 only are formed by a patterning process. At this time, a marker to conduct mask alignment in the following patterning should be formed by using the above polysilicon film. (FIG. 11D)

Figure 11E:

Thereafter, a silicon nitride oxide film 50 nm thick is formed by the plasma CVD method as shown in FIG. 11E, heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film, and a polysilicon film whose thickness is about 15 nm is oxidized, so that a silicon oxide film whose thickness is about 30 nm is formed. That is, a gate insulating film 514 of a thickness of 80 nm is formed in which the silicon oxide film 30 nm thick and the silicon nitride oxide film 50 nm thick are laminated. The film thickness of the active layers 510–513 is made 30 nm by the thermal oxidation process.

Figure 12A:
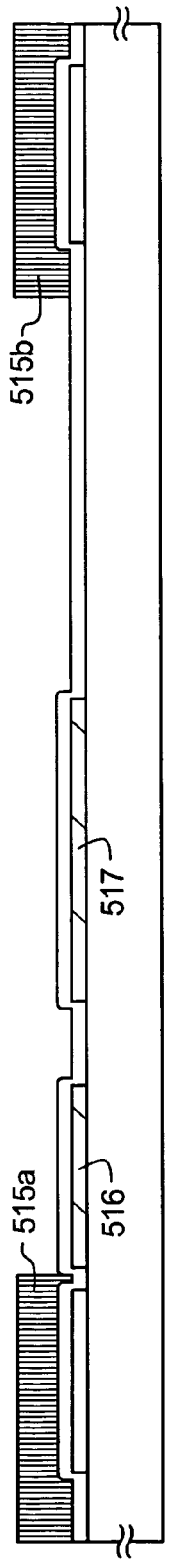
FIGS. 12A to 12D are diagrams showing a manufacturing process of the EL display of the present invention.

Thereafter, as shown in FIG. 12A, resist masks 515a and 515b are formed, and an impurity element (hereinafter, designated as p-type impurity element) that gives the p-type through the gate insulating film 514 is added. As the p-type impurity element, an element that belongs to 13-group elements representatively, boron or gallium typically, can be used. This (called a channel doping process) is a process for controlling the threshold voltage of a TAFT.

In this embodiment, boron is added by the ion doping method in which plasma excitation is performed without the mass separation of diborane ($B_2H_6$). The ion implantation method that performs the mass separation can be used, of course. According to this process, impurity regions 516 and 517 are formed that includes boron at the concentration of $1\times10^{15}$–$1\times10^{18}$ atoms/cm$^3$ ($5\times10^{16}$–$5\times10^{17}$ atoms/cm$^3$ representatively).

Figure 12B:
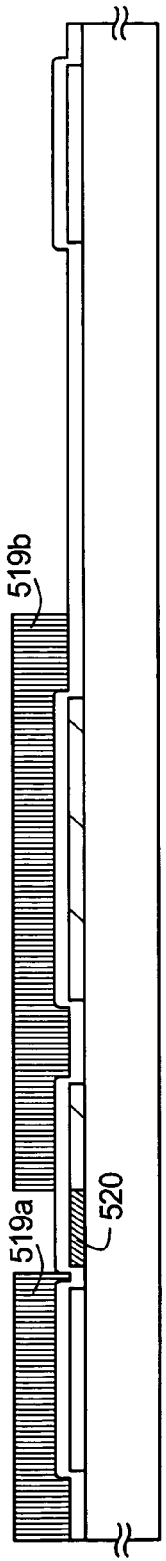

Thereafter, resist masks 519a and 519b are formed as shown in FIG. 12B, and an impurity element (hereinafter, designated as n-type impurity element) that gives the n-type through the medium of the gate insulating film 514 is added. As the n-type impurity element, an element that belongs to 15-group elements representatively, phosphorus or arsenic typically can be used. In this embodiment, a plasma doping method in which plasma excitation is performed without the mass separation of phosphine ($PH_3$) is used. Phosphorus is added in the concentration of $1\times10^{18}$ atoms/cm$^3$. The ion implantation method that performs mass separation can be used, of course.

A dose amount is adjusted so that the n-type impurity element is included in the n-type impurity regions 520 formed by this process at the concentration of $2\times10^{16}$–$5\times10^{19}$ atoms/cm$^3$ ($5\times10^{17}$–$5\times10^{18}$ atoms/cm$^3$ representatively).

Figure 12C:
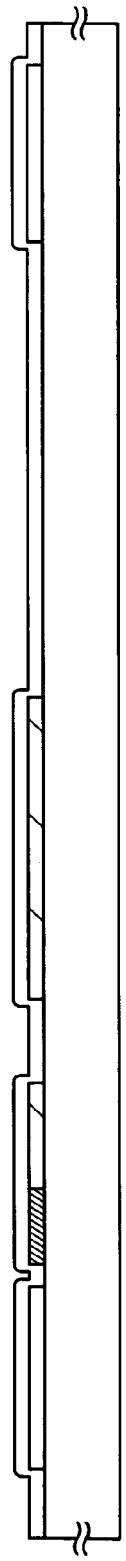
Figure 12D:
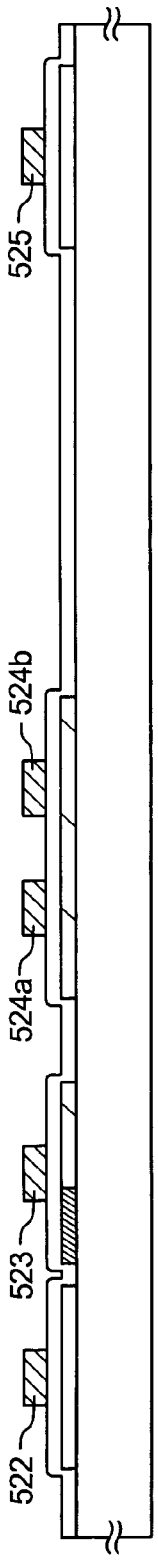

Thereafter, a process is performed for activating the added n-type impurity element and the added p-type impurity element as shown in FIG. 12C. There is no need to limit the activation means, but, since the gate insulating film 514 is disposed, the furnace annealing process that uses an electrothermal furnace is desirable. Additionally, it is preferable to perform heat processing at a temperature as high as possible because there is a possibility of having damaged the interface between the active layer and the gate insulating film of a part that is a channel formation region in the process of FIG. 12A.

Since the crystallization glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere.

This process clarifies the edge of the n-type impurity regions 520 namely, the boundary (junction) between the n-type impurity regions 520 and the region (p-type impurity region formed by the process of FIG. 12A) around the n-type impurity regions 520 where the n-type impurity element is not added. This means that the LDD region and the channel formation region can form an excellent junction when a TAFT is later completed.

Thereafter, a conductive film 200–400 nm thick is formed, and patterning is performed, so that gate electrodes 522–525 are formed. The length of each TAFT channel is decided by the line width of those gate electrodes 522–525.

The gate electrode can be made of a conductive film of a single-layer, however, preferably, a lamination film, such as two-layer or three-layer film is used when necessary. A known conductive film can be used as the material of the gate electrode. Specifically, the film which can be used are films made of an element selected from the group consisting of tantalum (Ta), titanium (Ti), molybdenum (Mo), tungsten (W), chrome (Cr), and silicon (Si) having conductivity; a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a sputtering gas, the film can be prevented from peeling off because of stress.

At this time, the gate electrodes 523 are formed to overlap with part of the n-type impurity regions 520 respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other.

Figure 13A:
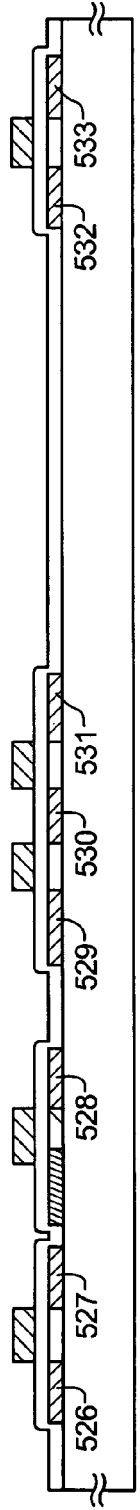
FIGS. 13A to 13D are diagrams showing a manufacturing process of the EL display of the present invention.

Thereafter, with the gate electrodes 522–525 as masks, an n-type impurity element (phosphorus in this embodiment) is added self-adjustably, as shown in FIG. 13A. At this time, an adjustment is performed so that phosphorus is added to the thus formed impurity regions 526–533 at the concentration of ½–1/10 (⅓–¼ representatively) of that of the n-type impurity regions 520. Practically, the concentration is $1 \times 10^{16} – 5 \times 10^{18}$ atoms/cm$^3$ ($3 \times 10^{17} – 3 \times 10^{18}$ atoms/cm$^3$ typically).

Figure 13B:
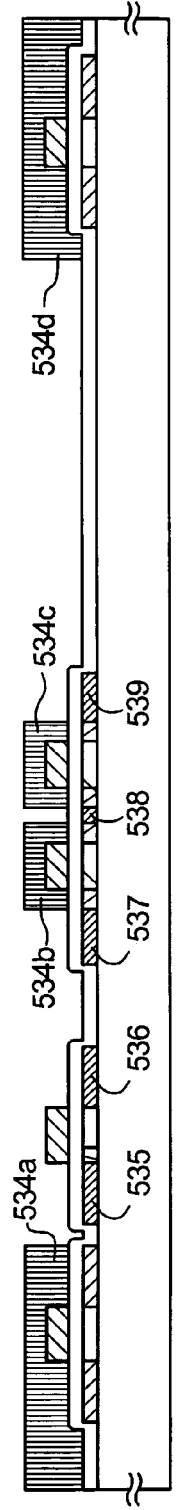

Thereafter, as shown in FIG. 13B, resist masks 534a–534d are formed to cover the gate electrode, an n-type impurity element (phosphorus in this embodiment) is then added, and impurity regions 535–539 including a high concentration of phosphorus are formed. The ion doping method using phosphine (PH$^3$) is applied also herein, and an adjustment is performed so that the concentration of phosphorus in these regions is $1 \times 10^{20} – 1 \times 10^{21}$ atoms/cm$^3$ ($2 \times 10^{20} – 5 \times 10^{21}$ atoms/cm$^3$ representatively).

A source region or a drain region of the n-channel type TAFT is formed through this process, and the switching TAFT leaves a part of the n-type impurity regions 528–531 formed in the process of FIG. 13A. The leaving part comes to an LDD region of the switching TAFT.

Figure 13C:
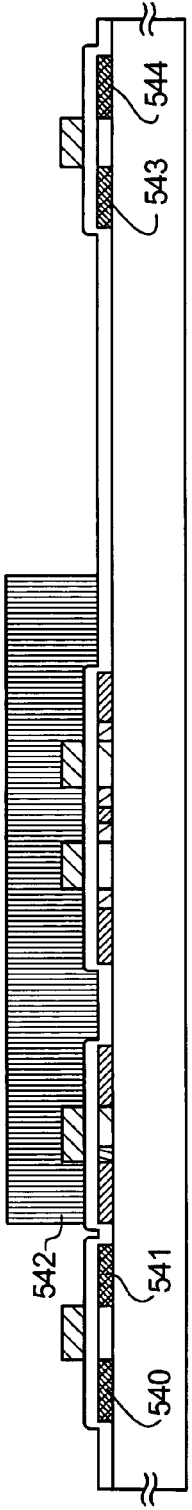

Thereafter, as shown in FIG. 13C, the resist masks 534a–534d are removed, and a resist mask 542 is newly formed. A p-type impurity element (boron in this embodiment) is then added, and impurity regions 540, 541, 543 and 544 including a high concentration of boron are formed. Herein, according to the ion dope method using diborane ($B_2H_6$), boron is added to obtain a concentration of $3 \times 10^{20} – 3 \times 10^{21}$ atoms/cm$^3$ ($5 \times 10^{20} – 1 \times 10^{21}$ atoms/cm$^3$ representatively).

Phosphorus has been already added to the impurity regions 540, 541, 543 and 544 at a concentration of $1 \times 10^{20} – 1 \times 10^{21}$ atoms/cm$^3$. Boron added herein has at least three times as high concentration as the added phosphorus. Therefore, the impurity region of the n-type formed beforehand is completely changed into that of the p-type, and functions as an impurity region of the p-type.

Figure 13D:
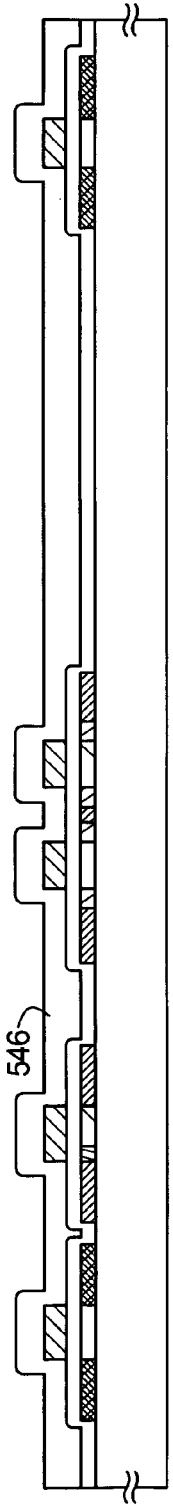

Thereafter, as shown in FIG. 13D, the resist mask 542 is removed, and then a first interlayer insulating film 546 is formed. As the first interlayer insulating film 546, an insulating film that includes silicon is used in the form of a single-layer structure or a stacked-layer structure as a combination thereof. Preferably, the film thickness thereof is 400 nm–1.5 m. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electro-thermal furnace.

Heat treatment is further performed at 300–450° C. for 1–12 hours in an atmosphere that includes hydrogen of 3–100% for hydrogenation. This is a process to hydrogen-terminate unpaired bonds of a semiconductor film by thermally excited hydrogen. As another means for hydrogenation, plasma hydrogenation (hydrogen excited by plasma is used) can be performed.

Hydrogenation can be performed during the formation of the first interlayer insulating film 546. In more detail, the 200 nm-thick silicon nitride oxide film is formed, and hydrogenation is performed as mentioned above, and thereafter the remaining 800 nm-thick silicon oxide film can be formed.

Figure 14A:
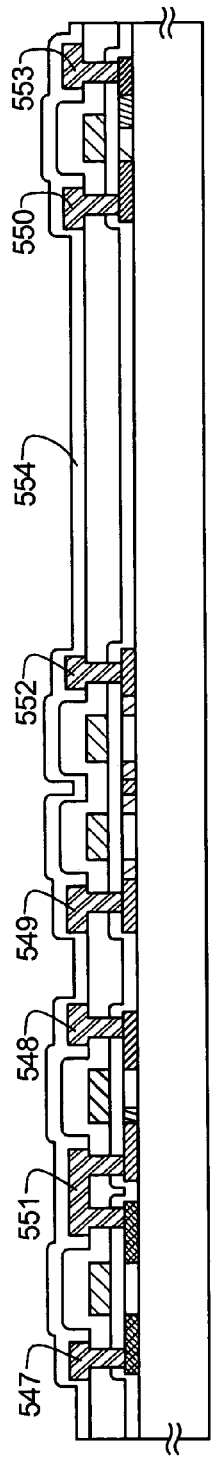
FIGS. 14A to 14C are diagrams showing a manufacturing process of the EL display of the present invention.

Thereafter, as shown in FIG. 14A, contact holes are made in the first interlayer insulating film 546 and the gate insulating film 514, and source wirings 547–550 and drain wiring lines 551–553 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 554 is formed to be 50–500 nm thick (200–300 nm thick representatively). In this embodiment, a 300 nm-thick silicon nitride oxide film is used as the first passivation film 554. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this process is supplied to the first interlayer insulating film 546, and, through heat treatment, the film quality of the first passivation film 554 is improved. At the same time, since hydrogen that is added to the first interlayer insulating film 546 diffuses onto the lower side, the active layer can be effectively hydrogenated.

Figure 14B:
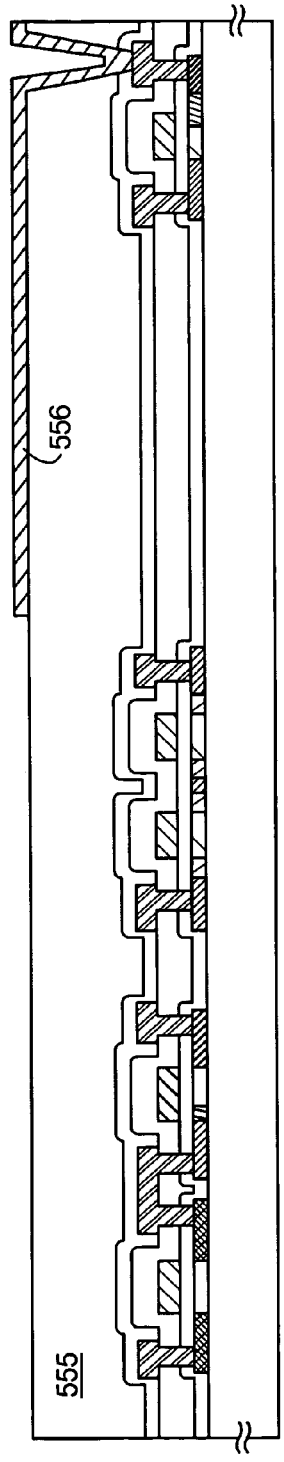

Thereafter, as shown in FIG. 14B, a second interlayer insulating film 555 made of organic resin is formed. Polyimide, acrylic fiber, or BCB (benzocyclobutene) can be used as the organic resin. Especially, since the second interlayer insulating film 555 is required to flatten the level differences formed by TFTs, an acrylic film excellent in smoothness is desirable. An acrylic film is formed to be 2.5 m thick in this embodiment.

Thereafter, contact holes that reach the drain wiring line 553 are made in the second interlayer insulating film 555 and the first passivation film 554, and then a pixel electrode (anode) 556 is formed. In this embodiment, the indium tin oxide film (ITO) is formed as a pixel electrode by forming to be 110 nm thick and patterned. A transparent conductive film can be used in which zinc oxide (ZnO) of 2–20% is mixed with indium tin oxide film also can be used. This pixel electrode is an anode of an EL element 203.

Thereafter, an insulating film (a silicon oxide film in this embodiment) that includes silicon is formed to be 500 nm thick, an opening is then formed at the position corresponding to the pixel electrode 556, and a third interlayer insulating film 557 is formed. It is possible to easily form a tapered sidewall by using the wet etching method when the opening is formed. If the sidewall of the opening does not have a sufficiently gentle slope, deterioration of the EL layer caused by level differences will lead to an important problem.

Next, the EL layer 558 and the cathode (MgAg electrode) 559 are formed using the vacuum deposition method without air release. The thickness of the EL layer 558 is 80–200 nm (100–120 nm typically); the cathode 559 thereof is 180–300 nm (200–250 nm typically).

In this process, an EL layer and cathode are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to mask pixels except a desired one by the use of the metal mask, and selectively form an EL layer for the desired pixel.

In detail, a mask is first set for concealing all pixels except a pixel corresponding to red, and an EL layer and a pixel electrode of red luminescence are selectively formed by the mask. Thereafter, a mask is set for concealing all pixels except a pixel corresponding to green, and an EL layer and pixel electrode of green luminescence are selectively formed by the mask. Thereafter, as above, a mask is set for concealing all pixels except a pixel corresponding to blue, and an EL layer and a pixel electrode of blue luminescence are selectively formed by the mask. In this case, the different masks are used for the respective colors. Instead, the same mask may be used for them. Preferably, processing is performed without breaking the vacuum until the EL layer and the pixel electrode are formed for all the pixels.

A known material can be used for the EL layer 558. Preferably, that is an organic material in consideration of driving voltage. For example, the EL layer can be formed with a four-layer structure consisting of a positive hole injection layer, a positive hole transporting layer, a luminescent layer, and an electronic injection layer. In this embodiment, an example of using MgAg electrode as a cathode of an EL element 203, although other well-known material also can be used.

As a protective electrode 560, the conductive layer, which contains aluminum as a main component, can be used. The protective electrode 560 is formed using a vacuum deposition method with another mask when forming the EL layer and the cathode. Further, the protective electrode is formed continually without air release after forming the EL layer and the cathode.

Lastly, a second passivation film 561 made of a silicon nitride film is formed to be 300 nm thick. Practically, a protective electrode 560 fills the role of protecting the protect EL layer from water. Furthermore, the reliability of an EL element 203 can be improved by forming the second passivation film 561.

Figure 14C:
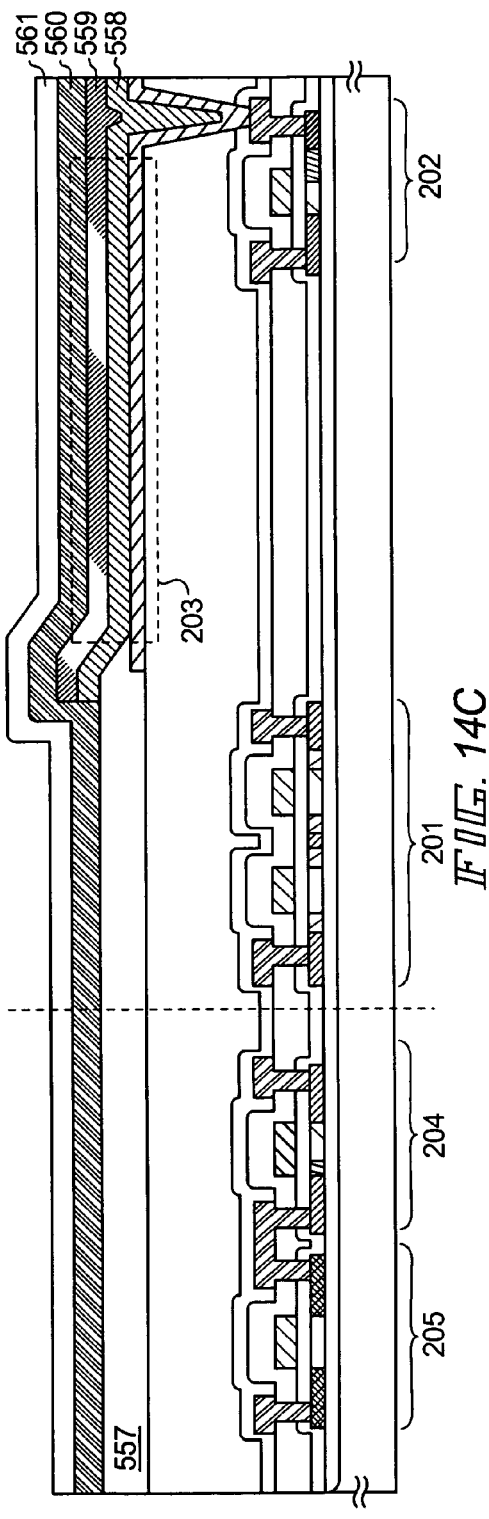

An active matrix type EL display device constructed as shown in FIG. 14C is completed. The device is composed of a switching TAFT 201, an EL driving TAFT 202, a driving circuit n-channel type TAFT 204 and driving circuit p-channel type TAFT 205.

In practice, preferably, the device is packaged (sealed) by a highly airtight protective film (laminate film, ultraviolet cured resin film, etc.) or a housing material such as a ceramic sealing, in order not to be exposed to the air after completing the structure as shown in FIG. 14C.

Embodiment 9

Figure 15:
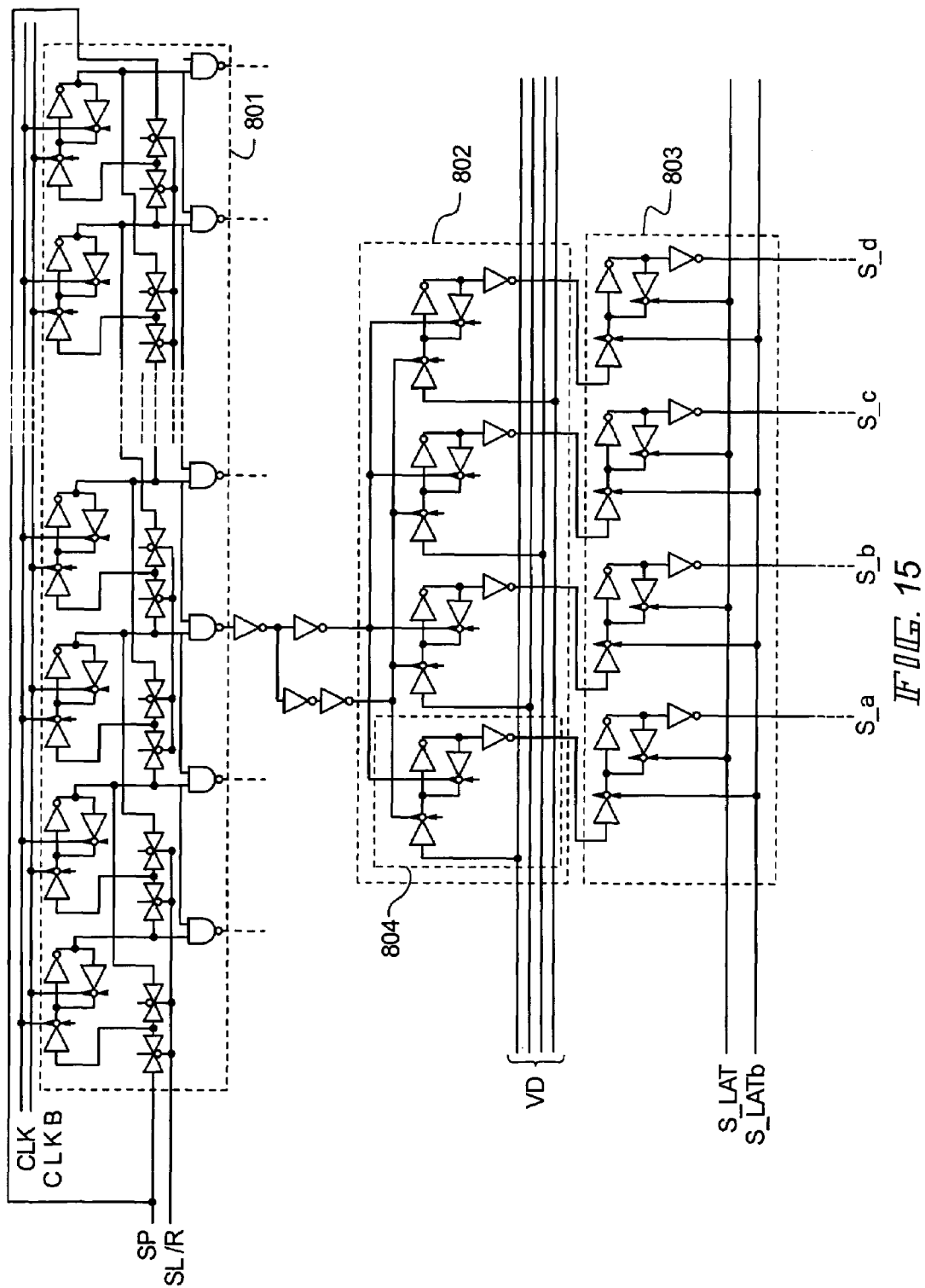
FIG. 15 is a diagram illustrating a circuit configuration of a source signal line driver circuit employed in the present invention.

A detailed structure of the source signal side driver circuit 102 shown by FIG. 1 is explained in this embodiment. A circuit diagram of an example of a source signal side driver circuit used in the present invention is shown in FIG. 15.

Shift registers 801, latches (A) 802, and latches (B) 803 are arranged as shown in figure. Note that one group of the latches (A) 802 and the latches (B) 803 corresponds to four source signal lines S_a to S_d in this embodiment Further, a level shifter for changing the width of the amplitude of the signal voltage is not formed in this embodiment, but it may also be suitably formed by a designer.

A clock signal CLK, a clock signal CLKb in which the polarity of CLK is inverted, a start pulse SP, and a driver direction changeover signal SL/R are each input to the shift registers 801 by wirings shown in figure. Further, a digital data signal VD input from the outside is input to the latches (A) 802 by wirings shown in figure. A latch signal S_LAT and a signal S_LATb, in which the polarity of S_LAT is inverted, are input to the latches (B) 803 by wirings shown in figure.

Regarding a detailed structure of the latches (A) 802, an example of 804 the portion of the latches (A) 802 which store the digital data signal corresponding to the source signal line S_a is explained. The 804, the portion of the latches (A) 802 has two clocked inverters and two inverters.

Figure 16:
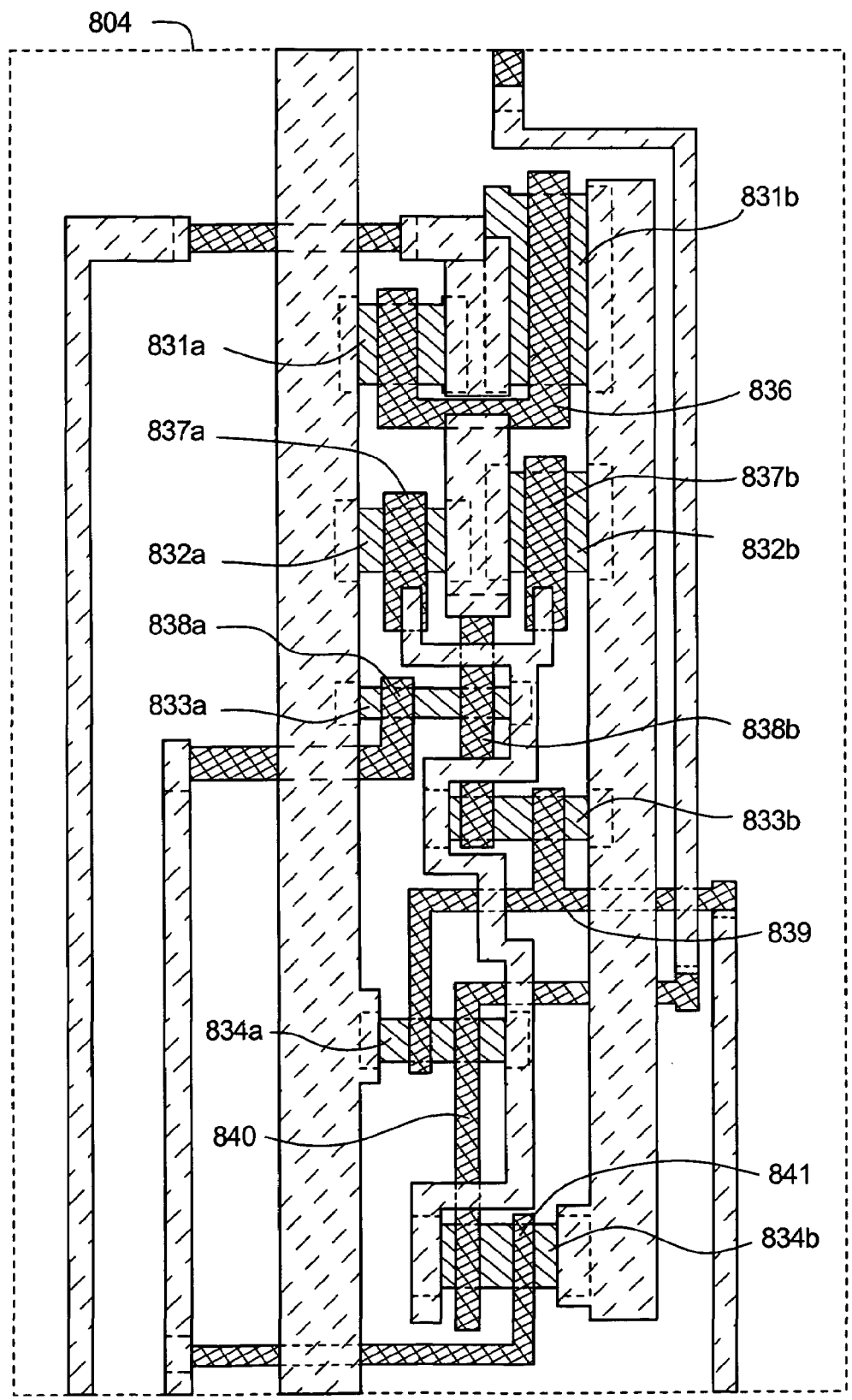
FIG. 16 is a top view of a latch circuit employed in the present invention.

A top view of the portion 804 of the latches (A) 802 is shown in FIG. 16. Reference numerals 831a and 831b each denotes an active layer of a TAFT forming one inverter of 804, the portion of the latches (A) 802, and reference numeral 836 denotes a common gate electrode of the TAFT forming one inverter. Further, reference numerals 832a and 832b each denotes an active layer of another TAFT forming one inverter of 804, the portion the latches (A) 802, and references numerals 837a and 837b denote gate electrodes formed on the active layers 832a and 832b, respectively. Note that the gate electrodes 837a and 837b are electrically connected.

Reference numerals 833a and 833b each denotes an active layer of a TAFT forming one clock inverter of 804, the portion of the latches (A)802. Gate electrodes 838a and 838b are formed on the active layer 833a, becoming a double gate structure. Further, gate electrodes 838b and 839 are formed on the active layer 833b, becoming a double gate structure.

Reference numerals 834a and 834b each denotes an active layer of a TAFT forming another clocked inverter of 804, the portion of the latches (A) 802. Gate electrodes 839 and 840 are formed on the active layer 834a, becoming a double gate structure. Further, gate electrodes 840 and 841 are formed on the active layer 834b, becoming a double gate structure.

Embodiment 10

The material used in the EL layer of the EL element in the EL display of the present invention is not limited to an organic EL material, and the present invention can be implemented using an inorganic EL material. However, at present inorganic EL materials have an extremely high driver voltage, and therefore TFTs which have voltage resistance characteristics such that they are able to withstand such a high voltage must be used.

Alternately, if an inorganic EL material having a lower driver voltage is developed in the future, it is possible to apply such a material to the present invention.

Furthermore, it is possible to freely combine the constitution of this embodiment with the constitution of any of Embodiments 1 to 9.

Embodiment 11

In the present invention, an organic material used as an EL layer may be either a low molecular organic material or a polymer (high molecular) organic material. As the low molecular organic material, materials are known centering on $Alq_3$ (tris-8-quinolylite-aluminum), TPD (triphenylamine derivative) or the like. As polymer organic material, -cooperative polymer materials can be given. Typically, PPV (polyphenylenevynilene), PVK(polyvynilcarbazole), polycarbonate or the like can be given.

The polymer (high molecular) organic material can be formed with a simple thin film formation method such as the spin coating method (which is referred to also as solution application method), the dipping method, the dispense method, the printing method, the ink jet method or the like. The polymer organic material has a high heat endurance compared with the low molecular organic material.

Furthermore, in the case where the EL layer incorporated in the EL element incorporated in the EL display according to the present invention has an electron transport layer and a positive hole transport layer, the electron transport layer and the positive hole transport layer may be formed of inorganic material such as, for example, a non-crystal semiconductor formed of non-crystal Si or non-crystal $Si_{1-x}C_x$ or the like.

In the non-crystal semiconductor, a large quantity of trap level is present, and at the same time, the non-crystal semiconductor forms a large quantity of interface levels at an interface at which the non-crystal semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, lubren, coumarin 6, TPB and quinaquelidon.

Embodiment 12

Figure 21A:
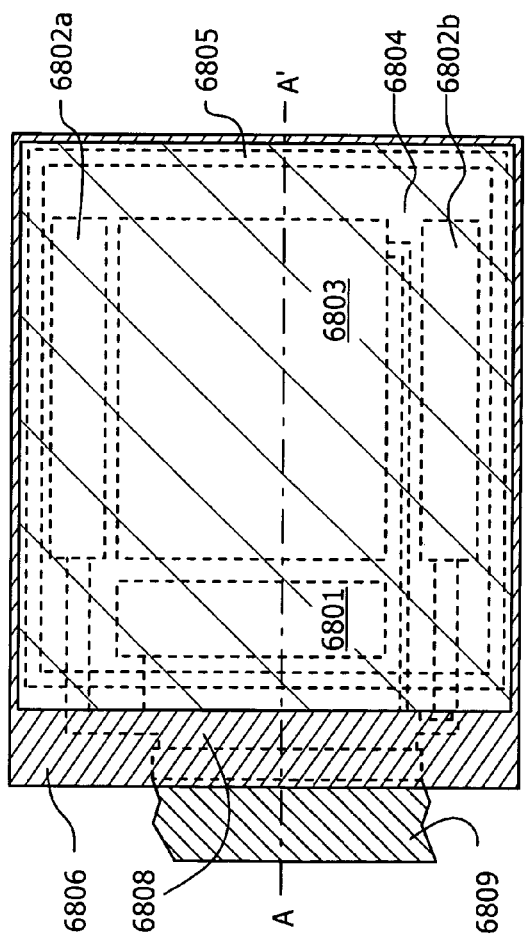
FIGS. 21A and 21B are a top view and a cross-sectional view, respectively, of the EL display of the present invention.

The EL display of the present invention will be explained in Embodiment 12 with reference to FIGS. 21A and 21B. FIG. 21A is a top view showing the state of the device in which sealing of the EL element formed on the TFT substrate is completed. Indicated by dotted lines, reference numeral 6801 denotes a source signal line driver circuit, 6802a denotes a writing-in gate signal line driver circuit, 6802b denotes an eliminating gate signal line driver circuit, and 6803 denotes a pixel portion. Further, reference numeral 6804 denotes a covering member, 6805 denotes a first sealing member, and 6806 denotes a second sealing member. A filler 6807 (refer to FIG. 21B) is filled in a space, which is formed inside the sealed substrate, surrounded by the first sealing member 6805 and between the covering member and the TFT substrate.

Denoted by reference numeral 6808 is a connecting wiring for transmitting a signal to be inputted to the source signal line driver circuit 6801, the writing-in gate signal line driver circuit 6802a, the eliminating gate signal line driver circuit 6802b, and the pixel portion 6803. The connecting wiring 6808 receives a video signal and a clock signal from an FPC (Flexible Print Circuit) 6809 serving as a connecting terminal to an external equipment.

Figure 21B:
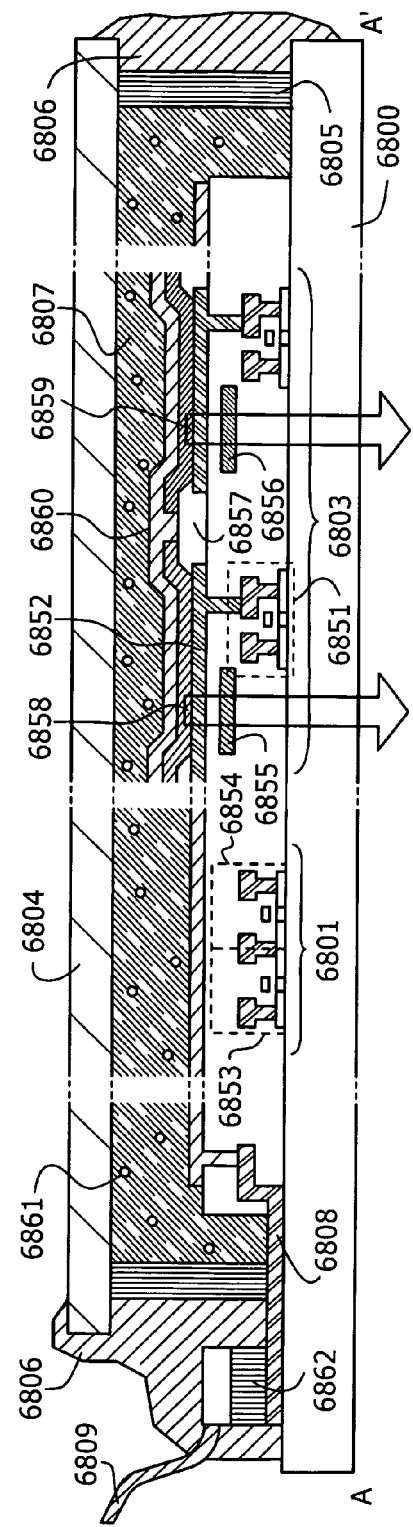

Shown in FIG. 21B is a sectional view corresponding to the cross-section taken along the line A–A' of FIG. 21A. In FIGS. 21A and 21B, the same reference numerals are used to denote the same components.

As shown in FIG. 21B, the pixel portion 6803 and the source signal line driver circuit 6801 are formed on a substrate 6800. The pixel portion 6803 is composed of a plurality of pixels each including a TFT 6851 for controlling a current flowing to an EL element (hereinafter referred to as an EL driving TFT) and a pixel electrode 6852 that is electrically connected to the drain of the TFT 6851. In Embodiment 12, the EL driving TFT 6851 is formed of the P channel TFT. Furthermore, the source signal line driver circuit 6801 is formed using a CMOS circuit in which an N channel TFT 6853 and a P channel TFT 6854 are combined complementarily.

Each of the pixels has a color filter (R) 6855, a color filter (G) 6856, and a color filter (B) (not shown) under the pixel electrode. The color filter (R) is a color filter for extracting red light, the color filter (G) is a color filter for extracting green light, and the color filter (B) is a color filter for extracting blue light. It is to be noted that the color filter (R) 6855, the color filter (G) 6856, and the color filter (B) are provided in a red luminescing pixel, a green luminescing pixel, and a blue luminescing pixel, respectively.

First, improving the color purity of the color of the light emitted can be cited as an effect in the case of providing these color filters. For example, a red light is irradiated from an EL element that is from the red luminescing pixel (light is irradiated in a direction toward the pixel electrode side in Embodiment 12). The color purity of this red light can be improved by allowing this red light to pass through the color filter for extracting red light. This improvement in color purity by means of a color filter can be similarly applied to the other green and blue lights.

In a conventional structure without the provision of the color filters, visible radiation penetrating from the exterior of the EL display excites the light-emitting layer of the EL element, and therefore a problem occurs in which a desired color cannot be obtained. However, by providing color filters as in Embodiment 12, only light of a specific wavelength enters the EL element. In other words, the drawback of an external light exciting the EL element may be prevented.

Note that proposals to provide color filters in the structure have been made since the past but an EL element luminescing white was the EL element used in the structure. The light of another wavelength was cut in order to extract the red light in this case, resulting in inviting a reduction in luminance. Nevertheless, for example, because the red light emitted from the EL element is caused to pass through the color filter for extracting red light in Embodiment 12, there is no reduction in luminance.

Next, the pixel electrode 6852 is formed of a transparent conductive film and functions as the anode of the EL element. An insulating film 6857 is formed on each end of the pixel electrode 6852 to thereby further form a light-emitting layer 6858 emitting red light and a light-emitting layer 6859 emitting green light. It is to be noted that a light-emitting layer emitting blue light not shown in the drawing is provided in an adjacent pixel. Color display is thus performed by the pixels that correspond to the colors red, green, and blue. The color filter for extracting the blue color is of course provided in the pixel in which the light-emitting layer emitting blue light is formed.

Note that not only an organic material but also an inorganic material can be used as the material of the light-emitting layers 6858 and 6859. Also note that, though the structure shown here is composed of only the light-emitting layer, it may be a laminate structure in which the light-emitting layer is combined with an electron injection layer, an electron transportation layer, a hole transportation layer, or a hole injection layer.

A cathode 6860 of the EL element that is made of a conductive film having light blocking characteristics is formed on top of the respective light-emitting layers. The cathode 6860 functions as a common wiring shared by all the pixels, and is electrically connected to the FPC 6809 via the connecting wiring 6808.

Next, the first sealing member 6805 is formed using a dispenser or the like, and a spacer (not shown) is sprayed to bond the first sealing member to the covering member 6804. The filler 6807 is then filled into the space surrounded by the TFT substrate, the covering member 6804, and the first sealing member 6805 by vacuum injection.

In Embodiment 12, barium oxide as a moisture absorbent material 6861 is added into the filler 6807 in advance. Note that though the moisture absorbent material is added into the filler used in Embodiment 12, it can be massively dispersed and sealed within the filler. In addition, it is also possible to use a moisture absorbent material as the material of a spacer not shown in the drawing.

After curing the filler 6807 with ultraviolet irradiation or heat, an opening portion (not shown) formed in the first sealing member 6805 is sealed up. Upon sealing up the opening portion of the first sealing member 6805, the connecting wiring 6808 and the FPC 6809 are electrically connected by using a conductive material 6862. Then, the second sealing member 6806 is disposed so as to cover the sides (exposed faces) of the first sealing member 6805 and a portion of the FPC 6809. The second sealing member 6806 may be formed from the same material as the first sealing member 6805.

By sealing the EL element within the filler 6807 using the method as described above, the EL element is completely cut off from external environment and invasion from the outside by substances that accelerate the oxidation degradation of the organic material, such as moisture and oxygen, can thus be prevented. Accordingly, an EL display device of high reliability can be manufactured.

Because the production line of existing liquid crystal display devices can be redirected by employing the present invention, a sharp reduction in the cost of maintenance investment is possible. A plurality of light-emitting devices can be fabricated from one piece of substrate through a process of high yield, resulting in making a substantial cutback in manufacturing cost.

Embodiment 13

Shown in Embodiment 13 is an example of a case in which the emission direction of the light emitted from the EL element and the arrangement of the color filters in the EL display shown in Embodiment 12 are different. Though the explanation thereof will be made with reference to FIG. 22, the basic structure is the same as that of FIG. 21B and therefore common reference numerals are used but only the modified components are denoted by new reference numerals and explained.

In Embodiment 13, the N channel TFT is used as an EL driver circuit 6902 in a pixel portion 6901. A pixel electrode 6903 that is formed of a conductive film having a light blocking characteristic is electrically connected to a drain of the EL driver circuit 6902. The pixel electrode 6903 serves as the cathode of the EL element in Embodiment 13.

A transparent conductive film 6904 is formed on the light-emitting layer 6858 emitting red light and the light-emitting layer 6859 emitting green light, which are formed by using the present invention. The transparent conductive film 6904 serves as the anode of the EL element.

In addition, a characteristic of Embodiment 13 is that a color filter (R) 6905, a color filter (G) 6906, and a color filter (B) (not shown) are formed on the covering member 6804. In the case of adopting the structure of the EL element of Embodiment 13, the light emitted from the light-emitting layer is in the direction towards the covering member side.

Figure 22:
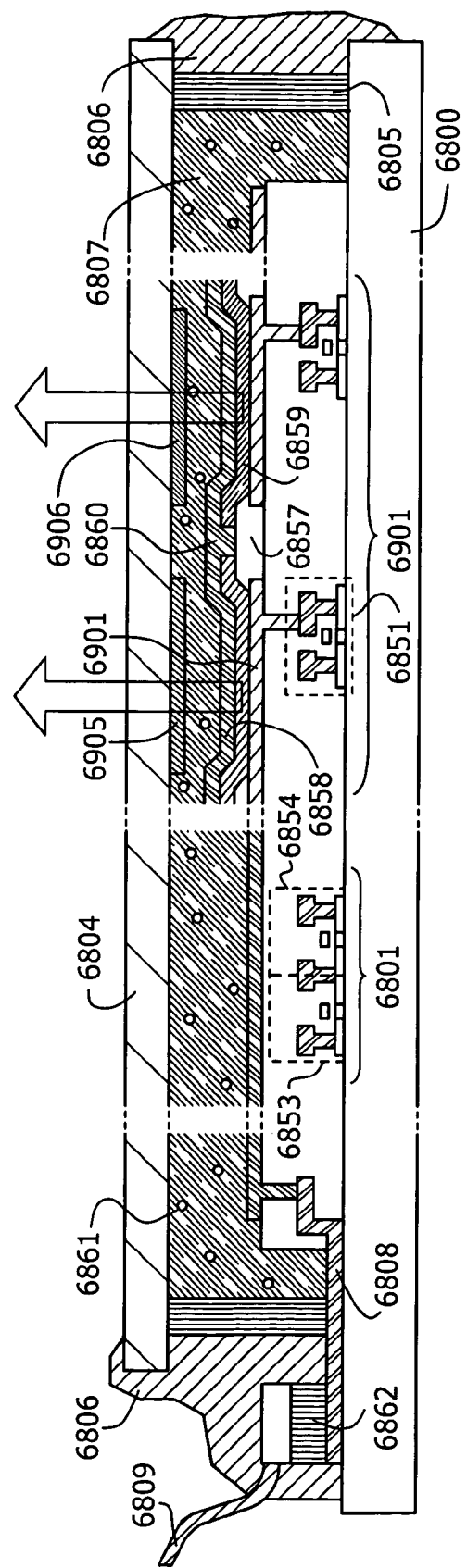
FIG. 22 is a cross-sectional view of the EL display of the present invention.

Therefore, by adopting the structure of FIG. 22, the color filters can be installed in the places of the paths of the light.

The manufacturing steps of the TFT substrate can be lessened by providing the color filter (R) 6905, the color filter (G) 6906, and the color filter (B) (not shown) on the covering member 6804 as in Embodiment 13. Consequently, merits such as improvement in yield and throughput can be attained.

Embodiment 14

The electronic display device, especially the EL display device formed by performing the present invention can be used as a many kinds of electrical equipments. The electronic equipment that includes electronic displays of the present invention as constituent parts is described hereinafter.

As the electronic equipment, video camera, digital camera, head mounted type display (goggle type display), game machine, car-navigator, personal computer, portable information terminal (mobile computer, mobile phone, electronic book, etc.). Examples of the electronic equipment are shown in FIG. 17.

Figure 17A:
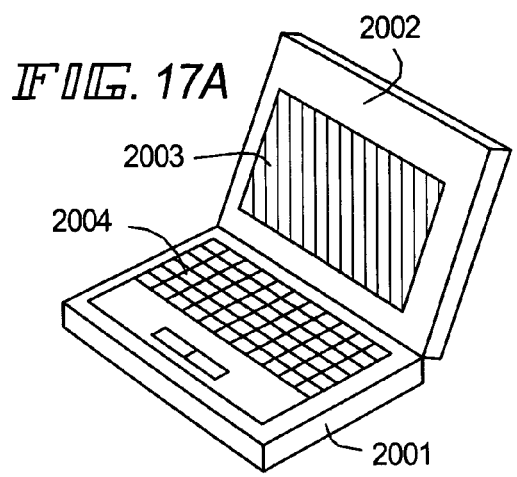
FIGS. 17A to 17E are electronic equipments incorporating the EL display of the present invention.

FIG. 17A depicts a personal computer, which includes a main body 2001, case 2002, display portion 2003, and keyboard 2004. The EL display of the present invention can be used for the display portion 2003 of personal computer.

Figure 17B:
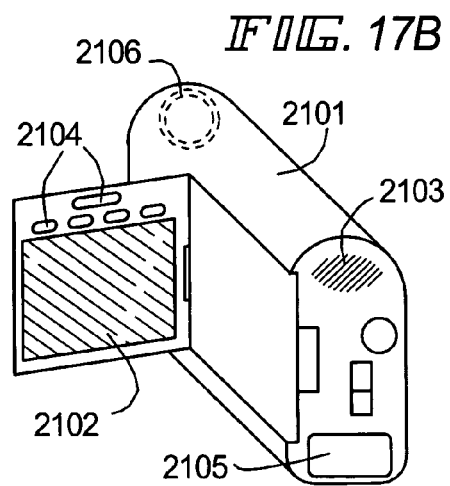

FIG. 17B depicts a video camera, which includes a main body 2101, display portion 2102, voice inputting portion 2103, operation switch 2104, battery 2105, and image reception portion 2106. The present invention can be used as the display device 2102.

Figure 17C:
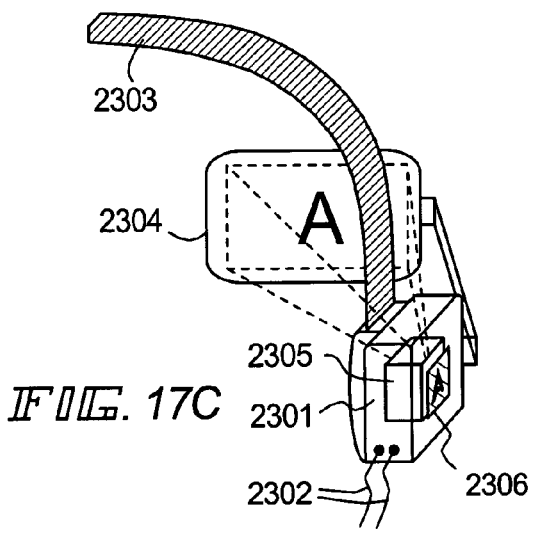

FIG. 17C depicts a part of a head mounted type EL display (right side), which includes a main body 2301, signal cable 2302, head fixation band 2303, display monitor 2304, optical system 2305, and display device 2306. The EL display 2306 of the present invention can be used as a display potion of EL display device.

Figure 17D:
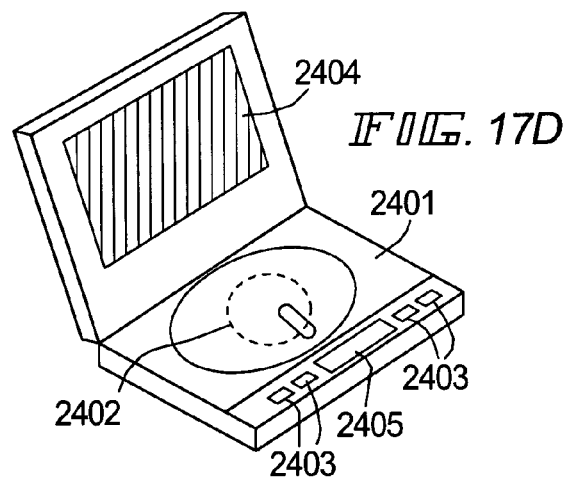

FIG. 17D depicts a picture reproducer (specifically, DVD reproducing player) provided with recording media, which includes a main body 2401, recording medium 2402 (CD, LD, DVD, etc.), operation switch 2403, display portion (a) 2404, and display portion(b) 2405. The display portion (a) chiefly displays image information, and display portion (b) chiefly displays character information. The display portion (a) and (b) of the present invention can be used as a display portion of provided with a picture reproducer provided with recording media. The present invention is applicable to a CD player or a game machine as a picture reproducer provided with recording media.

Figure 17E:
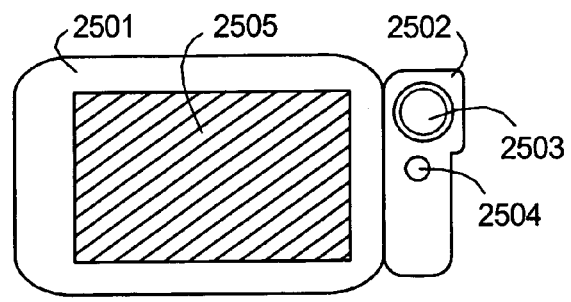
Figure 18:
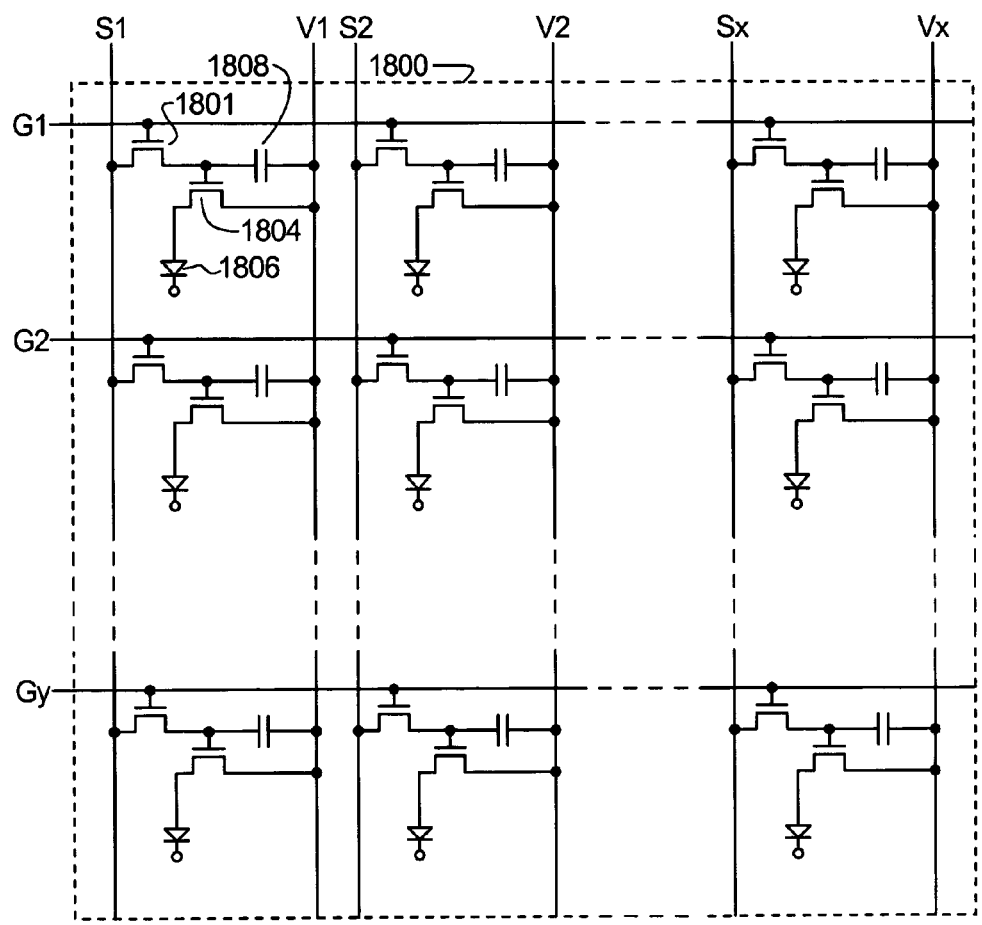
FIG. 18 is a diagram showing a circuit configuration of a pixel portion of a conventional EL display.
Figure 19:
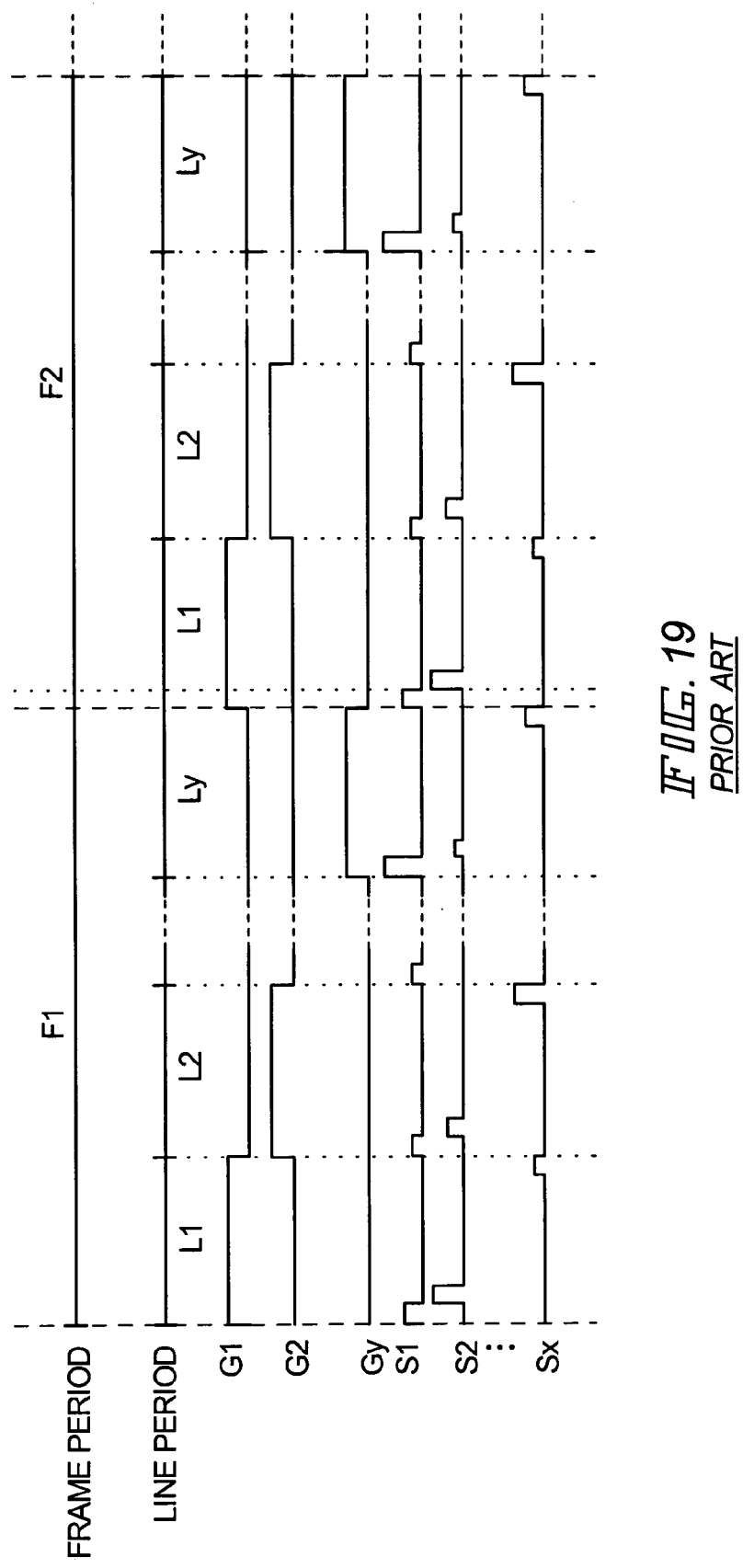
FIG. 19 is a timing chart illustrating a driving method of the conventional EL display.
Figure 20A:
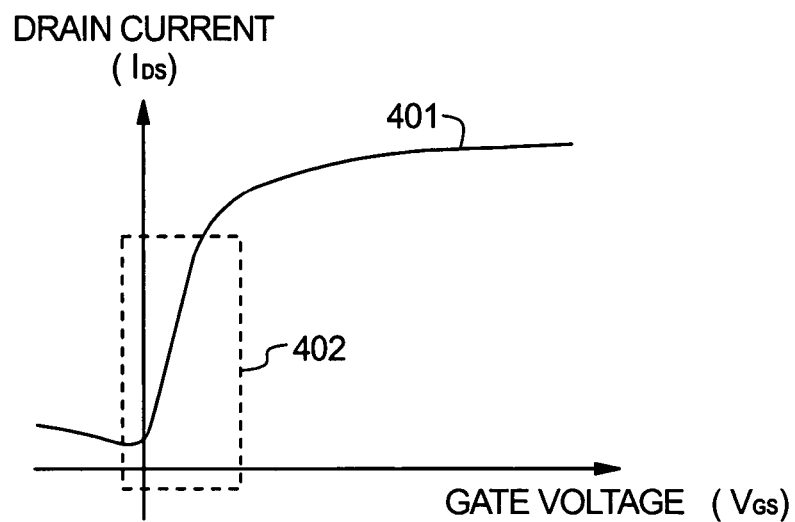
FIGS. 20A and 20B are graphs illustrating an $I_{DS}$–$V_{GS}$ characteristic of a TFT.
Figure 20B:
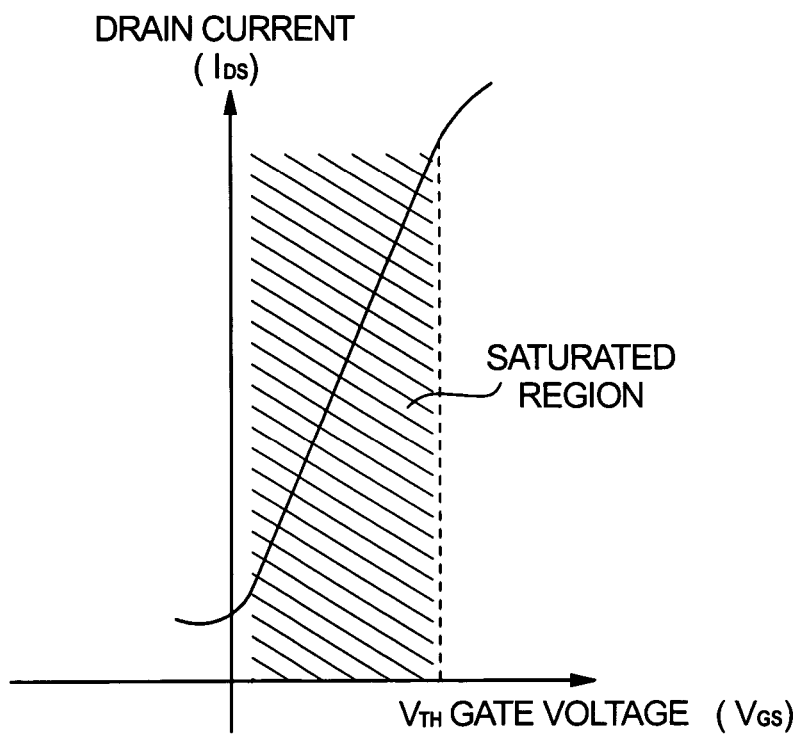

FIG. 17E depicts a portable (mobile) computer, which includes a main body 2501, camera 2502, image reception part 2503, operation switch 2504, and the display portion 2505. The display portion of the present invention can be used as a display portion 2505 of the mobile computer.

If the luminescence brightness of the EL material is enhanced in the future, the present invention will be applicable to a front or rear type projector.

The present invention has a quite wide scope of application, as mentioned above, and is applicable to electronic equipment in all fields. The electronic equipment of this embodiment can be realized by the using any structure resulting from the free combination of embodiments 1 to 13.

Embodiment 15

Figure 23:
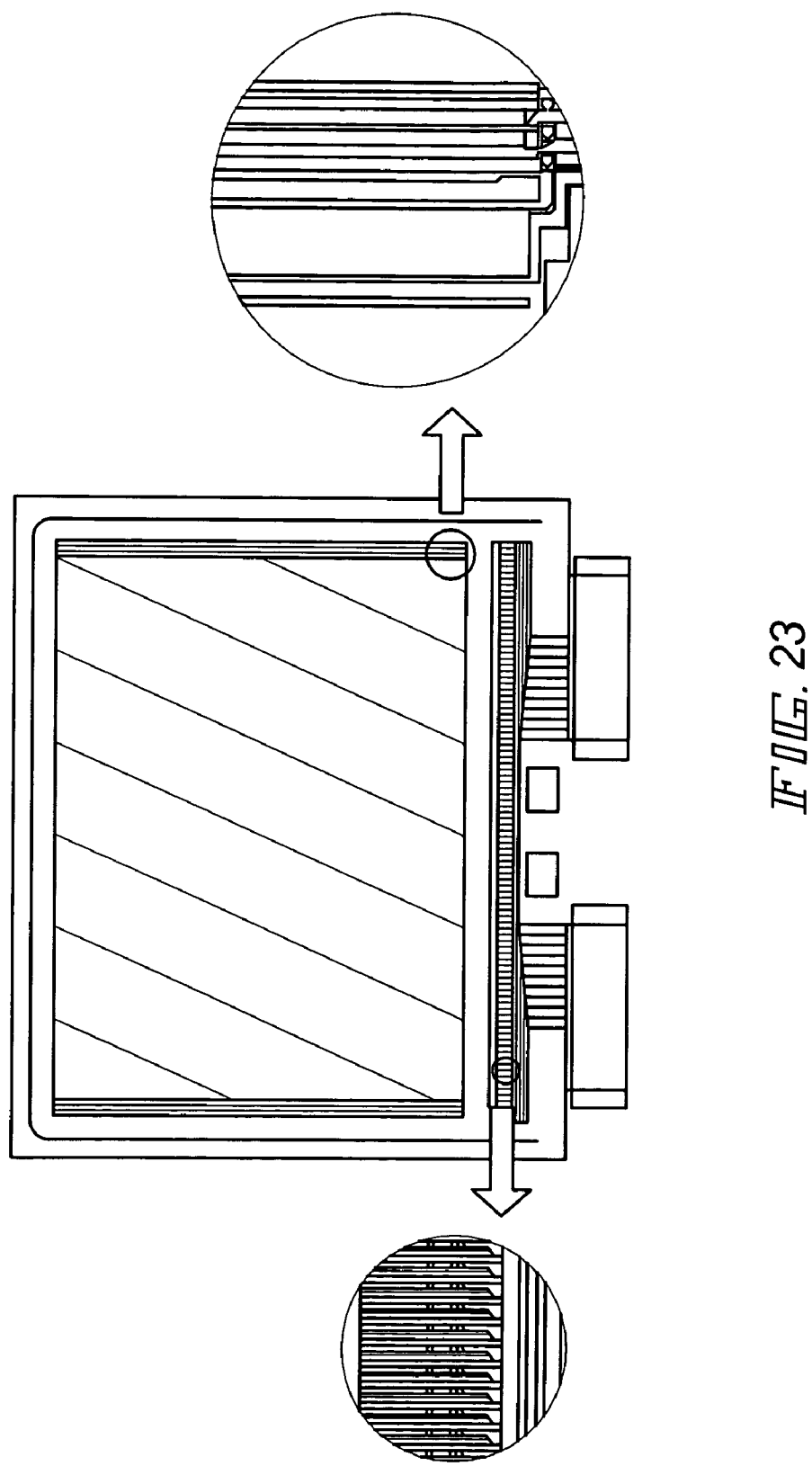
FIG. 23 is a photograph showing a top view of the EL display of the present invention.

The picture taken from top surface of an EL display which have a present invention structure is shown in FIG. 23. The concrete implement equipment is described hereinafter.

The EL display is composed of the pixel portion having a diagonal size of 4 inches, the pixel number in pixel portion are 640×480 (VGA), the monochrome display, maximum voltage between cathode and anode of an EL element is 6V, aperture ratio is 48%, driver frequency of source signal line driver circuit is 6.25 MHZ, the driver voltage of a gate signal line driver circuit is 10V. The EL display correspond to 6 bit digital data signal so that it can display 63 gradation. Thus, a ratio (duty ratio) of the total sum of the display periods in 1 frame is 63.0%.

The structure of the present invention is not limited to the above mentioned equipment. Further, this embodiment can be freely combined with all of other embodiments in this specification.

Embodiment 16

In Embodiment 16, an explanation will be made regarding the order of appearance of the display periods Tr1 to Trn in the driving method of the present invention corresponding to (n) bit of digital data signals.

Figure 24:
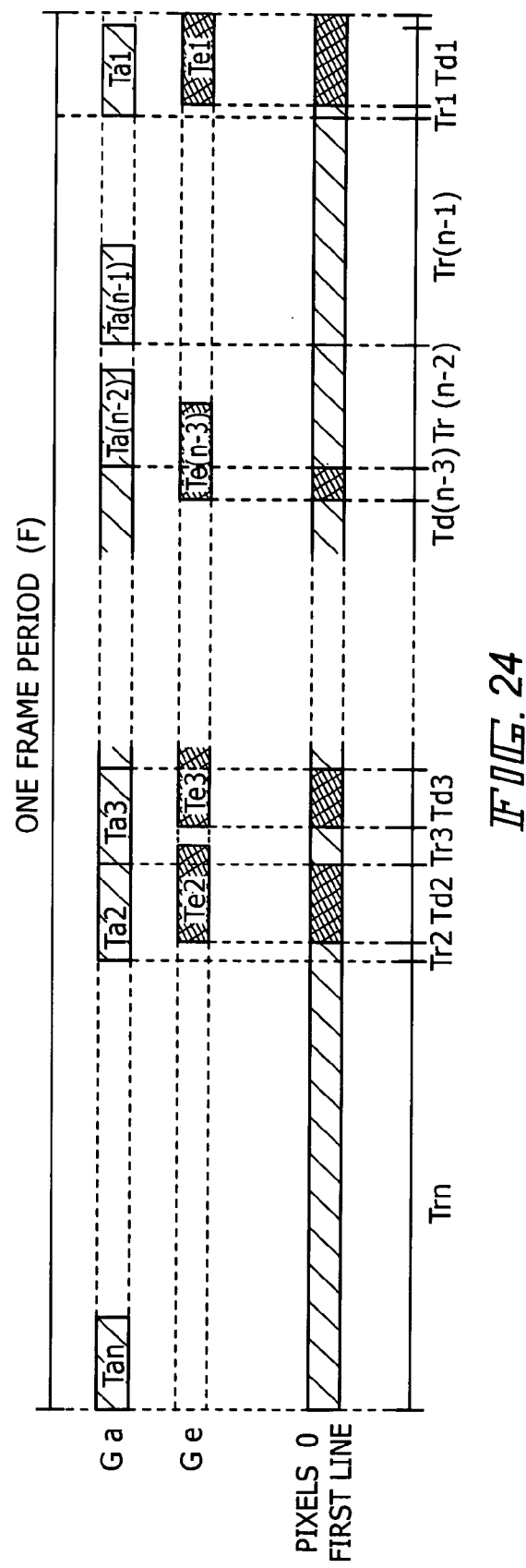
FIG. 24 is a diagram illustrating a driving method of the EL display of the present invention.

Shown in FIG. 24 is a timing chart of a driving method of Embodiment 16. The Embodiment Mode is referred to for details regarding the driving method of the pixels. In the driving method of Embodiment 16, the longest non-display period within 1 frame period, which is Td1, is placed at the end of the 1 frame period. With the above structure, a period between the non-display period Td1 and the next display period (Tr(n) in Embodiment 16; the present invention is not limited to this but may be any period other than Tr1) will be reflected in a person's eyes as if that is a pause of the frame period. Accordingly, uneven display caused by adjacent display periods in adjoining frame periods when performing an intermediate display can be corrected and not be recognized by the eyes of a person.

Note that Embodiment 16 may be freely combined with the constitutions of all the other Embodiments.

Embodiment 17

An effective driving method of the pixel portion when implementing the present invention will be explained in Embodiment 17 with reference to FIGS. 25A and 25B.

Figure 25A:
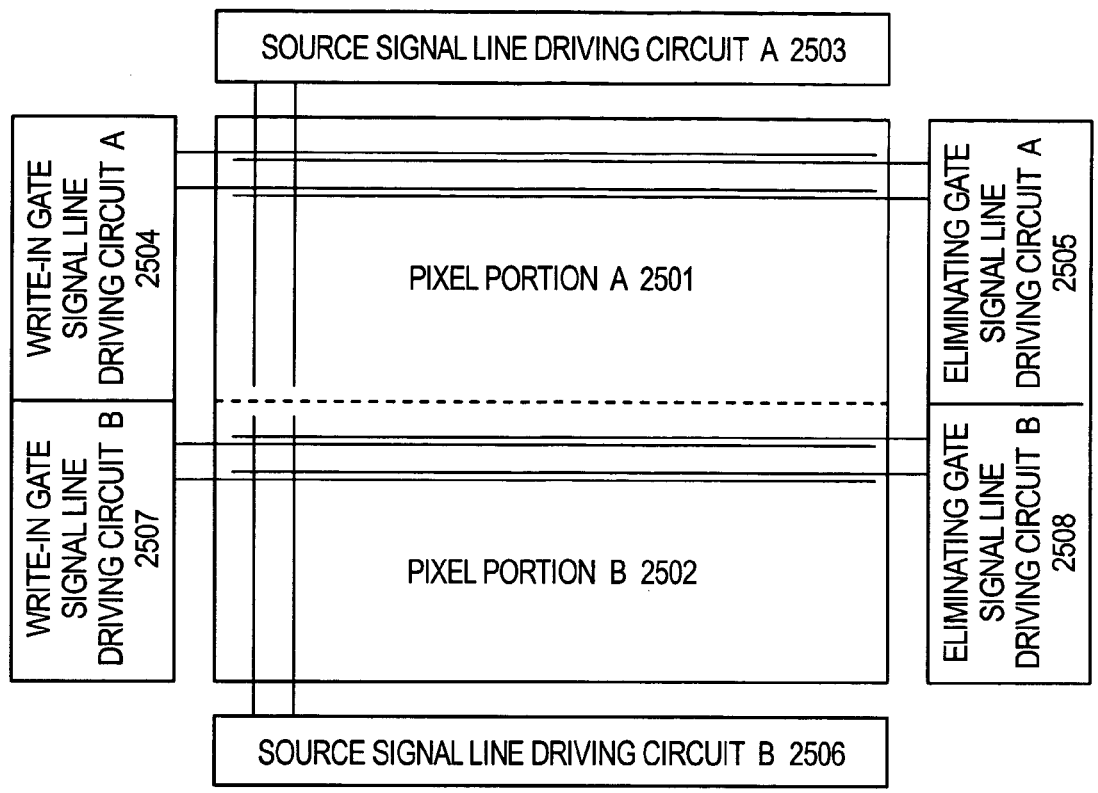
FIGS. 25A and 25B are top views of the EL display of the present invention.

A pixel portion of an EL display of Embodiment 17 shown in FIG. 25A is divided into two pixel portions, pixel portion A 2501 and pixel portion B 2502. A source signal line driver circuit A 2503, a writing-in gate signal line driver circuit A 2504, and an eliminating gate signal line driver circuit A 2505 are then driven, whereby half of an image is displayed in the pixel portion A 2501. Further, a source signal line driver circuit B 2506, a writing-in gate signal line driver circuit B 2507, and an eliminating gate signal line driver circuit B 2508 are driven, whereby the other half of the image is displayed in the pixel portion B 2502.

Half of the image displayed in the pixel portion A 2501 and the other half of the image displayed in the pixel portion B 2502 are then combined to thereby form one image.

Figure 25B:
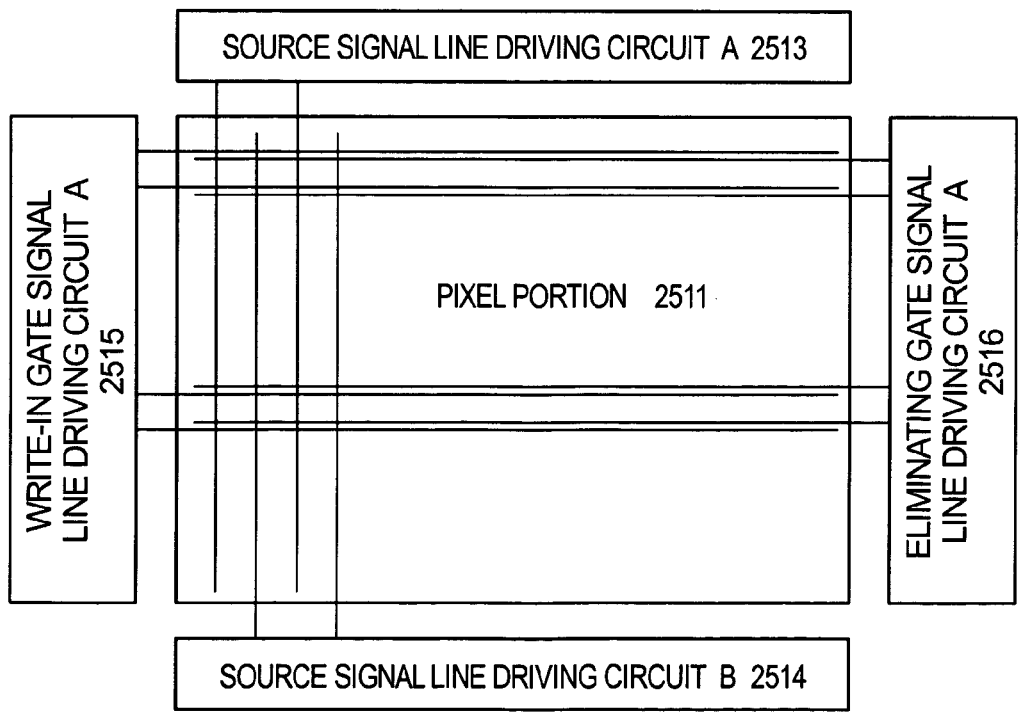

In the EL display shown in FIG. 25B, a digital data signal from a source signal line driver circuit A 2513 is fed to an odd-numbered source line whereas a digital data signal from a source signal line driver circuit B 2514 is fed to an even-numbered source line.

A writing-in gate signal line driver circuit A 2515 selects two writing-in gate signal line driver circuits at the same time, thereby inputting the digital data signals, which are simultaneously fed to the odd and even numbered source signal lines, to the pixels. To be more specific, the digital data signals are fed to the gate electrode of the EL driving TFT via the switching TFT of the pixels.

An eliminating gate signal line driver circuit A 2516 selects two eliminating gate signal line driver circuits at the same time, thereby inputting the power supply electric potential of the power supply line to the pixels. To be more specific, the power supply electric potential is imparted to the gate electrode of the EL driving TFT via the eliminating TFT of the pixels.

Accordingly, an image is formed in a pixel portion 2511 by the above structure. Note that Embodiment 17 may be freely combined with the constitutions of all the other Embodiments.

Embodiment 18

In Embodiment 18, an explanation will be made on how to drive the EL driving TFT under what kind of voltage-current characteristic a region has in the case of employing the driving method of the EL display of the present invention.

If there is even a slight change in the voltage applied to the EL element, the current flowing in the EL element is exponentially changed immensely with respect to the slight change of the voltage. Looking at it from a different perspective, even if the amount of current flowing in the EL element changes, a voltage value applied to the EL element does not change much. The luminance of the EL element increases almost in direct proportion to the current flowing to the EL element. Therefore, it is better to control the luminance of the EL element by regulating the size of the current (current value) flowing to the EL element than by regulating the size of the voltage (voltage value) applied to the EL element, allowing easier control of the luminance of the EL element without being influenced by the characteristic of the TFT.

Figure 26A:
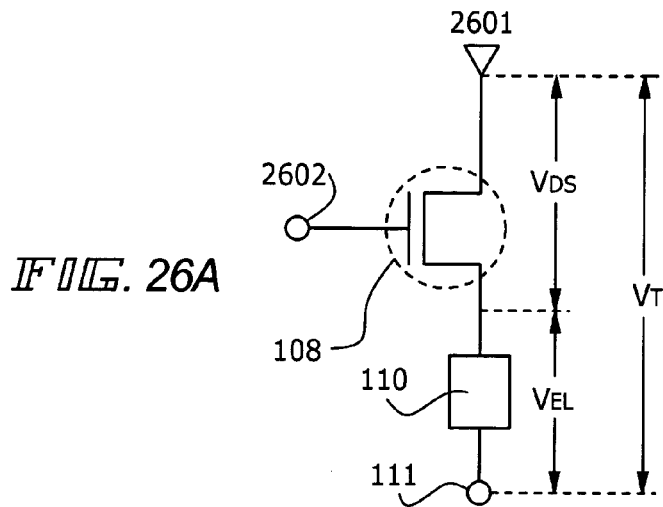
FIG. 26A is a diagram showing a connecting configuration between an EL element and an EL driving TFT.
Figure 26B:
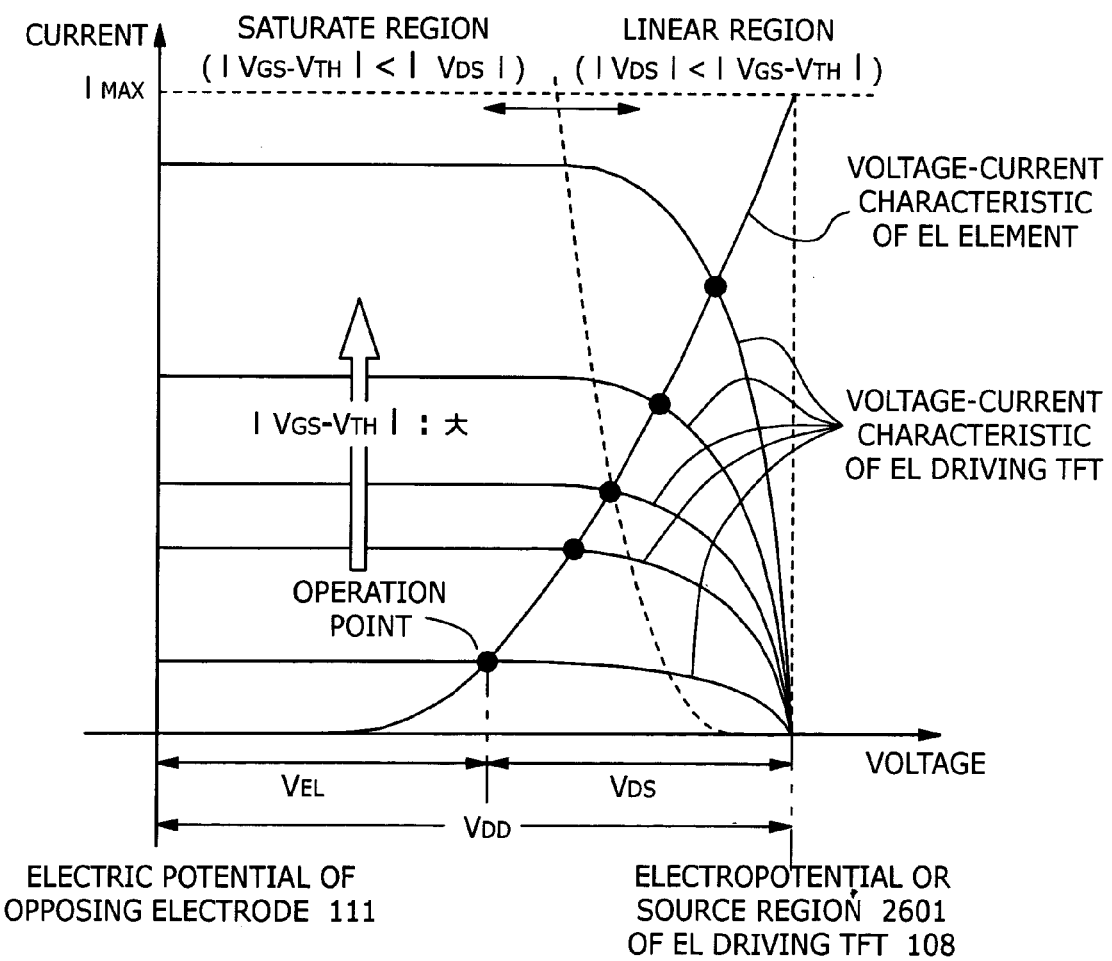
FIG. 26B is a diagram showing a voltage-current characteristic of the EL element and the EL driving TFT.

FIGS. 26A and 26B are referenced. FIG. 26A is a diagram showing only the composition portions of the EL driving TFT 108 and the EL element 110 in the pixel of the EL display of the present invention illustrated in FIG. 3. FIG. 26B is a graph illustrating a voltage-current characteristic of the EL driving TFT 108 and the EL element 110 shown in FIG. 26A. It is to be noted that the graph of the voltage-current characteristic of the EL driving TFT 108 in FIG. 26B illustrates the size of the current flowing to the drain of the EL driving TFT 108 with respect to $V_{DS}$, which is the voltage between the source region and the drain region. A plurality of graphs illustrating different values of the $V_{GS}$ that is the voltage between the source region and the gate electrode of the EL driving TFT 108 is shown in FIG. 26B.

As shown in FIG. 26A, a voltage applied between the pixel electrode and the opposing electrode 111 of the EL element 110 is denoted as $V_{EL}$, and a voltage applied between the terminal 2601 connected to the power supple line and the opposing electrode 111 of the EL element 110 is denoted as $V_T$. Note that a value of the $V_T$ is fixed by the electric potential of the power supple line. In addition, a voltage between the source region and the drain region of the EL driving TFT 108 is denoted as $V_{DS}$, and a voltage between the connecting wiring 2602 connected to the gate electrode of the EL driving TFT 108 and the source region thereof, that is, a voltage between the gate electrode and the source region of the EL driving TFT 108 is denoted as $V_{GS}$.

The EL driving TFT 108 may be formed of either the N channel TFT or the P channel TFT.

The EL driving TFT 108 and the EL element 110 are connected in series, and hence the value of the current flowing to both elements (EL driving TFT 108 and EL element 110) is the same. Accordingly, the EL driving TFT 108 and the EL element 110 shown in FIG. 26A are driven at a point of intersection (operating point) in the graph illustrating the voltage-current characteristic of both elements. In FIG. 26B, the $V_{EL}$ becomes the voltage between the electric potential of the opposing electrode 111 and the electric potential at the operating point, whereas the $V_{DS}$ becomes the voltage between the electric potential of the terminal 2601 of the EL driving TFT 108 and the electric potential at the operating point. In other words, the $V_T$ is equivalent to the sum of the $V_{EL}$ and the $V_{DS}$.

Here, a case where the $V_{GS}$ has been changed is assumed. As is apparent from FIG. 26B, the current value flowing to the EL driving TFT 108 increases as the $|V_{GS}-V_{TH}|$ of the EL driving TFT 108 increase, in other words, as the $|V_{GS}|$ increases. It is to be noted that the $V_{TH}$ is the threshold voltage of the EL driving TFT 108. Consequently, as is apparent from FIG. 26B, the current value flowing to the EL element 110 naturally increases at the operating point when the $|V_{GS}|$ increases. Thus, the luminance of the EL element 110 increases in proportion to the current value flowing to the EL element 110.

When the current value flowing to the EL element 110 is increased due to the increase of the $|V_{GS}|$, then the value of the VEL also increases in response to the current value. The size of the $V_T$ is determined by the electric potential of the power supply line, and therefore as the $V_{EL}$ increases, the $V_{DS}$ decreases that much.

Further, as shown in FIG. 26B, the voltage-current characteristic of the EL driving TFT 108 is divided into 2 regions by the value of the $V_{GS}$ and the value of the $V_{DS}$. A region indicated by $|V_{GS}-V_{TH}|<|V_{DS}|$ is a saturated region, and a region indicated by $|V_{GS}-V_{TH}|>|V_{DS}|$ is a linear region.

The following Equation 1 defines the saturated region. Note that the current value flowing to a channel forming region of the EL driving TFT 108 is given as IDS. In the equation $\beta=\mu C_O W/L$, $\mu$ is the mobility of the EL driving TFT 108, $C_O$ is a gate capacitance per unit area, and W/L is the ratio of a channel width W and a channel length L of the channel forming region.

$$I_{DS}=\beta(V_{GS}-V_{TH})^2/2 \qquad \text{Equation 1}$$

The following Equation 2 defines the linear region.

$$I_{DS}=\beta\{(V_{GS}-V_{TH})V_{DS}-V_{DS}^2/2\} \qquad \text{Equation 2}$$

In the saturated region, there is almost no change in the current value due to the $V_{DS}$, and the current value is thus determined only by the $V_{GS}$ as is apparent from Equation 1.

On the other hand, in the linear region, the current value is determined by the $V_{DS}$ and the $V_{GS}$ as is apparent from Equation 2. The EL element 108 will start to operate in the linear region when the $|V_{GS}|$ is increased, whereby the $V_{EL}$ also gradually increases. Consequently, the extent to which the $V_{EL}$ increases, the $V_{DS}$ becomes smaller that much. In the linear region, the amount of current becomes smaller as the $V_{DS}$ becomes smaller. Therefore, even if the $|V_{GS}|$ is increased, it is difficult to increase the current value. At the point $|V_{GS}|=\infty$, the current value becomes current value=$I_{MAX}$, that is, no matter how much the $|V_{GS}|$ is increased, a current of $I_{MAX}$ or more will not flow. The $I_{MAX}$ here refers to the current value flowing to the EL element 110 when $V_{EL}=V_T$.

The operating point can thus be generated in the saturated region or the linear region by controlling the size of the $|V_{GS}|$.

Ideally, it is preferable that the characteristics of all the EL driving TFTs are the same, but actually there are many cases where the threshold $V_{TH}$ and the mobility $\mu$ of the individual EL driving TFTs are different. Accordingly, if the threshold $V_{TH}$ and the mobility $\mu$ of the individual EL driving TFTs are different from each other, then as is apparent from Equation 1 and Equation 2, the current value flowing to the channel forming region of the EL driving TFT 108 will not be equivalent even if the value of the $V_{GS}$ is the same.

Figure 27:
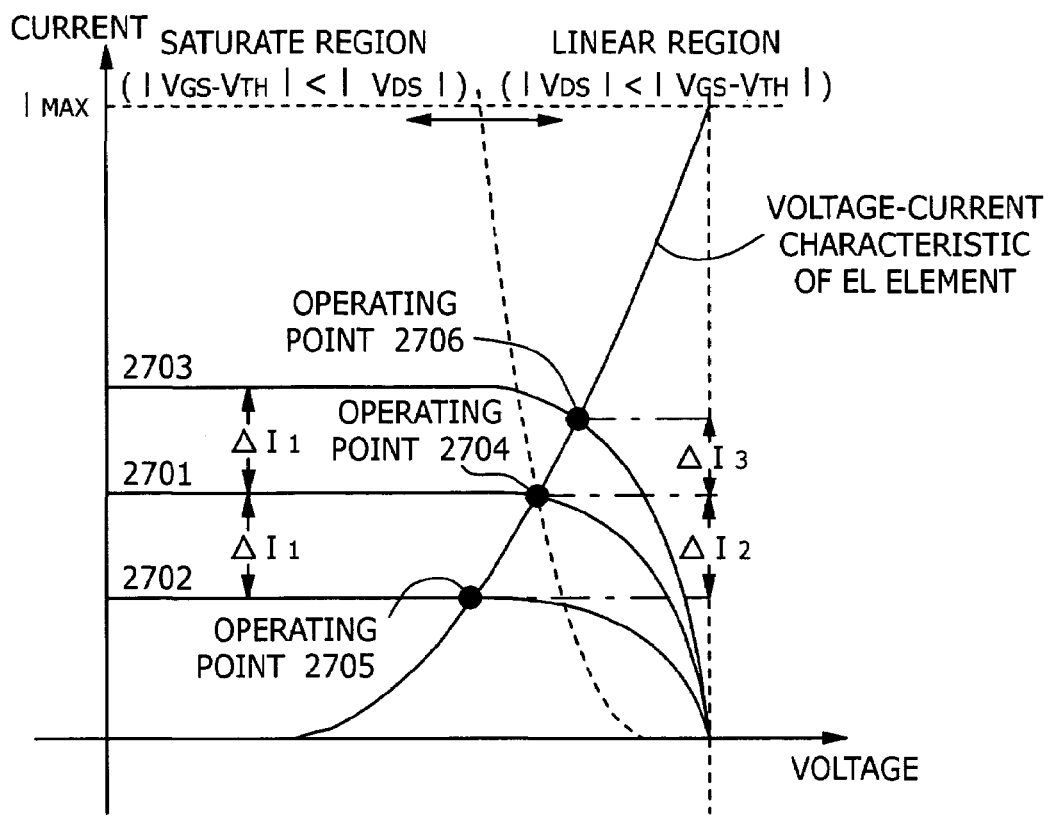
FIG. 27 is a diagram showing a voltage-current characteristic of the EL element and the EL driving TFT.

FIG. 27 is a graph illustrating a current-voltage characteristic of the EL driving TFT in the case of shifting the threshold $V_{TH}$ and the mobility $\mu$. Denoted by the reference numeral 2701 is a solid line which is the ideal voltage-current characteristic of the graph, and reference numerals 2702 and 2703 denote the ideal values of the threshold $V_{TH}$ and the mobility $\mu$ and the case when the values of the threshold $V_{TH}$ and the mobility $\mu$ and are different, respectively, of the current-voltage characteristic of the EL driving TFT. Graphs 2702 and 2703 of the current-voltage characteristic in the saturated region are shifted from the graph 2701 of the current-voltage characteristic having the ideal characteristic by only an equivalent current value $\Delta I_1$. An operating point 2705 of the graph 2702 of the current-voltage characteristic is in the saturated region, and it is assumed that an operating point 2706 of the graph 2703 of the current-voltage characteristic is in the linear region. In this case, if a current value at an operating point 2704 of the graph 2701 of the current-voltage characteristic having the ideal characteristic and an offset current value at the operating point 2705 and the operating point 2706 are $\Delta I_2$ and $\Delta I_3$, respectively, then the operating point 2706 in the linear region is smaller than the operating point 2705 in the saturated region.

Therefore, in the case of employing the driving method of the digital system shown in the present invention, by driving the EL driving TFT and the EL element so that the operating point is present in the linear region, gray-scale display in which the uneven luminance of the EL element caused by the variation of the EL driving TFT characteristic is suppressed can be performed.

Also, in the case of the conventional analog drive, it is preferable that the EL driving TFT and the EL element are driven so that the operating point is present in the saturated region where the current value may be controlled only by the $|V_{GS}|$.

Figure 28:
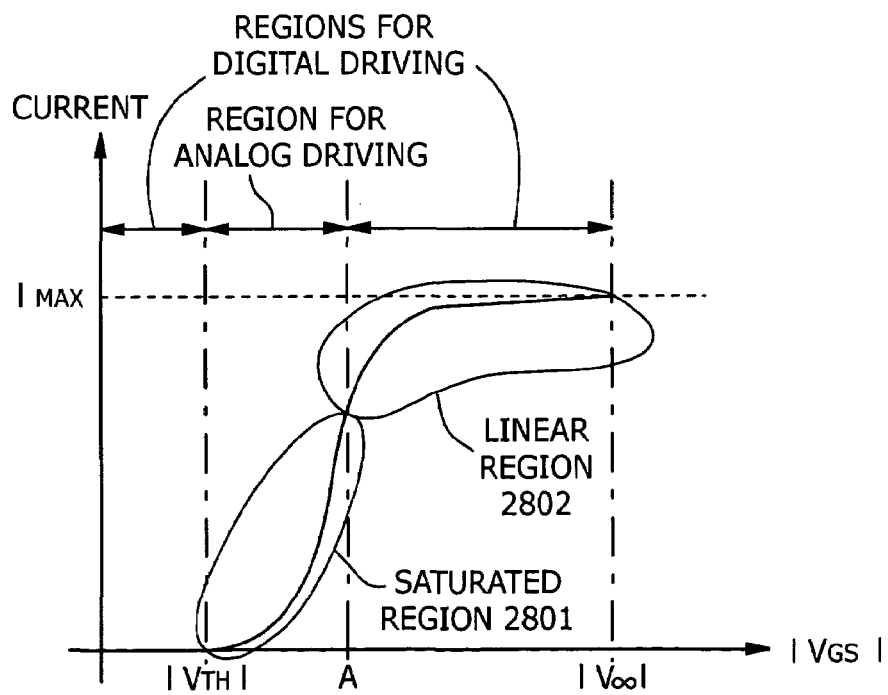
FIG. 28 is a diagram illustrating a relation between a gate electrode of an EL driving TFT and a drain current.

As a conclusion of analyzing the above-described operation, a graph of the current value to the gate voltage $|V_{GS}|$ of the EL driving TFT is shown in FIG. 28. The $|V_{GS}|$ is increased and when it exceeds an absolute value of the threshold voltage $|V_{TH}|$ of the EL driving TFT, the EL driving TFT turns into a conductive state to thereby start the flow of current. The $|V_{GS}|$ at this point is referred to as lighting-up commencing voltage in the present specification. Then, when the $|V_{GS}|$ is further increased, it becomes a value (here it is A temporarily) satisfying $|V_{GS}-V_{TH}|=|V_{DS}|$ and hence moves from a saturated region 2801 to a linear region 2802. When the $|V_{GS}|$ is still further increased, the current value becomes larger and finally saturates. At this point, $|V_{GS}|=\infty$.

As is obvious from FIG. 28, there is almost not current flow in the $|V_{GS}|\leq|V_{TH}|$ region. A region where $|V_{TH}| \leq |V_{GS}| \leq A$ is the saturated region where the current value is changed due to the $|V_{GS}|$. In addition, a region where $A \leq |V_{GS}|$ is the linear region where the current value flowing to the EL element is changed due to the $|V_{GS}|$ and the $|V_{DS}|$.

In the digital drive of the present invention, employing the region of $|V_{GS}| \leq |V_{TH}|$ and the linear region of $A \leq |V_{GS}|$ are preferred.

Note that Embodiment 18 may be freely combined with the constitutions of all the other Embodiments.

Embodiment 19

In this embodiment, the external light emission quantum efficiency can be riced greatly by using EL materials which can use a phosphorescence from triple excision to light emission. Thus, a low power consumption, long life time and light weight of the EL element are possible to be realized.

Here, the report of making external light emission quantum efficiency rise by using triple excision is described in Tsutsui, T., Adachi, C., Saito, S., "Photochemical Process in Organized Molecular Systems", Elsevier Sci. Pub., Tokyo, 1991, p. 437. The molecular formula 1 of EL materials (coumarin coloring matter) is shown in the attached sheet, which is reorted in the above mentioned thesis.

[Formula 1]

Baldo, M. A., O'brien, D. F., You, Y., Shoustikov, A., Sibley, S., Thompson, M. E., Forrest, R., Nature 395, 1995, p. 151.

The molecular formula 2 (Pt complex) is shown in the attached sheet, which is reported in above mentioned thesis.

[Formula 2]

Baldo, M. A., Lmansky, S., Burrows, P. E., Thompson, M. E., Forrest, S. R., Appl. Phys. Lett., 75, 1995, P. 4. Tsutsui, T., Yang, M. J., Yahiro, M., Nkamura, K., Watanabe, T., Tsuji, T., Fukuda, Y, Wakimoto, T., Mayaguchi, S., Jpn. Appl. Phys., 38 (12B), 1999, L1502. The molecular formula (Ir complex) is shown in the attached sheet, which is reported in above mentioned thesis.

[Formula 3]

As mentioned above, if a phosphorescence light emission from triple excision can be used, fundamentally, external light emission quantum efficiency three to four times as high as fluorescence light emission from single excision will be possible to be realized.

The structure of this embodiment can be freely combined and performed with any structure of embodiments 1 to 18.

By adopting the above structure, the present invention is capable of suppressing the variations in the amount of current flow outputted when equivalent gate voltages are applied even if there is a slight variation in the $I_{DS}$–$V_{GS}$ characteristic caused by the TFTs. As a result, the situation in which the occurrence of a vast difference between the amount of luminescing of the EL element with that of an adjacent pixel caused by the variation of the $I_{DS}$–$V_{GS}$ characteristic even if signals having equivalent voltages are fed may be avoided.

In addition, the non-luminescing periods for not performing displays can be provided in the present invention. In the case of the conventional analog drive, if the EL display is made to display all white images, then the EL element is constantly luminescing, becoming a factor in advancing the deterioration of the EL layer. The non-luminescing periods can be provided in the present invention, and therefore a level of deterioration of the EL layer can be suppressed.

What is claimed is:

1. An electronic device comprising:
   a source signal line driver circuit;
   a first gate signal line driver circuit;
   a second gate signal line driver circuit; and
   a pixel portion including a plurality of pixels,
   wherein at least one of said plurality of pixels has an EL element, an EL driving TFT for controlling luminescence of the EL element, a switching TFT, and an eliminating TFT for controlling said EL driving TFT,
   wherein said switching TFT is controlled by said first gate signal line driver circuit,
   wherein said eliminating TFT is controlled by said second gate signal line driver circuit, and
   wherein a gray-scale display is performed by controlling a luminescing time of said plurality of EL elements.

2. A device according to claim 1, wherein each of said switching TFT, the EL driving TFT, and the eliminating TFT is selected from an N channel TFT and a P channel TFT.

3. A device according to claim 1, wherein said EL driving TFT becomes an OFF state when an electric potential of a power supply line is applied to a gate electrode of said EL driving TFT.

4. A computer, which comprises said electronic device according to claim 1.

5. A video camera, which comprises said electronic device according to claim 1.

6. A DVD player, which comprises said electronic device according to claim 1.

7. An electronic device comprising:
   a source signal line driver circuit electrically connected to a plurality of source signal lines;
   a first gate signal line driver circuit electrically connected to a plurality of first gate signal lines;
   a second gate signal line driver circuit electrically connected to a plurality of second gate signal lines;
   a pixel portion including a plurality of pixels; and
   a plurality of power supply lines,
   wherein at least one of said plurality of pixels has a first TFT, a second TFT, a third TFT, and an EL element,
   wherein a gate electrode of said first TFT is electrically connected to one of said plurality of first gate signal lines,
   wherein one of a source region and a drain region of said first TFT is electrically connected to one of said plurality of source signal lines, and the other of the source region and the drain region of the first TFT is electrically connected to a gate electrode of said second TFT,
   wherein a gate electrode of said third TFT is electrically connected to one of said plurality of second gate signal lines,
   wherein one of a source region and a drain region of said third TFT is electrically connected to one of said plurality of power supply lines, and the other of the source region and the drain region of the third TFT is electrically connected to said gate electrode of said second TFT, and
   wherein one of a source region and a drain region of said second TFT is electrically connected to the one of said plurality of power supply lines, and the other of the source region and the drain region of the third TFT is electrically connected to said EL element.

8. A device according to claim 7, wherein each of said first TFT, the second TFT, and the third TFT is selected from an N channel TFT and a P channel TFT.

9. A device according to claim 7, wherein said second TFT becomes an OFF state when an electric potential of the one of said plurality of power supply lines is applied to said gate electrode of said second TFT.

10. A computer, which comprises said electronic device according to claim 7.

11. A video camera, which comprises said electronic device according to claim 7.

12. A DVD player, which comprises said electronic device according to claim 7.

13. An electronic device comprising:
a source signal line driver circuit electrically connected to a plurality of source signal lines;
a first gate signal line driver circuit electrically connected to a plurality of first gate signal lines;
a second gate signal line driver circuit electrically connected to a plurality of second gate signal lines;
a pixel portion including a plurality of pixels; and
a plurality of power supply lines,
wherein at least one of said plurality of pixels has a first TFT, a second TFT, a third TFT and an EL element;
wherein said EL element includes a pixel electrode, an opposing electrode, and an EL layer formed between said pixel electrode and said opposing electrode,
wherein a gate electrode of said first TFT is electrically connected to one of said plurality of first gate signal lines,
wherein one of a source region and a drain region of said first TFT is electrically connected to one of said plurality of source signal lines, and the other of the source region and the drain region of the first TFT is electrically connected to a gate electrode of said second TFT,
wherein a gate electrode of said third TFT is electrically connected to one of said plurality of second gate signal lines,
wherein one of a source region and a drain region of said third TFT is electrically connected to one of said plurality of power supply lines, and the other of the source region and the drain region of the third TFT is electrically connected to the gate electrode of said second TFT, and
wherein one of a source region and a drain region of said second TFT is electrically connected to the one of said plurality of power supply lines, and the other of the source region and the drain region of the second TFT is electrically connected to the pixel electrode of said EL element.

14. A device according to claim 13, wherein said EL layer comprises a low molecular organic material or a polymer organic material.

15. A device according to claim 14, wherein said low molecular organic material comprises at least one of $Alq_3$ (tris-8-quinolilite-aluminum) and TPD (triphenylamine derivative).

16. A device according to claim 14, wherein said polymer organic material comprises at least one of PPV (polyphenylene vinylene), PVK (polyvinyl carbazole), and polycarbonate.

17. A device according to claim 13, wherein each of said first TFT, the second TFT, and the third TFT is selected from an N channel TFT and a P channel TFT.

18. A device according to claim 13, wherein said second TFT becomes an OFF state when an electric potential of the one of said plurality of power supply lines is applied to said gate electrode of said second TFT.

19. A computer, which comprises said electronic device according claim 13.

20. A video camera, which comprises said electronic device according claim 13.

21. A DVD player, which comprises said electronic device according to claim 13.

22. An electronic device comprising:
a source signal line driver circuit;
a first gate signal line driver circuit;
a second gate signal line driver circuit;
a pixel portion including a plurality of pixels;
a plurality of source signal lines electrically connected to said source signal line driver circuit;
a plurality of first gate signal lines electrically connected to said first gate signal line driver circuit;
a plurality of second gate signal lines electrically connected to said second gate signal line driver circuit; and
a plurality of power supply lines,
wherein:
at least one of said plurality of pixels has a first TFT, a second TFT, a third TFT, and an EL element;
a gate electrode of said first TFT is electrically connected to one of said plurality of first gate signal lines;
one of a source region and a drain region of said first TFT is electrically connected to one of said plurality of source signal lines, and the other of the source region and the drain region of the first TFT is electrically connected to a gate electrode of said second TFT;
a gate electrode of said third TFT is electrically connected to one of said plurality of second gate signal lines;
one of a source region and a drain region of said third TFT is electrically connected to one of said plurality of power supply lines, and the other of the source region and the drain region of the third TFT is electrically connected the gate electrode of said second TFT;
one of a source region and a drain region of said second TFT is electrically connected to the one of said plurality of power supply lines, and the other of the source region and the drain region of the second TFT is electrically connected to said EL element;
an (n) number of writing-in periods Ta1, Ta2, . . . , Ta(n) and an (m−1) number of eliminating periods Te1, Te2, . . . , Te(m−1) (m is an arbitrary integer from 2 to (n)) are provided in 1 frame period;
digital data signals from said source signal line driver circuit are fed to all said plurality of pixels through said plurality of source signal lines in said writing-in periods Ta1, Ta2, . . . , Ta(n);
the digital data signals fed to said entire plurality of pixels are all eliminated in said eliminating periods Te1, Te2, . . . , Te(m−1);
among said (n) number of writing-in periods Ta1, Ta2, . . . , Ta(n), a portion of the writing-in periods Ta1, Ta2, . . . , Ta(m) and a portion of said eliminating periods Te1, Te2, . . . , Te(m−1) overlap with each other;
periods from the start of each of the writing-in periods Ta1, Ta2, . . . , Ta(m−1) in said (n) number of writing-in periods Ta1, Ta2, . . . , Ta(n) to the start of each of said eliminating periods Te1, Te2, . . . , Te(m−1) are display periods Tr1, Tr2, . . . , Tr(m−1);
periods from the start of each of said eliminating periods Te1, Te2, . . . , Te(m−1) to the start of each of the writing-in periods Ta1, Ta2, . . . , Ta(m) in said (n) number of writing-in periods Ta1, Ta2, . . . , Ta(n) are non-display periods Td1, Td2, . . . , Td(m−1);
periods from the start of each of the writing-in periods Ta1, Ta2, . . . , Ta(m+1) in said (n) number of writing-in periods Ta1, Ta2, . . . , Ta(n) to the start of the next writing-in periods of each of said writing-in periods Ta(m), Ta(m+1), . . . , Ta(n), respectively, are display periods Tr(m), Tr(m+1), . . . , Tr(n);

in said display periods Tr1, Tr2, ..., Tr(n), said plurality of EL elements are selected by said digital data signals to luminesce or not luminesce;

a length of said (n) number of writing-in periods Ta1, Ta2, ..., Ta(n) and a length of said (m−1) number of eliminating periods Te1, Te2, ..., Te(m−1) are the same; and ratios of the lengths of said display periods Tr1, Tr2, ..., Tr(n) are expressed as $2^0 : 2^1 : \ldots : 2^{(n-1)}$.

23. A device according to claim 22, wherein said (n) number of writing-in periods Ta1, Ta2, ..., Ta(n) are not overlapped with each other.

24. A device according to claim 22, wherein said (m−1) number of eliminating periods Te1, Te2, ..., Te(m−1) are not overlapped with each other.

25. A device according to claim 22, wherein each of said first TFT, the second TFT, and the third TFT is selected from an N channel TFT and a P channel TFT.

26. A device according to claim 22, wherein said second TFT becomes an OFF state when an electric potential of the one of said plurality of power supply lines is applied to said gate electrode of said second TFT.

27. A computer, which comprises said electronic device according to claim 22.

28. A video camera, which comprises said electronic device according to claim 22.

29. A DVD player, which comprises said electronic device according to claim 22.

30. An electronic device comprising:
a source signal line driver circuit;
a first gate signal line driver circuit;
a second gate signal line driver circuit;
a pixel portion including a plurality of pixels;
a plurality of source signal lines electrically connected to said source signal line driver circuit;
a plurality of first gate signal lines electrically connected to said first gate signal line driver circuit;
a plurality of second gate signal lines electrically connected to said second gate signal line driver circuit; and
a plurality of power supply lines,
wherein:
at least one of said plurality of pixels has a first TFT, a second TFT, a third TFT and an EL element;
said EL element includes a pixel electrode, an opposing electrode, and an EL layer formed between said pixel electrode and said opposing electrode;
a gate electrode of said first TFT is electrically connected to one of said plurality of first gate signal lines;
one of a source region and a drain region of said first TFT is electrically connected to one of said plurality of source signal lines, the other of the source region and the drain region of the first TFT is electrically connected to a gate electrode of said second TFT;
a gate electrode of said third TFT is electrically connected to one of said plurality of second gate signal lines,
one of a source region and a drain region of said third TFT is electrically connected to one of said plurality of power supply lines, and the other of the source region and the drain region of the third TFT is electrically connected to the gate electrode of said second TFT;
one of a source region and a drain region of said second TFT is electrically connected to the one of said plurality of power supply lines, and the other of the source region and the drain region of the second TFT is electrically connected to the pixel electrode of said EL element;

an (n) number of writing-in periods Ta1, Ta2, ..., Ta(n) and an (m−1) number of eliminating periods Te1, Te2, ..., Te(m−1) (m is an arbitrary integer from 2 to (n)) are provided in 1 frame period;

digital data signals from said source signal line driver circuit are fed to all said plurality of pixels through said plurality of source signal lines in said writing-in periods Ta1, Ta2, ..., Ta(n);

the digital data signals fed to said plurality of pixels are all eliminated in said eliminating periods Te1, Te2, ..., Te(m−1), among said (n) number of writing-in periods Ta1, Ta2, ..., Ta(n), a portion of the writing-in periods Ta1, Ta2, ..., Ta(m) and a portion of said eliminating periods Te1, Te2, ..., Te(m−1) overlap with each other;

periods from the start of each of the writing-in periods Ta1, Ta2, ..., Ta(m−1) in said (n) number of writing-in periods Ta1, Ta2, ..., Ta(n) to the start of each of said eliminating periods Te1, Te2, ..., Te(m−1) are display periods Tr1, Tr2, ..., Tr(m−1);

periods from the start of each of said eliminating periods Te1, Te2, ..., Te(m−1) to the start of each of the writing-in periods Ta1, Ta2, ..., Ta(m) in said (n) number of writing-in periods Ta1, Ta2, ..., Ta(n) are non-display periods Td1, Td2, ..., Td(m−1);

periods from the start of each of the writing-in periods Ta1, Ta2, ..., Ta(m+1) in said (n) number of writing-in periods Ta1, Ta2, ..., Ta(n) to the start of the next writing-in periods of each of said writing-in periods Ta(m), Ta(m+1), ..., Ta(n), respectively, are display periods Tr(m), Tr(m+1), ..., Tr(n);

in said display periods Tr1, Tr2, ..., Tr(n), said plurality of EL elements are selected by said digital data signals to luminesce or not luminesce;

a length of said (n) number of writing-in periods Ta1, Ta2, ..., Ta(n) and a length of said (m−1) number of eliminating periods Te1, Te2, ..., Te(m−1) are the same; and ratios of the lengths of said display periods Tr1, Tr2, ..., Tr(n) are expressed as $2^0 : 2^1 : \ldots : 2^{(n-1)}$.

31. A device according to claim 30, wherein said EL layer is a low molecular organic material or a polymer organic material.

32. A device according to claim 30, wherein said low molecular organic material comprises at least one of Alq$_3$ (tris-8-quinolilite-aluminum) and TPD (triphenylamine derivative).

33. A device according to claim 30, wherein said polymer organic material comprises at least one of PPV (polyphenylene vinylene), PVK (polyvinyl carbazole), and polycarbonate.

34. A device according to claim 30, wherein said (n) number of writing-in periods Ta1, Ta2, ..., Ta(n) are not overlapped with each other.

35. A device according to claim 30, wherein said (m−1) number of eliminating periods Te1, Te2, ..., Te(m−1) are not overlapped with each other.

36. A device according to claim 30, wherein each of said first TFT, the second TFT, and the third TFT is selected from an N channel TFT and a P channel TFT.

37. A device according to claim 30, wherein said second TFT becomes an OFF state when an electric potential of the one of said plurality of power supply lines is applied to said gate electrode of said second TFT.

38. A computer, which comprises said electronic device according to claim 30.

39. A video camera, which comprises said electronic device according to claim 30.

40. A DVD player, which comprises said electronic device according to claim 30.

41. An electronic device comprising:
a source signal line driver circuit;
a first gate signal line driver circuit;
a second gate signal line driver circuit;
a pixel portion including a plurality of pixels;
a plurality of source signal lines electrically connected to said source signal line driver circuit;
a plurality of first gate signal lines electrically connected to said first gate signal line driver circuit;
a plurality of second gate signal lines electrically connected to said second gate signal line driver circuit; and
a plurality of power supply lines,
wherein:
at least one of said plurality of pixels has a first TFT, a second TFT, a third TFT, and an EL element;
a gate electrode of said first TFT is electrically connected to one of said plurality of first gate signal lines;
one of a source region and a drain region of said first TFT is electrically connected to one of said plurality of source signal lines, and the other of the source region and the drain region of the first TFT is electrically connected to a gate electrode of said second TFT;
a gate electrode of said third TFT is electrically connected to one of said plurality of second gate signal lines;
one of a source region and a drain region of said third TFT is electrically connected to one of said plurality of power supply lines, and the other of the source region and the drain region of the third TFT is electrically connected the gate electrode of said second TFT;
one of a source region and a drain region of said second TFT is electrically connected to the one of said plurality of power supply lines, and the other of the source region and the drain region of the second TFT is electrically connected to said EL element;
an (n) number of writing-in periods Ta1, Ta2, . . . , Ta(n) and an (m−1) number of eliminating periods Te1, Te2, . . . , Te(m−1) (m is an arbitrary integer from 2 to (n)) are provided in 1 frame period;
digital data signals from said source signal line driver circuit are fed to all said plurality of pixels through said plurality of source signal lines in said writing-in periods Ta1, Ta2, . . . , Ta(n);
the digital data signals fed to said entire plurality of pixels are all eliminated in said eliminating periods Te1, Te2, . . . , Te(m−1);
among said (n) number of writing-in periods Ta1, Ta2, . . . , Ta(n), a portion of the writing-in periods Ta1, Ta2, . . . , Ta(m) and a portion of said eliminating periods Te1, Te2, . . . , Te(m−1) overlap with each other;
periods from the start of each of the writing-in periods Ta1, Ta2, . . . , Ta(m−1) in said (n) number of writing-in periods Ta1, Ta2, . . . , Ta(n) to the start of each of said eliminating periods Te1, Te2, . . . , Te(m−1) are display periods Tr1, Tr2, . . . , Tr(m−1);
periods from the start of each of said eliminating periods Te1, Te2, . . . , Te(m−1) to the start of each of the writing-in periods Ta1, Ta2, . . . , Ta(m) in said (n) number of writing-in periods Ta1, Ta2, . . . , Ta(n) are non-display periods Td1, Td, . . . , Td(m−1);
periods from the start of each of the writing-in periods Ta1, Ta2, . . . , Ta(m+1) in said (n) number of writing-in periods Ta1, Ta2, . . . , Ta(n) to the start of the next writing-in periods of each of said writing-in periods Ta(m), Ta(m+1), . . . , Ta(n), respectively, are display periods Tr(m), Tr(m+1), . . . , Tr(n);
in said display periods Tr1, Tr2, . . . , Tr(n), said plurality of EL elements are selected by said digital data signals to luminesce or not luminesce;
a length of said (n) number of writing-in periods Ta1, Ta2, . . . , Ta(n) and a length of said (m−1) number of eliminating periods Te1, Te2, . . . , Te(m−1) are the same;
ratios of the lengths of said display periods Tr1, Tr2, . . . , Tr(n) are expressed as $2^0 : 2^1 : \ldots : 2^{(n-1)}$, and
said display periods Tr1, Tr2, . . . , Tr(n) appear in a random order.

42. A device according to claim 41, wherein said (n) number of writing-in periods Ta1, Ta2, . . . , Ta(n) are not overlapped with each other.

43. A device according to claim 41, wherein said (m−1) number of eliminating periods Te1, Te2, . . . , Te(m−1) are not overlapped with each other.

44. A device according to claim 41, wherein each of said first TFT, the second TFT, and the third TFT is selected from an N channel TFT and a P channel TFT.

45. A device according to claim 41, wherein said second TFT becomes an OFF state when an electric potential of the one of said power supply line is applied to said gate electrode of said second TFT.

46. A computer, which comprises said electronic device according to claim 41.

47. A video camera, which comprises said electronic device according to claim 41.

48. A DVD player, which comprises said electronic device according to claim 41.

49. An electronic device comprising:
a source signal line driver circuit;
a first gate signal line driver circuit;
a second gate signal line driver circuit;
a pixel portion including a plurality of pixels;
a plurality of source signal lines electrically connected to said source signal line driver circuit;
a plurality of first gate signal lines electrically connected to said first gate signal line driver circuit;
a plurality of second gate signal lines electrically connected to said second gate signal line driver circuit; and
a plurality of power supply lines,
wherein:
at least one of said plurality of pixels has a first TFT, a second TFT, a third TFT and an EL element;
said EL element includes a pixel electrode, an opposing electrode and an EL layer formed between said pixel electrode and opposing electrode;
a gate electrode of said first TFT is electrically connected to one of said plurality of first gate signal lines;
one of a source region and a drain region of said first TFT is electrically connected to one of said plurality of source signal lines, and the other of the source region and the drain region of the first TFT is electrically connected to a gate electrode of said second TFT;
a gate electrode of said third TFT is electrically connected to one of said plurality of second gate signal lines;
one of a source region and a drain region of said third TFT is electrically connected to one of said plurality of power supply lines, and the other of the source region and the drain region of the third TFT is electrically connected the gate electrode of said second TFT;
a source region and a drain region of said second TFT is electrically connected to the one of said plurality of power supply lines whereas the other of the source region and the drain region of the second TFT is electrically connected to the pixel electrode of said EL element;

an (n) number of writing-in periods Ta1, Ta2, ..., Ta(n) and an (m−1) number of eliminating periods Te1, Te2, ..., Te(m−1) (m is an arbitrary integer from 2 to (n)) are provided in 1 frame period;

digital data signals from said source signal line driver circuit are fed to all said plurality of pixels through said plurality of source signal lines in said writing-in periods Ta1, Ta2, ..., Ta(n);

the digital data signals fed to said plurality of pixels are all eliminated in said eliminating periods Te1, Te2, ..., Te(m−1);

among said (n) number of writing-in periods Ta1, Ta2, ..., Ta(n), a portion of the writing-in periods Ta1, Ta2, ..., Ta(m) and a portion of said eliminating periods Te1, Te2, ..., Te(m−1) overlap with each other;

periods from the start of each of the writing-in periods Ta1, Ta2, ..., Ta(m−1) in said (n) number of writing-in periods Ta1, Ta2, ..., Ta(n) to the start of each of said eliminating periods Te1, Te2, ..., Te(m−1) are display periods Tr1, Tr2, ..., Tr(m−1);

periods from the start of each of said eliminating periods Te1, Te2, ..., Te(m−1) to the start of each of the writing-in periods Ta1, Ta2, ..., Ta(m) in said (n) number of writing-in periods Ta1, Ta2, ..., Ta(n) are non-display periods Td1, Td2, ..., Td(m−1);

periods from the start of each of the writing-in periods Ta1, Ta2, ..., Ta(m+1) in said (n) number of writing-in periods Ta1, Ta2, ..., Ta(n) to the start of the next writing-in periods of each of said writing-in periods Ta(m), Ta(m+1), ..., Ta(n), respectively, are display periods Tr(m), Tr(m+1), ..., Tr(n);

in said display periods Tr1, Tr2, ..., Tr(n), said plurality of EL elements are selected by said digital data signals to luminesce or not luminesce;

a length of said (n) number of writing-in periods Ta1, Ta2, ..., Ta(n) and a length of said (m−1) number of eliminating periods Te1, Te2, ..., Te(m−1) are the same;

ratios of the lengths of said display periods Tr1, Tr2, ..., Tr(n) are expressed as $2^0 : 2^1 : \ldots : 2^{(n-1)}$; and said display periods Tr1, Tr2, ..., Tr(n) appear in a random order.

50. A device according to claim 49, wherein said EL layer comprises at least one of a low molecular organic material and a polymer organic material.

51. A device according to claim 49, wherein said low molecular organic material comprises at least one of $Alq_3$ (tris-8-quinolilite-aluminum) and TPD (triphenylamine derivative).

52. A device according to claim 49, wherein said polymer organic material comprises at least one of PPV (polyphenylene vinylene), PVK (polyvinyl carbazole), and polycarbonate.

53. A device according to claim 49, wherein said (n) number of writing-in periods Ta1, Ta2, ..., Ta(n) are not overlapped with each other.

54. A device according to claim 49, wherein said (m−1) number of eliminating periods Te1, Te2, ..., Te(m−1) are not overlapped with each other.

55. A device according to claim 49, wherein each of said first TFT, the second TFT, and the third TFT is selected from an N channel TFT and a P channel TFT.

56. A device according to claim 49, wherein said second TFT becomes an OFF state when an electric potential of the one of said plurality of power supply lines is applied to said gate electrode of said second TFT.

57. A computer, which comprises said electronic device according to claim 49.

58. A video camera, which comprises said electronic device according to claim 49.

59. A DVD player, which comprises said electronic device according to claim 49.

60. An electronic device comprising a source signal line driver circuit, a first gate signal line driver circuit, a second gate signal line driver circuit, and a pixel portion including a plurality of pixels, wherein at least one of the pixels comprises at least a first TFT electrically connected to the first gate signal line driver circuit, and a second TFT electrically connected to the second gate signal line driver circuit, wherein said plurality of pixels have a plurality of EL elements, and wherein respective drives of said plurality of EL elements are controlled by a digital data signal outputted from said source signal line driver circuit, a first selecting signal outputted from said first gate signal line driver circuit, and a second selecting signal outputted from said second gate signal line driver circuit.

61. A computer, which comprises said electronic device according to claim 60.

62. A video camera, which comprises said electronic device according to claim 60.

63. A DVD player, which comprises said electronic device according to claim 60.

64. An electronic device comprising a source signal line driver circuit, a first gate signal line driver circuit, a second gate signal line driver circuit, and a pixel portion including a plurality of pixels, wherein at least one of the pixels comprises at least a first TFT electrically connected to the first gate signal line driver circuit, and a second TFT electrically connected to the second gate signal line driver circuit, wherein said plurality of pixels includes a plurality of EL elements; and wherein a luminescing time of said EL element is controlled by a digital data signal outputted from said source signal line driver circuit, a first selecting signal outputted from said first gate signal line driver circuit, and a second selecting signal outputted from said second gate signal line driver circuit, to thereby perform gray-scale display.

65. A computer, which comprises said electronic device according to claim 64.

66. A video camera, which comprises said electronic device according to claim 64.

67. A DVD player, which comprises said electronic device according to claim 64.

68. An electronic device according to claim 7,
wherein the a first TFT is a switching TFT,
wherein the second TFT is an EL driving TFT, and
wherein the third TFT is an eliminating TFT.

69. An electronic device according to claim 13,
wherein the a first TFT is a switching TFT,
wherein the second TFT is an EL driving TFT, and
wherein the third TFT is an eliminating TFT.

70. An electronic device according to claim 22,
wherein the a first TFT is a switching TFT,
wherein the second TFT is an EL driving TFT, and
wherein the third TFT is an eliminating TFT.

71. An electronic device according to claim 30, wherein the a first TFT is a switching TFT, wherein the second TFT is an EL driving TFT, and wherein the third TFT is an eliminating TFT.

72. An electronic device according to claim 41, wherein the a first TFT is a switching TFT, wherein the second TFT is an EL driving TFT, and wherein the third TFT is an eliminating TFT.

73. An electronic device according to claim 49, wherein the a first TFT is a switching TFT, wherein the second TFT is an EL driving TFT, and wherein the third TFT is an eliminating TFT.

74. An electronic device according to claim 7, further comprising a capacitor between the gate electrode of the second TFT and the one of the plurality of power supply lines.

75. An electronic device according to claim 13, further comprising a capacitor between the gate electrode of the second TFT and the one of the plurality of power supply lines.

76. An electronic device according to claim 30, further comprising a capacitor between the gate electrode of the second TFT and the one of the plurality of power supply lines.

77. An electronic device according to claim 41, further comprising a capacitor between the gate electrode of the second TFT and the one of the plurality of power supply lines.

78. An electronic device according to claim 49, further comprising a capacitor between the gate electrode of the second TFT and the one of the plurality of power supply lines.

* * * * *